(12) United States Patent
Honda et al.

(10) Patent No.: US 6,316,909 B1
(45) Date of Patent: Nov. 13, 2001

(54) ELECTRONIC DEVICE, CONTROL METHOD FOR ELECTRONIC DEVICE, RECHARGE-RATE ESTIMATING METHOD FOR SECONDARY BATTERY, AND CHARGING CONTROL METHOD FOR SECONDARY BATTERY

(75) Inventors: Katsuyuki Honda; Motomu Hayakawa, both of Shiojiri; Ichiro Aoshima, Shimosuwa-machi; Tsukasa Kosuda, Matsumoto, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/424,204

(22) PCT Filed: Mar. 24, 1999

(86) PCT No.: PCT/JP99/01471

§ 371 Date: Jan. 5, 2000

§ 102(e) Date: Jan. 5, 2000

(87) PCT Pub. No.: WO99/49552

PCT Pub. Date: Sep. 30, 1999

(30) Foreign Application Priority Data

Mar. 24, 1998 (JP) .................................. 10/76033
Mar. 24, 1998 (JP) .................................. 10/76034
Sep. 30, 1998 (JP) ................................. 10/278971

(51) Int. Cl.[7] ................................. H02J 7/16; H02J 7/00
(52) U.S. Cl. ......................... 320/108; 320/157; 968/888
(58) Field of Search .......................... 320/108, 129, 320/132, 156, 157, 160, 162, 165; 968/888, 503, 889, 892; 362/204

(56) References Cited

U.S. PATENT DOCUMENTS

| 4,031,449 | | 6/1977 | Trombly . | |
|---|---|---|---|---|
| 4,873,677 | * | 10/1989 | Sakamoto et al. | 368/204 |
| 5,122,729 | | 6/1992 | Itoba et al. . | |
| 5,341,083 | * | 8/1994 | Klontz et al. | 320/109 |
| 5,654,621 | * | 8/1997 | Seelig | 320/108 |
| 5,694,023 | * | 12/1997 | Podrazhansky et al. | 320/129 |
| 5,696,367 | * | 12/1997 | Keith | 235/381 |
| 5,923,544 | * | 7/1999 | Urano | 363/22 |
| 5,963,012 | * | 10/1999 | Garcia et al. | 320/106 |
| 6,016,046 | * | 1/2000 | Kaite et al. | 320/108 |
| 6,043,631 | * | 3/2000 | Tsenter | 320/148 |

FOREIGN PATENT DOCUMENTS

| 0 298 707 | 1/1989 | (EP) . |
|---|---|---|
| 52-49865 | 4/1977 | (JP) . |
| 57-32144 | 2/1982 | (JP) . |
| 59-10140 | 1/1984 | (JP) . |
| 2-10189 | 1/1990 | (JP) . |
| 3-112326 | 5/1991 | (JP) . |
| 7-273697 | 10/1995 | (JP) . |

* cited by examiner

Primary Examiner—Peter S. Wong
Assistant Examiner—Gregory J. Toatley, Jr.

(57) ABSTRACT

A first circuit having a first coil electrically charges a second circuit having a second coil through electromagnetic coupling of the two coils. When data signals are to be transferred between the first and second circuits, signal transfer is started only after the second circuit has been charged for a predetermined period of time. The position relationship between the coils is also detected, and a charging/transfer selector changes a duty ratio between charge transfer and data transfer in accordance with the detected result. The charge is transferred in an intermittent manner, and the charging rate is adjusted according to the difference between the voltage of a secondary battery observed during a charging phase and the voltage of the secondary battery observed a certain time after interruption of the charging phase, or vice versa.

55 Claims, 30 Drawing Sheets

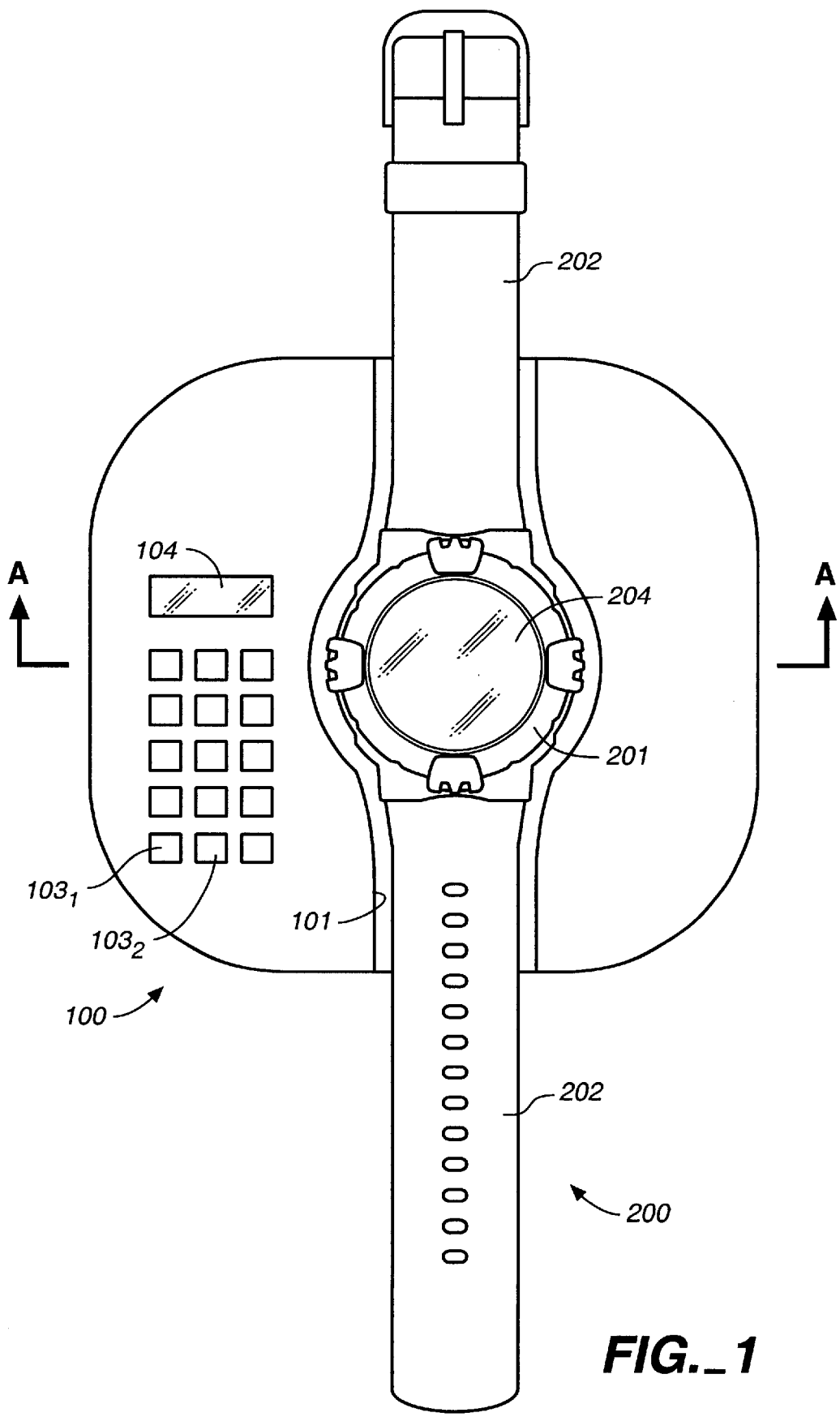
FIG._1

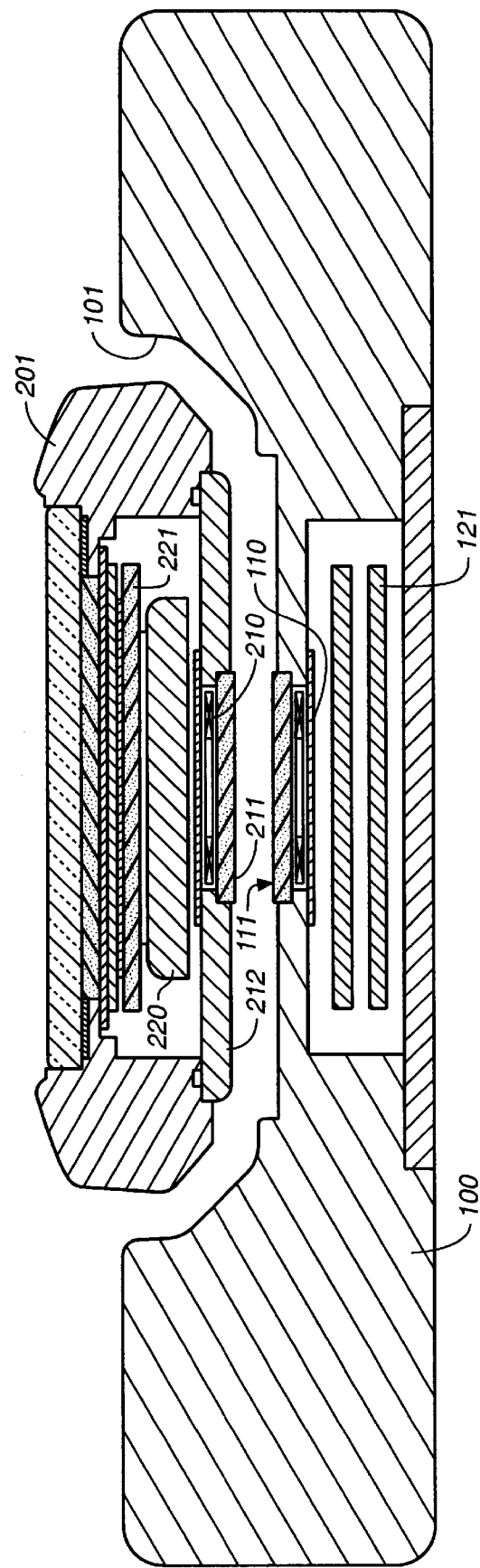

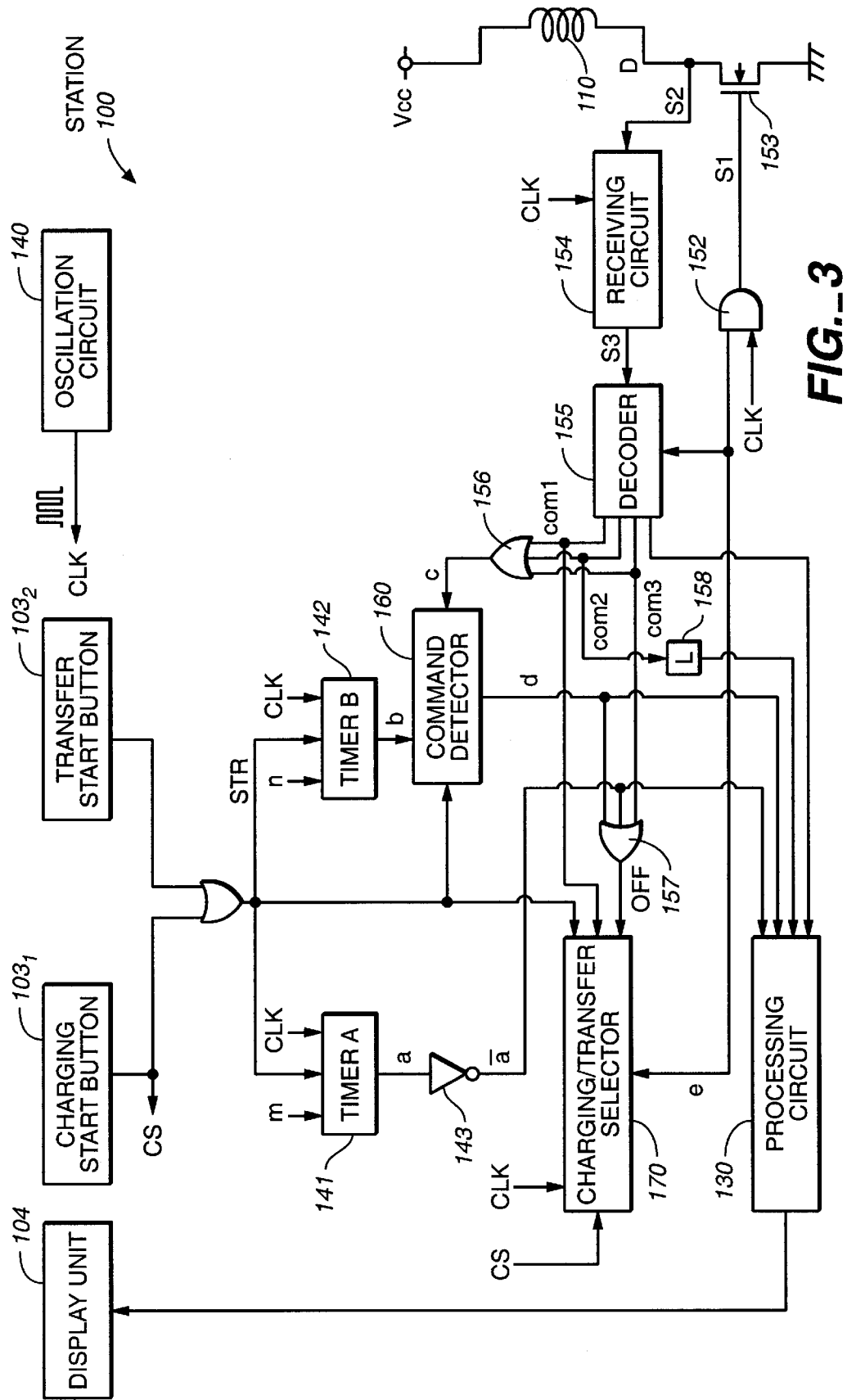
FIG._3

FIRST CHARGING SIGNAL
FIG._4(a)
|←— 50 SECONDS —→|←10 SECONDS→|
SECOND CHARGING SIGNAL
FIG._4(b)
|←———— 590 SECONDS ————→|←10 SECONDS→|
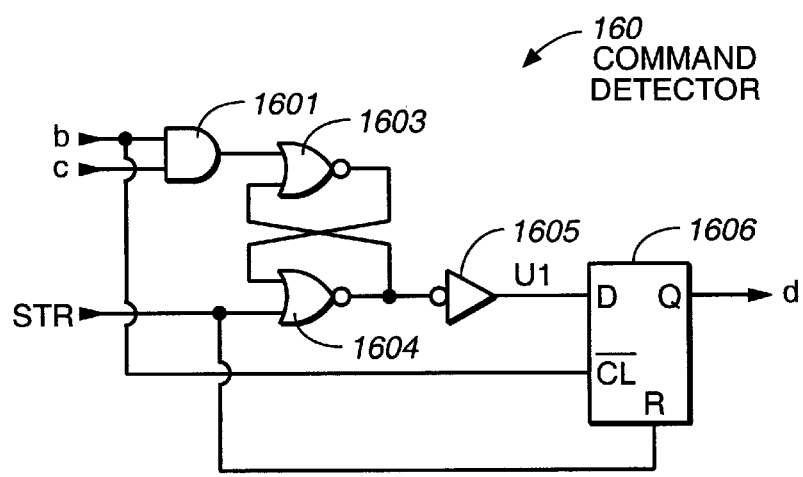
FIG._5

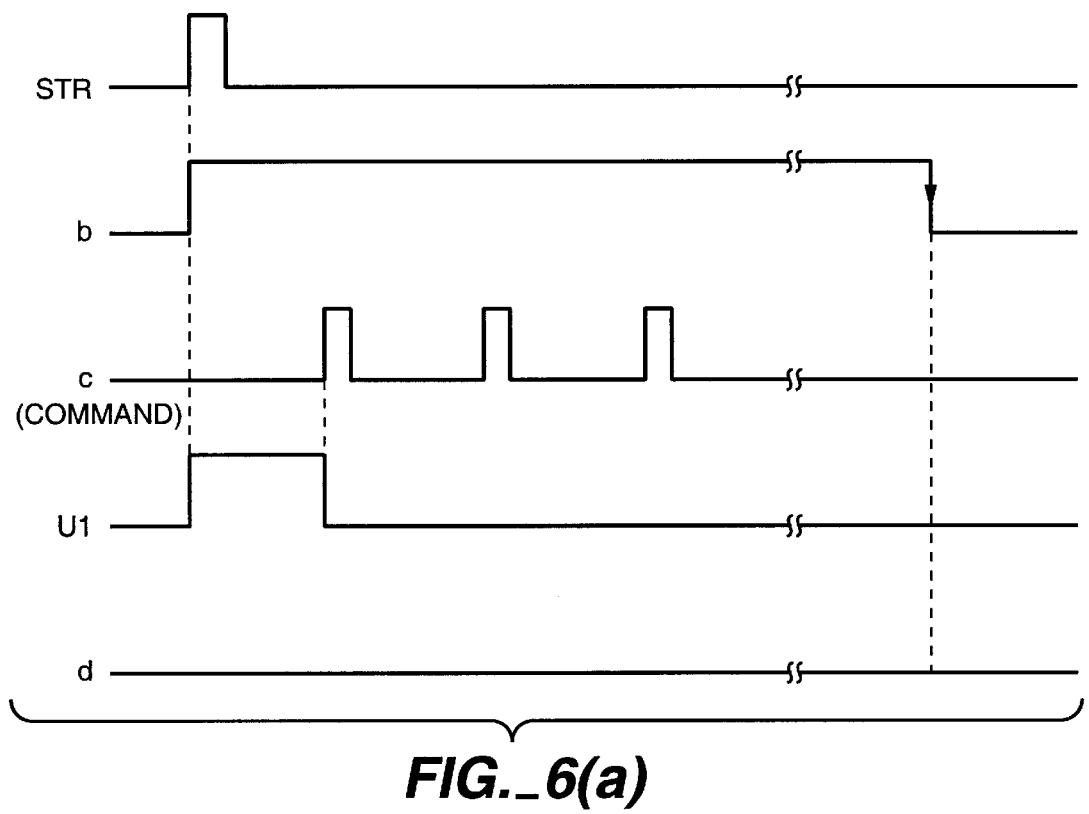
FIG._6(a)
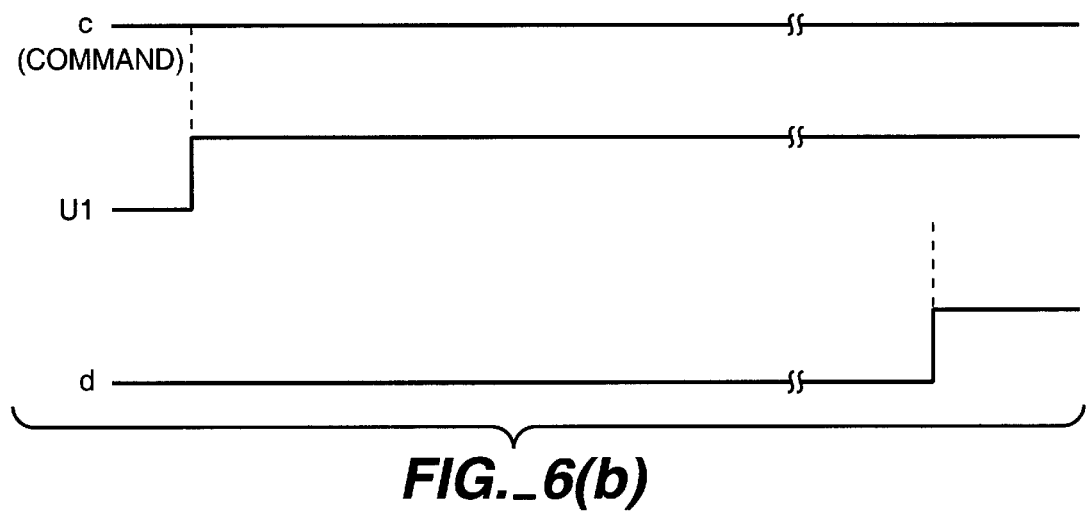
FIG._6(b)

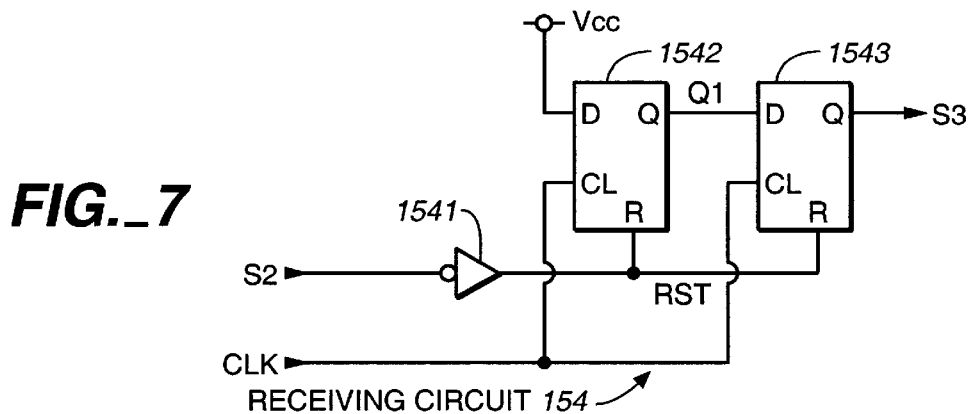
FIG._7
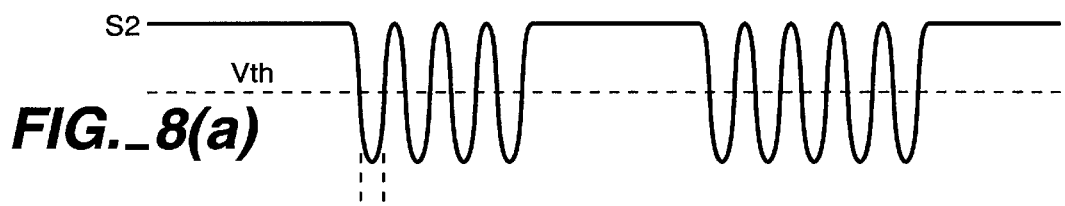
FIG._8(a)
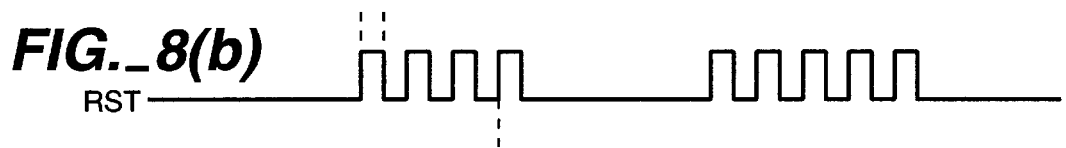
FIG._8(b)
RST
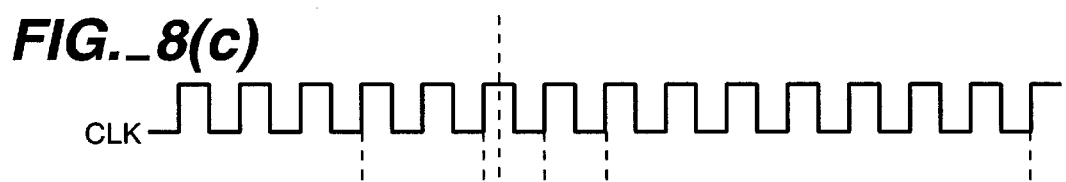
FIG._8(c)
CLK
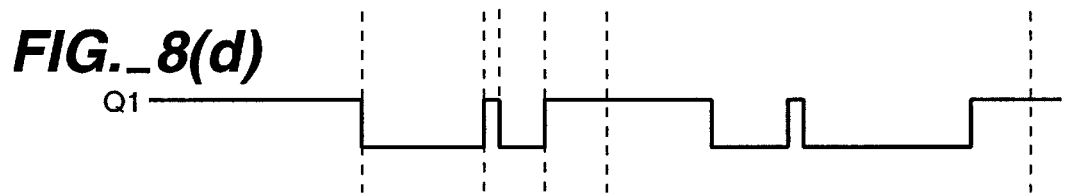
FIG._8(d)
Q1
FIG._8(e)
S3

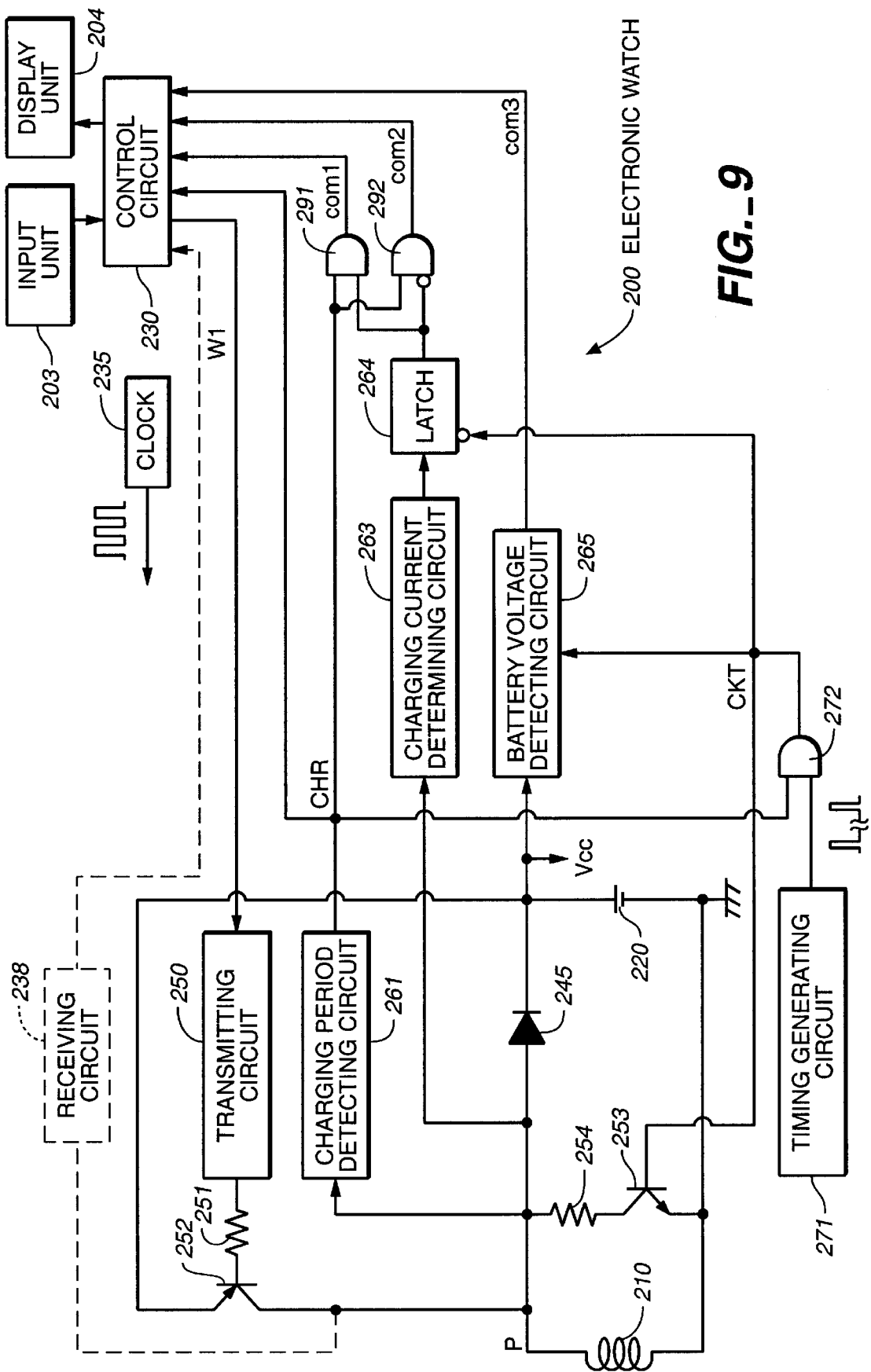
FIG._9

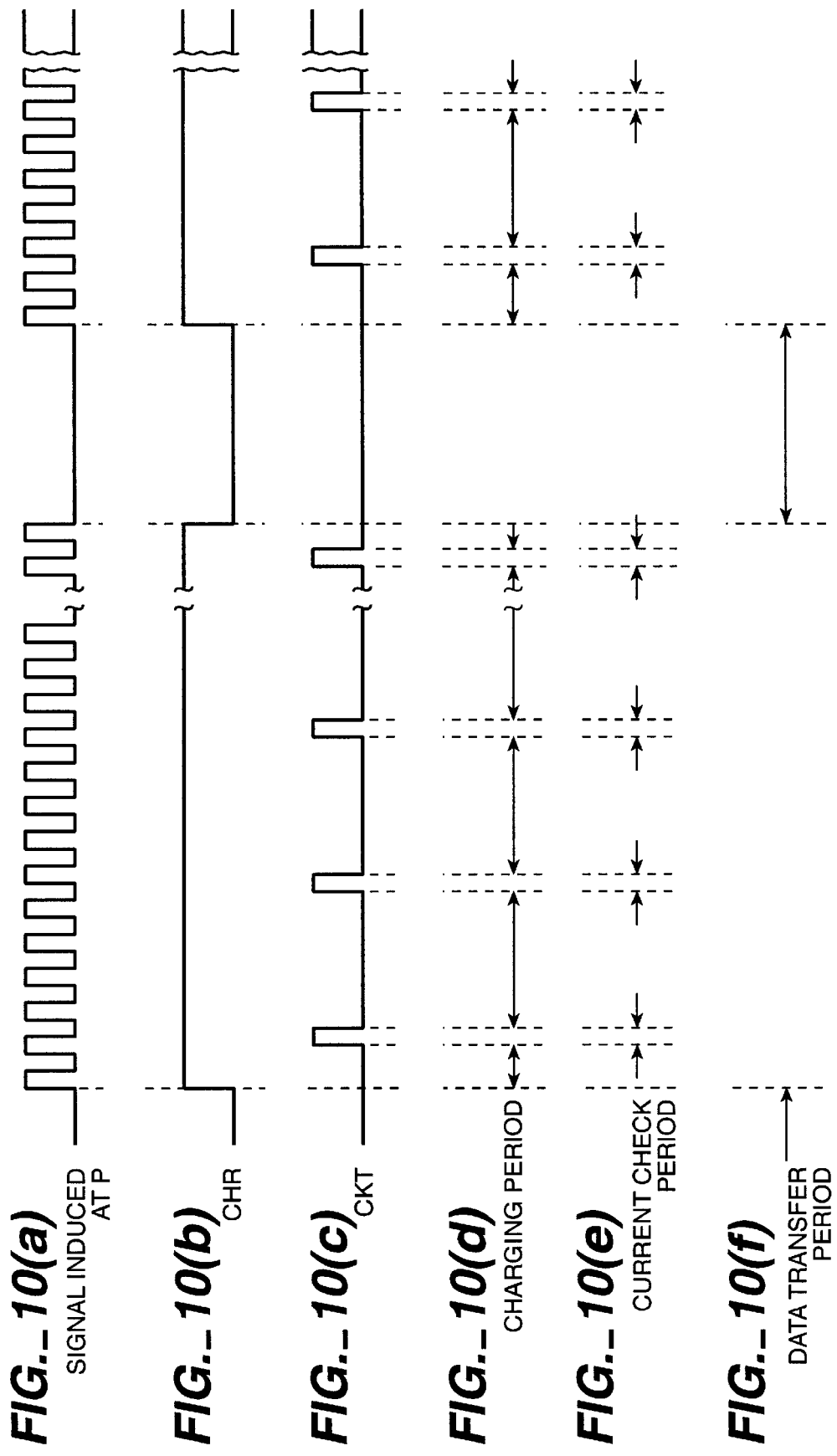

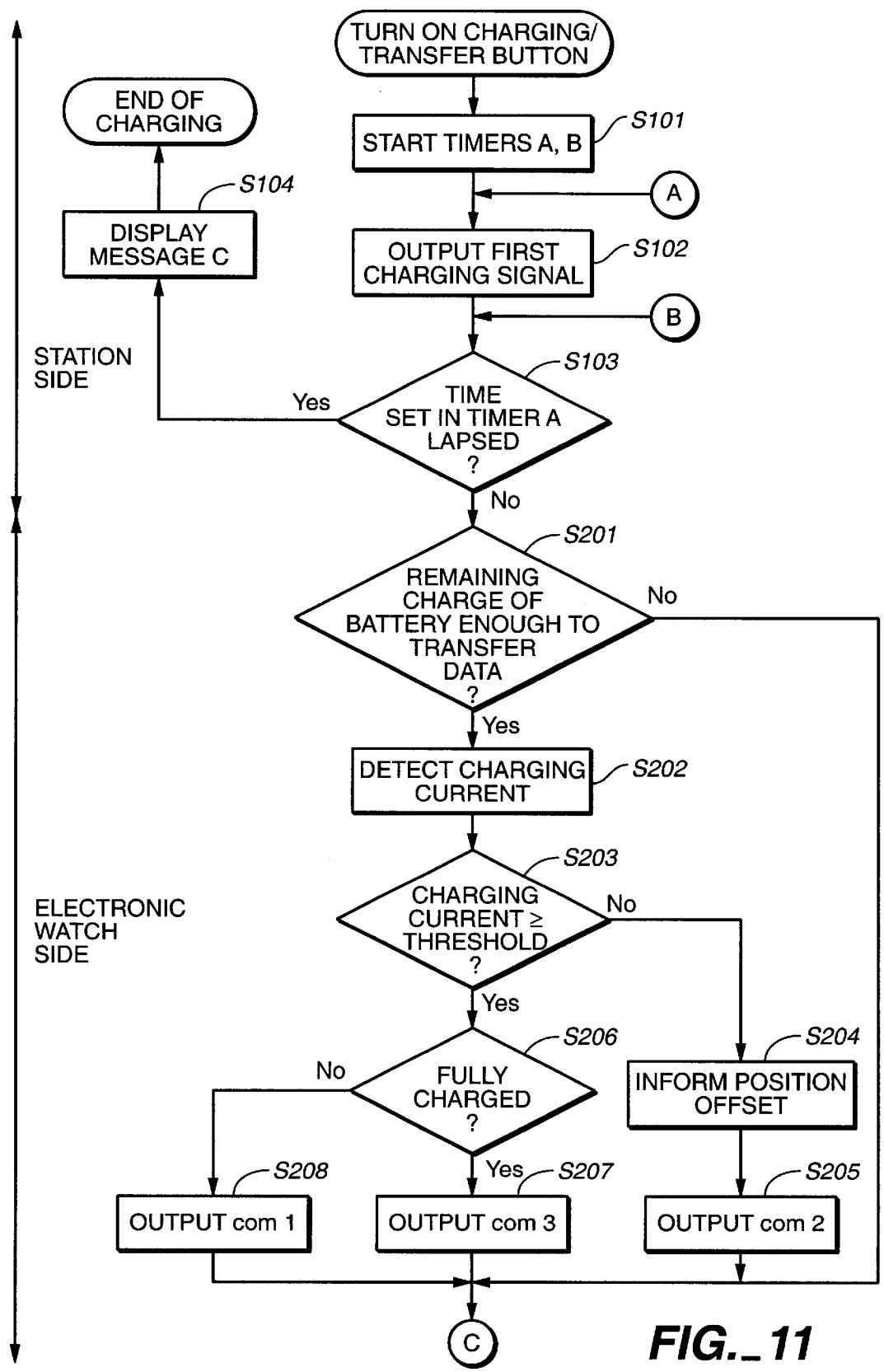
FIG._11

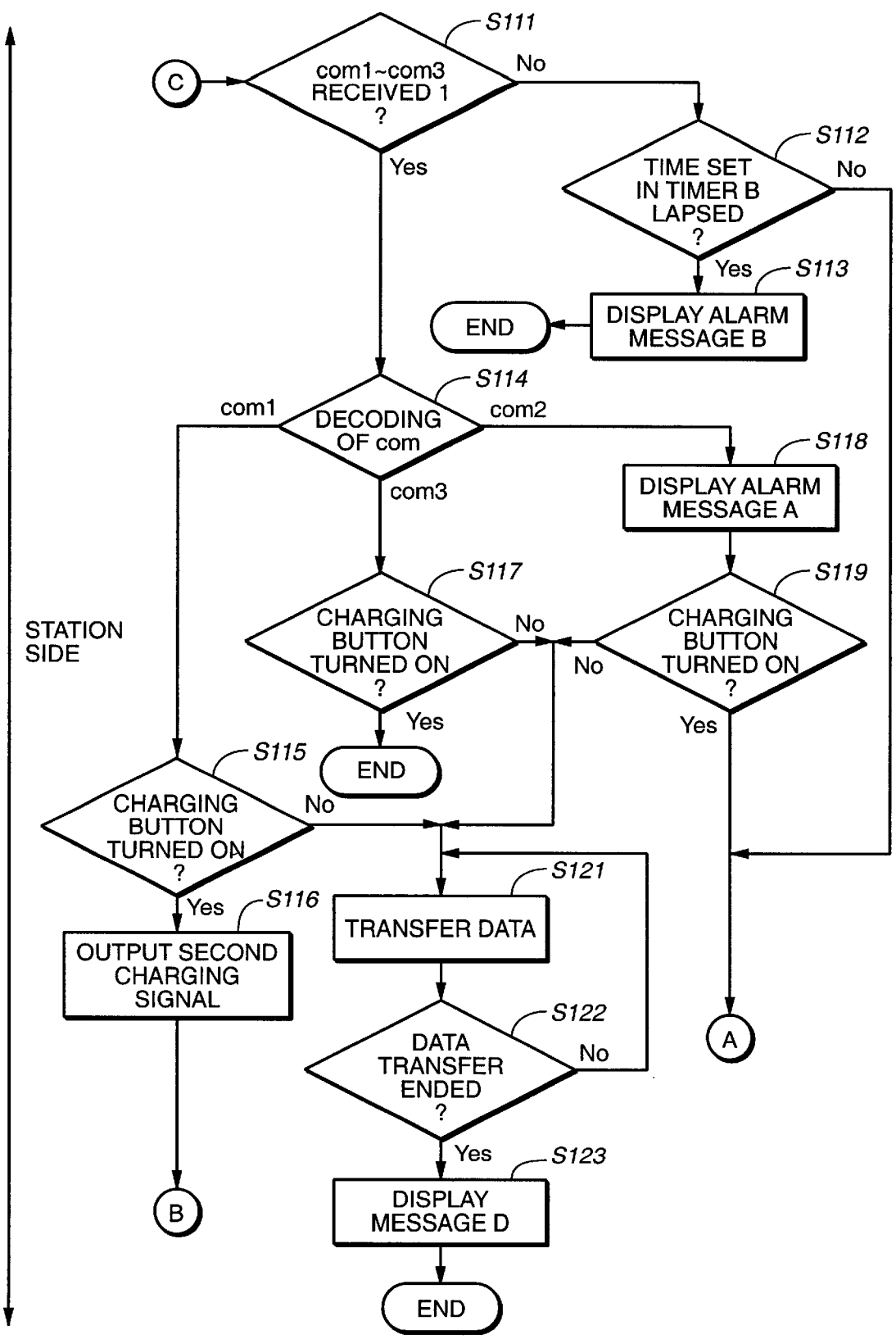
FIG._12

FIG._13(a) ALARM MESSAGE A — 104
POSITION IS OFFSET

FIG._13(b) ALARM MESSAGE B — 104
THERE IS NO WATCH

FIG._13(c) MESSAGE C — 104
CHARGING IS ABNORMALLY ENDED

FIG._13(d) MESSAGE D — 104
DATA TRANSFER IS ENDED

| BATTERY VOLTAGE [V] | REFERENCE CHARGING CURRENT [mA] |
|---|---|
| 4 | 10 |
| 3.9 | 10.1 |
| 3.8 | 10.3 |
| ⋮ | ⋮ |
| 3.6 | 12 |
| ⋮ | ⋮ |
| 2 | 25 |
| ⋮ | ⋮ |

FIG._17

FIG._14(a)
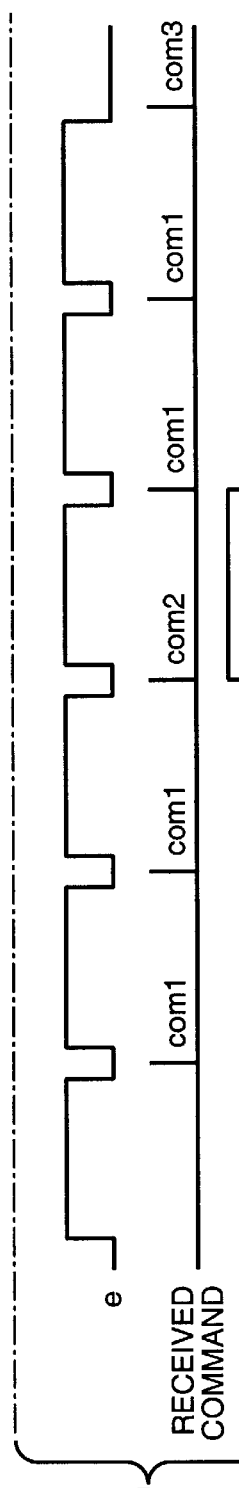
FIG._14(b)
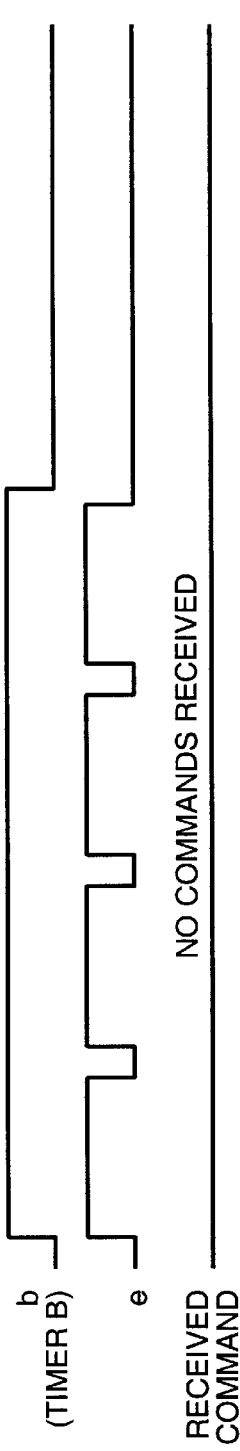
FIG._14(c)
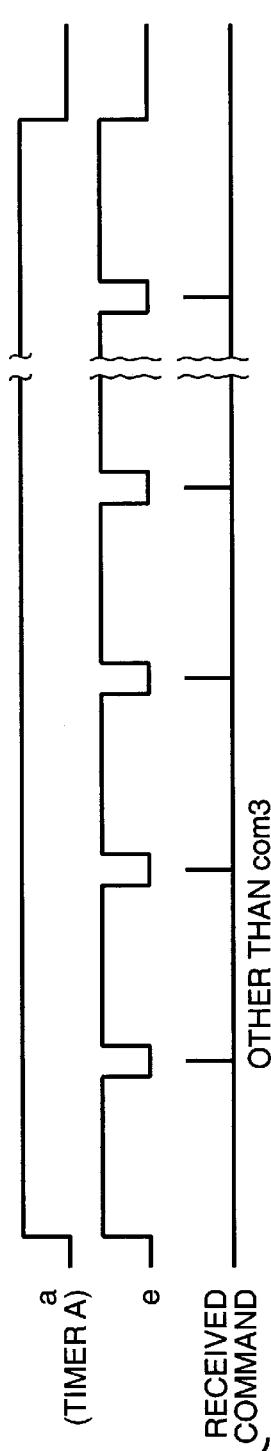
FIG._14(d)

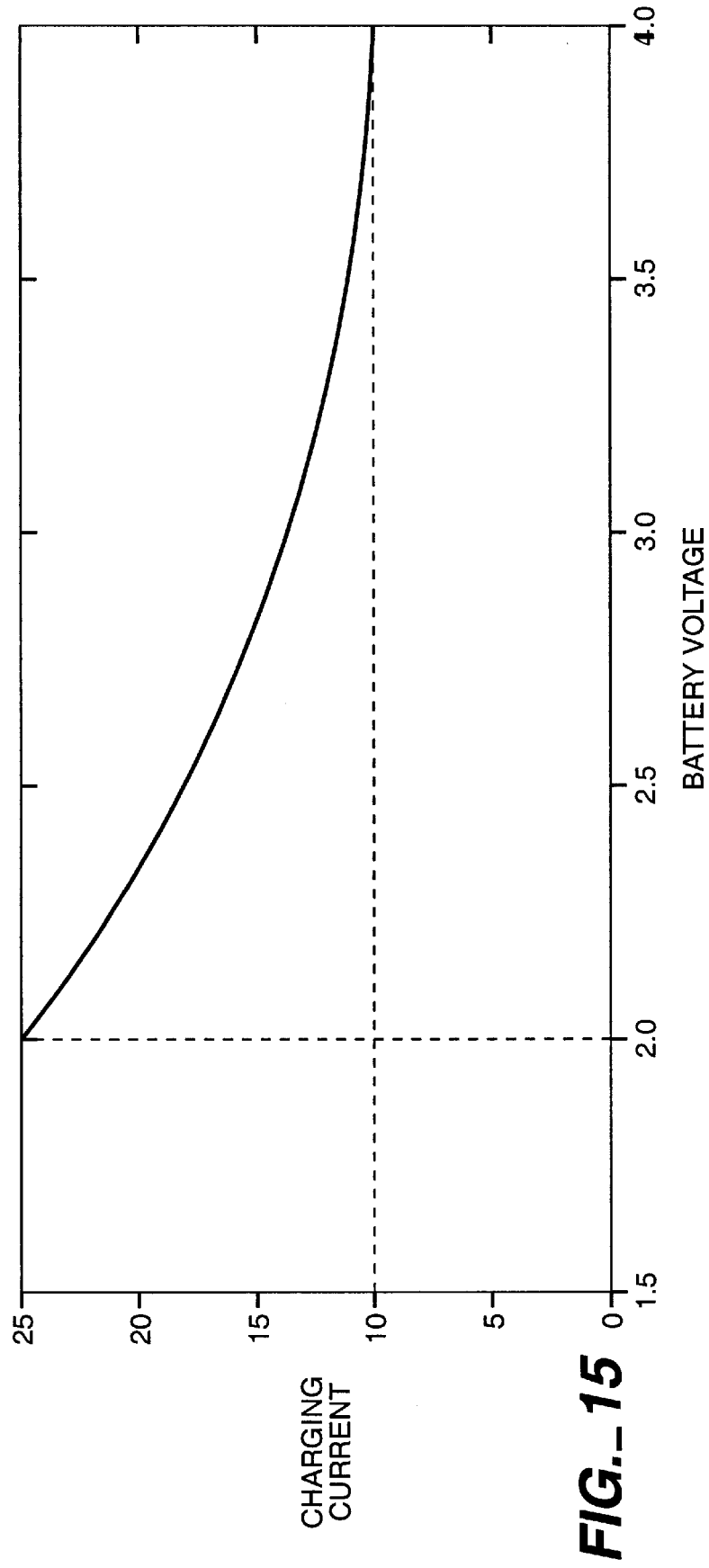
FIG._15

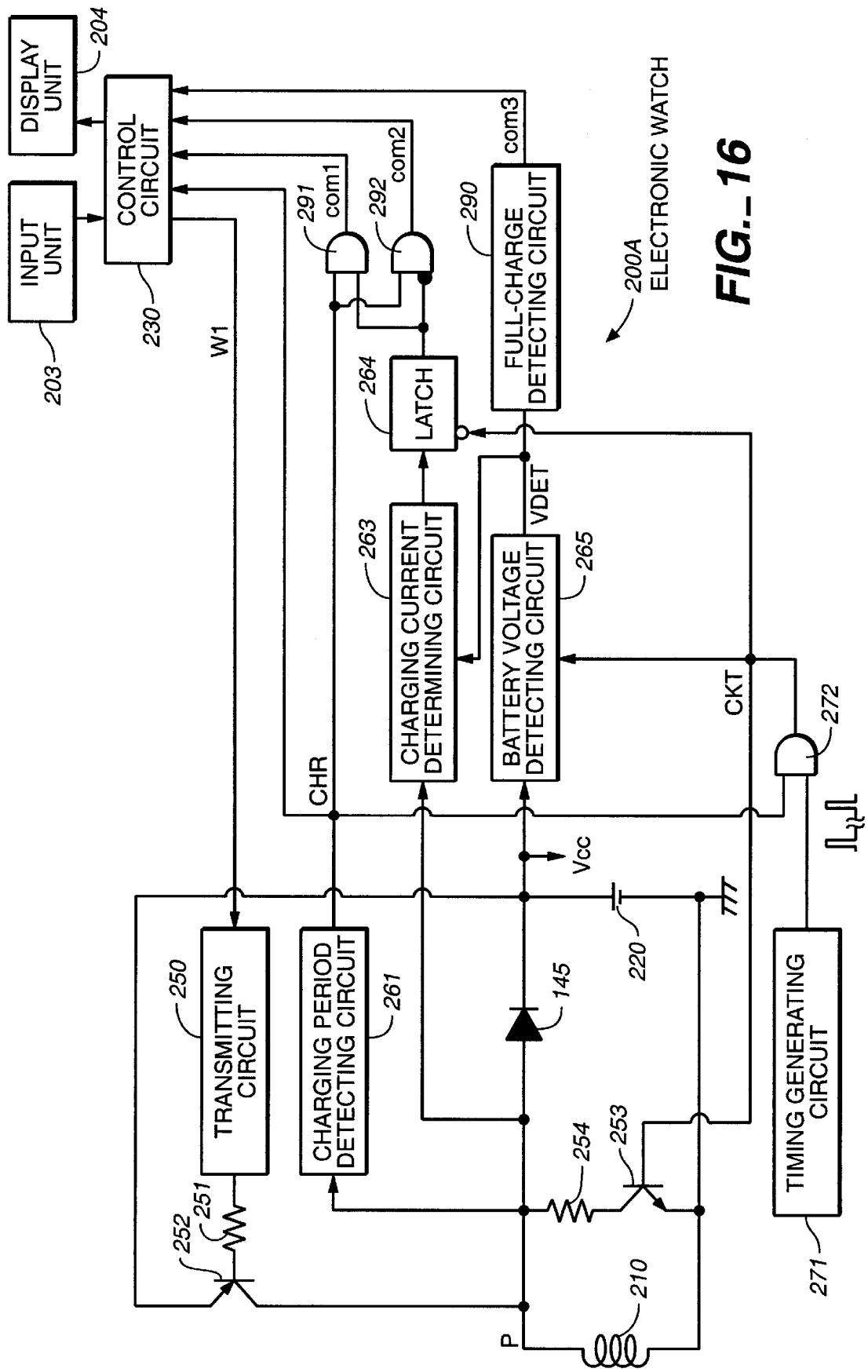
FIG._16

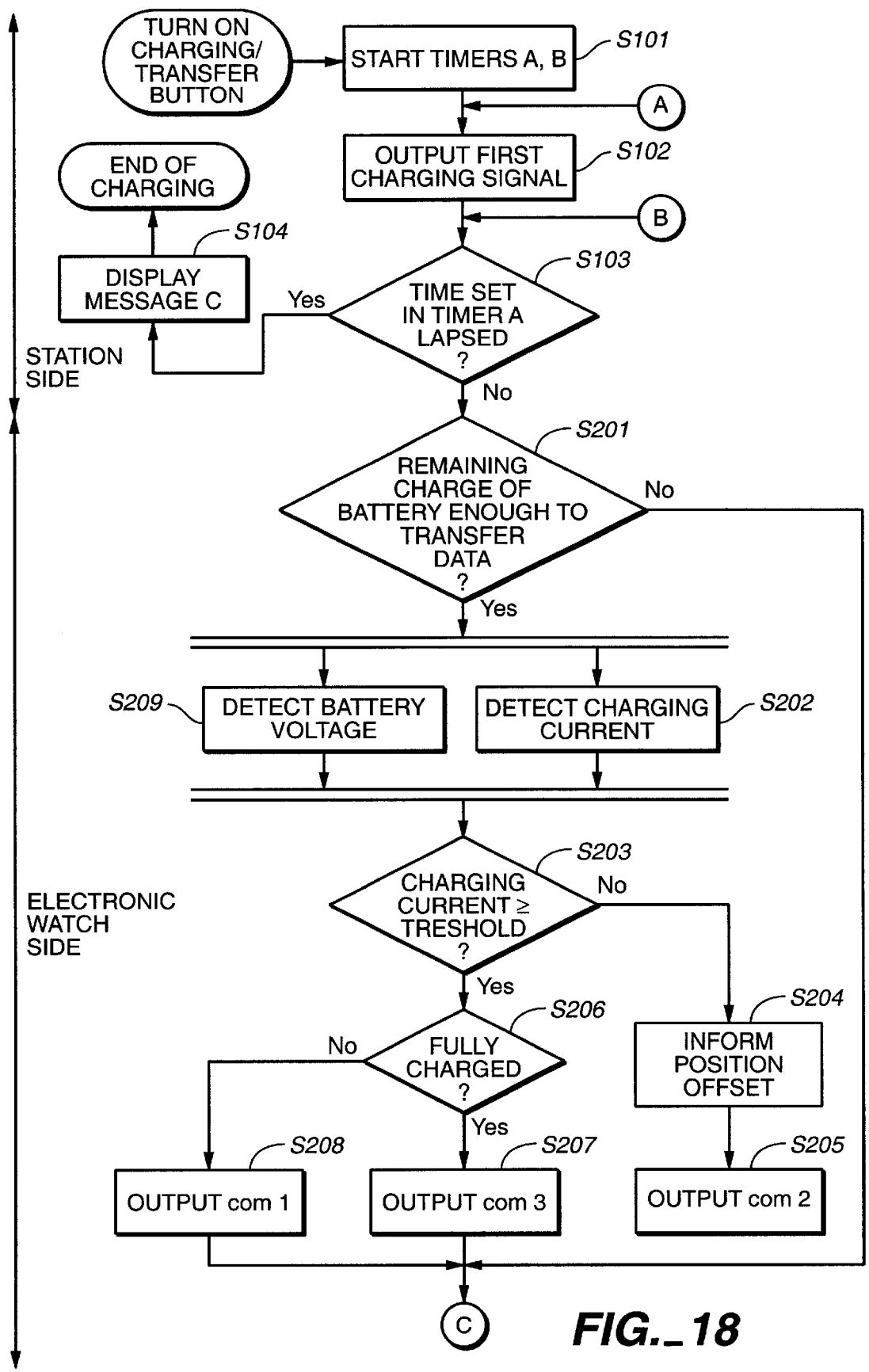
FIG._18

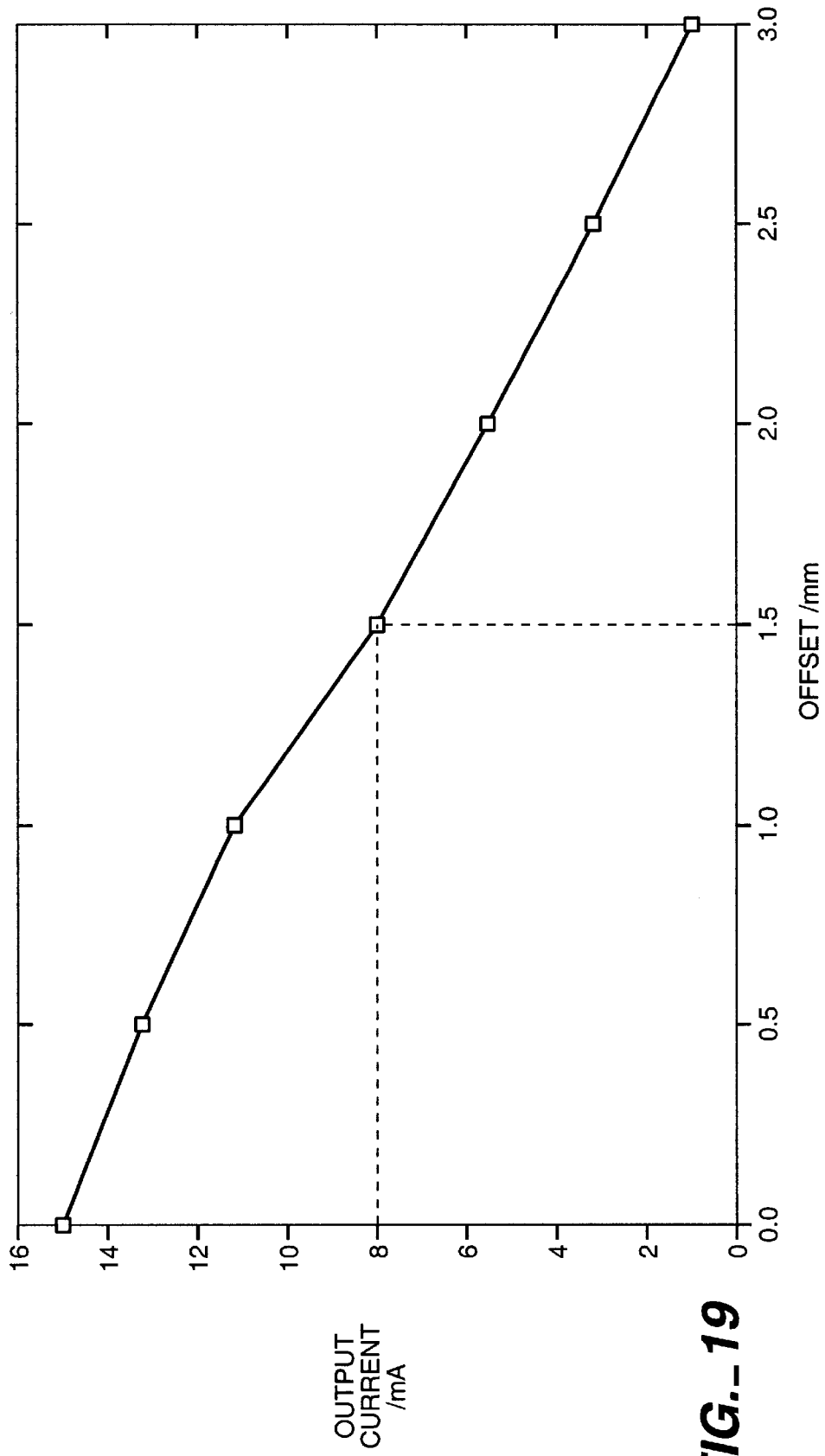
FIG._19

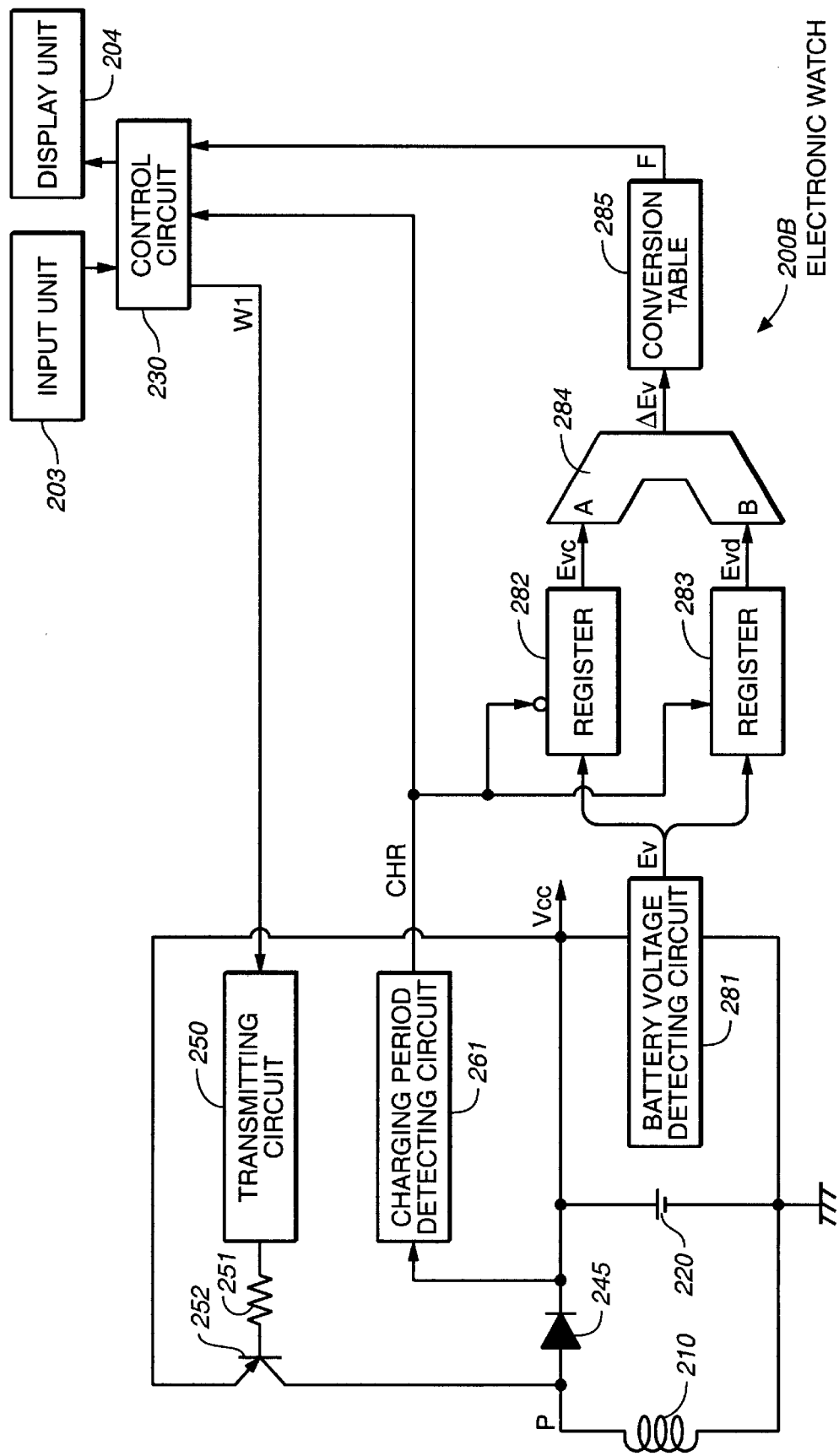
FIG._20

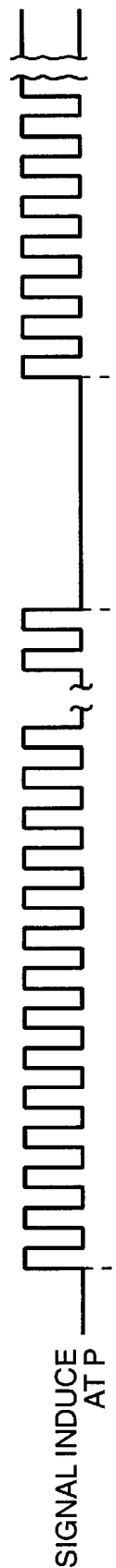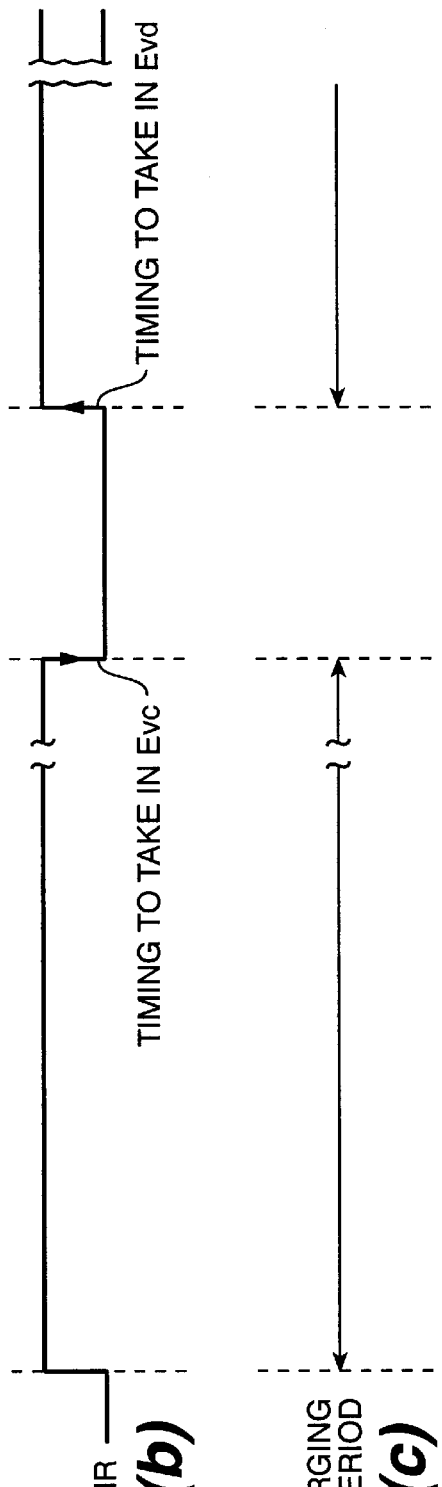
FIG._21(a) SIGNAL INDUCE AT P
FIG._21(b) CHR
FIG._21(c) CHARGING PERIOD
FIG._21(d) DATA TRANSFER PERIOD

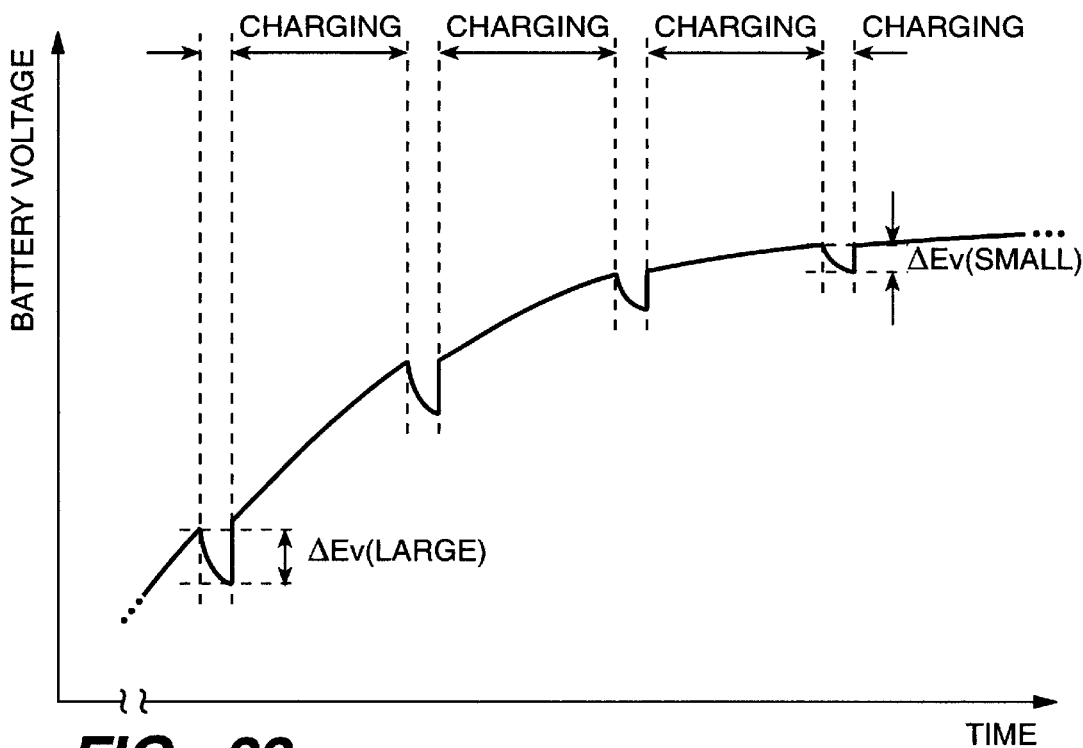
FIG._22
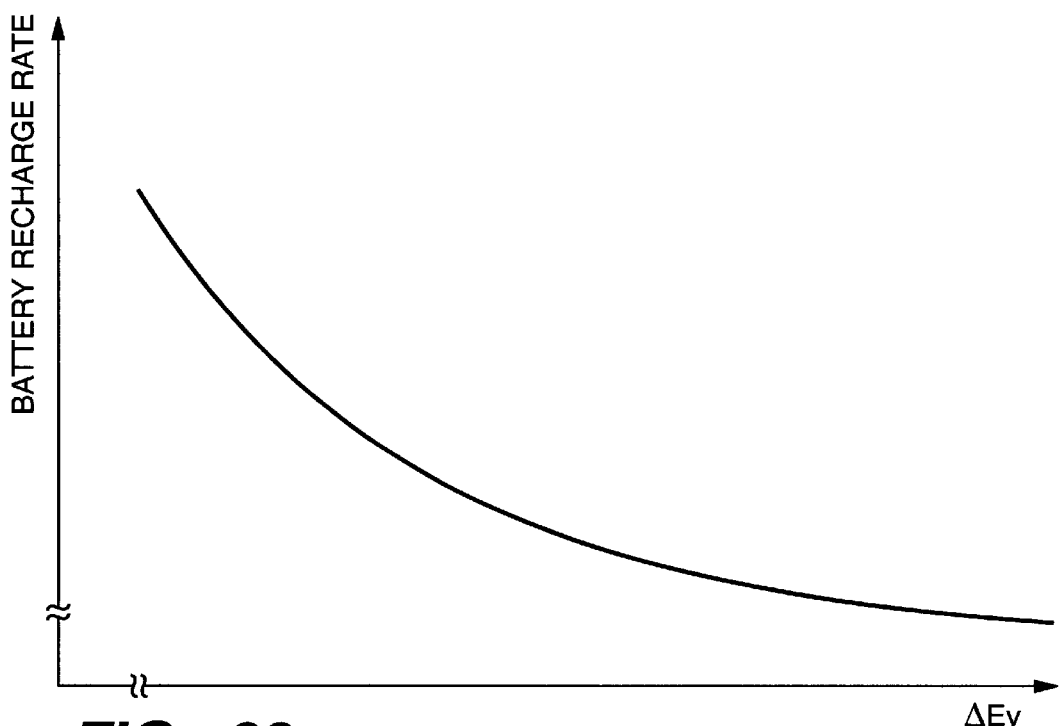
FIG._23

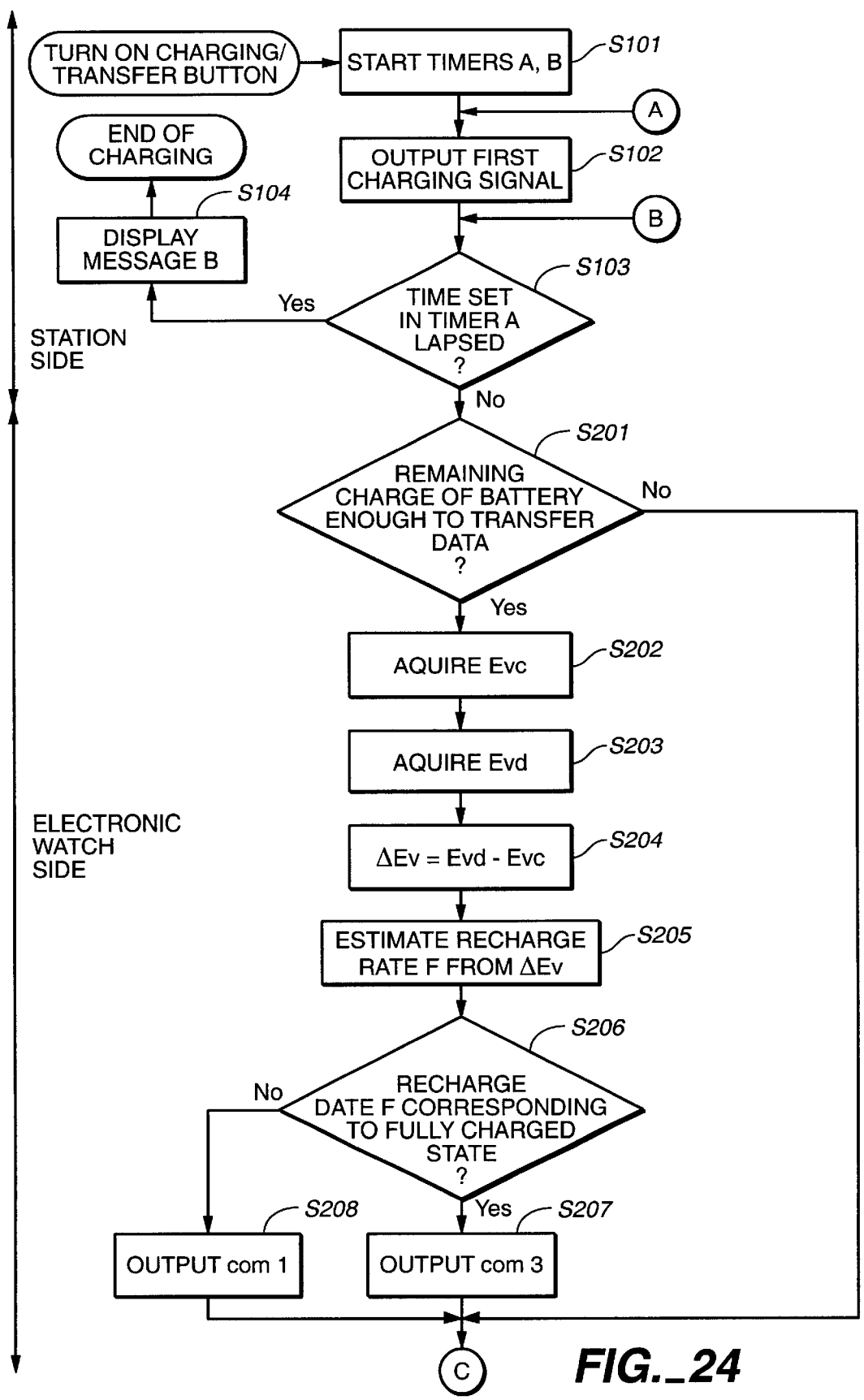
FIG._24

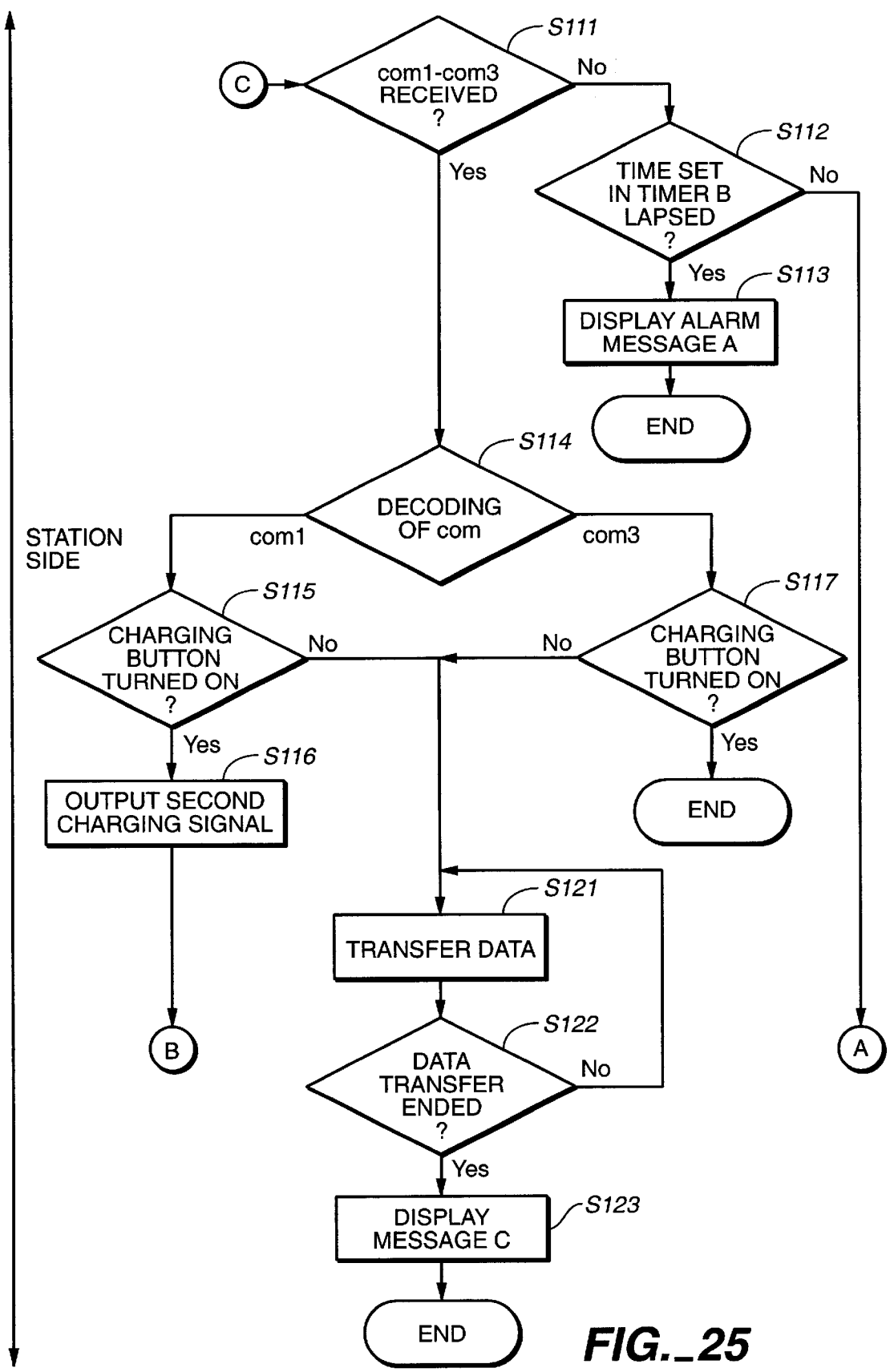
FIG._25

FIG._26(a)  ALARM MESSAGE A — 104
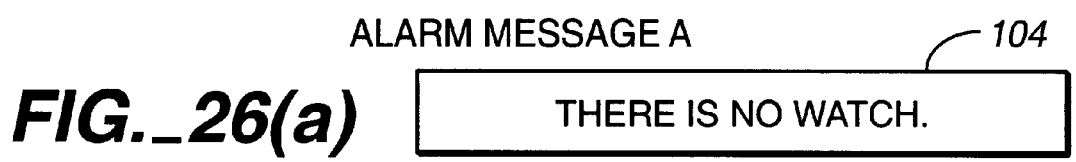
FIG._26(b)  MESSAGE B — 104
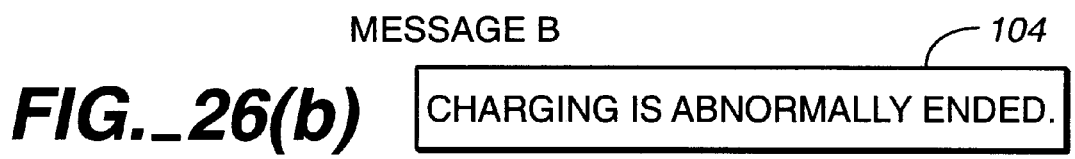
FIG._26(c)  MESSAGE C — 104
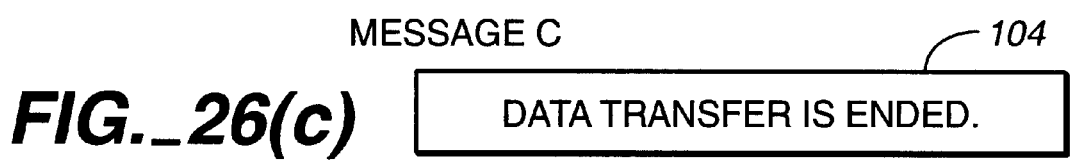

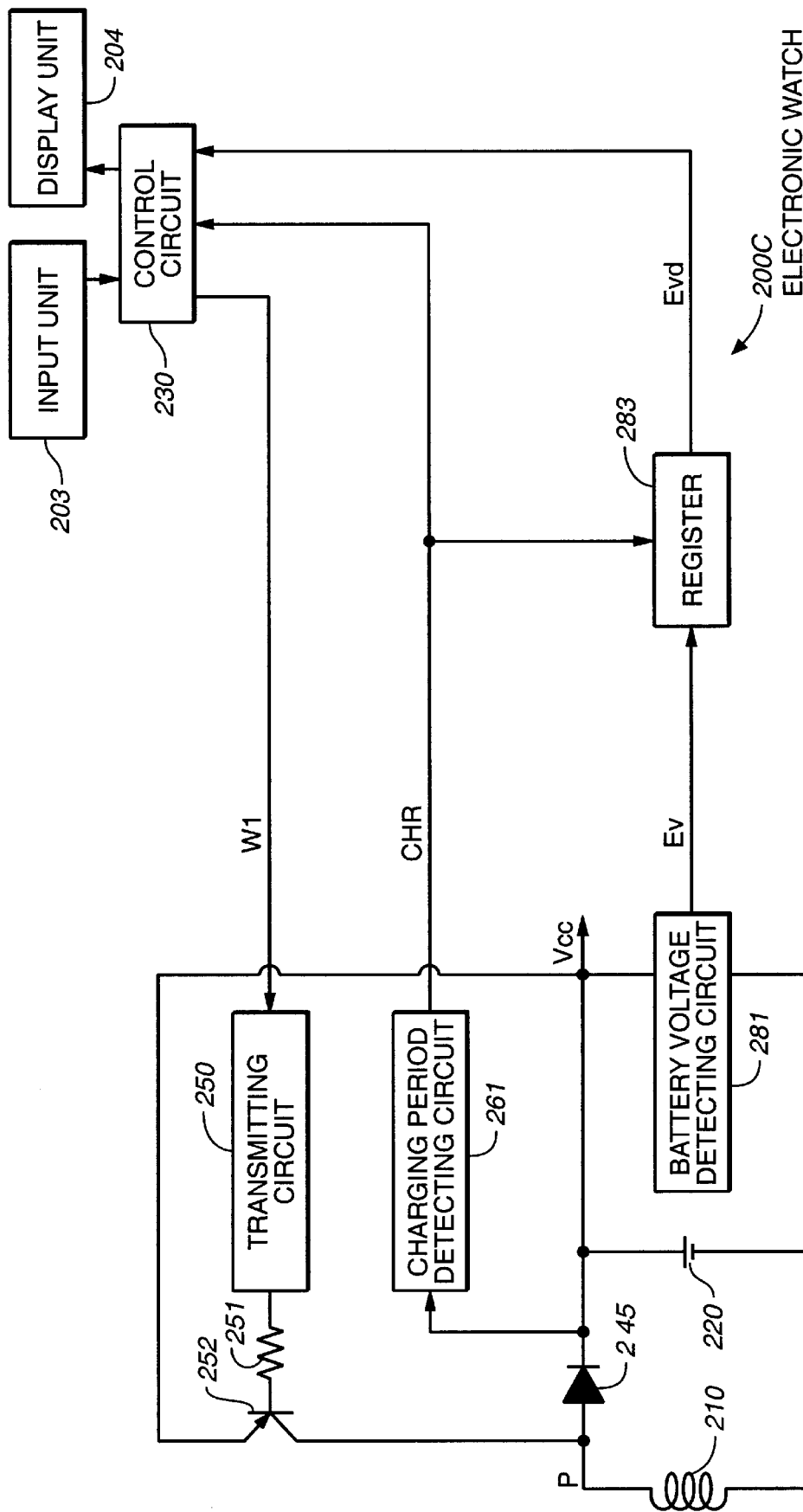
FIG._27

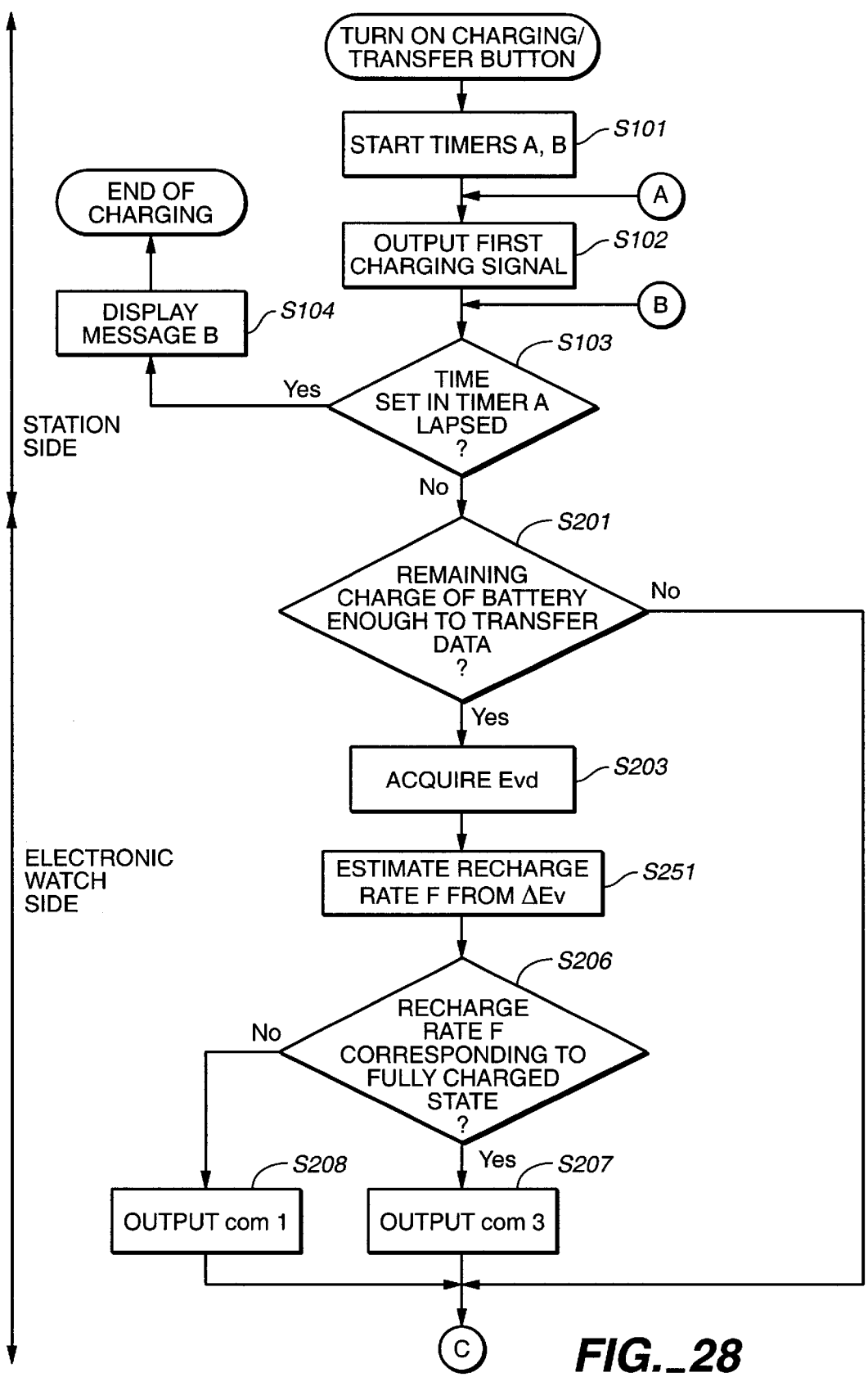
FIG._28

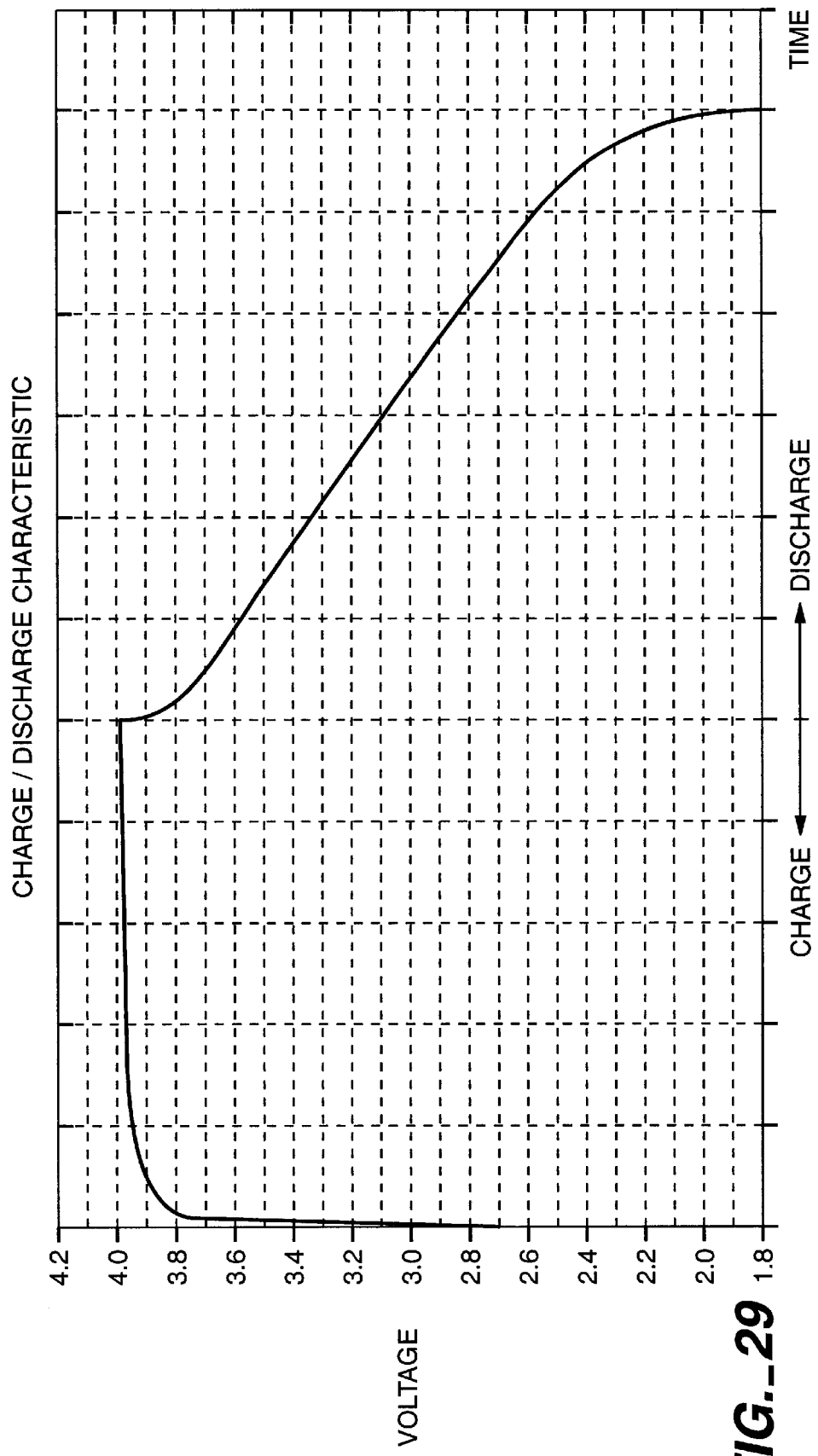
FIG._29

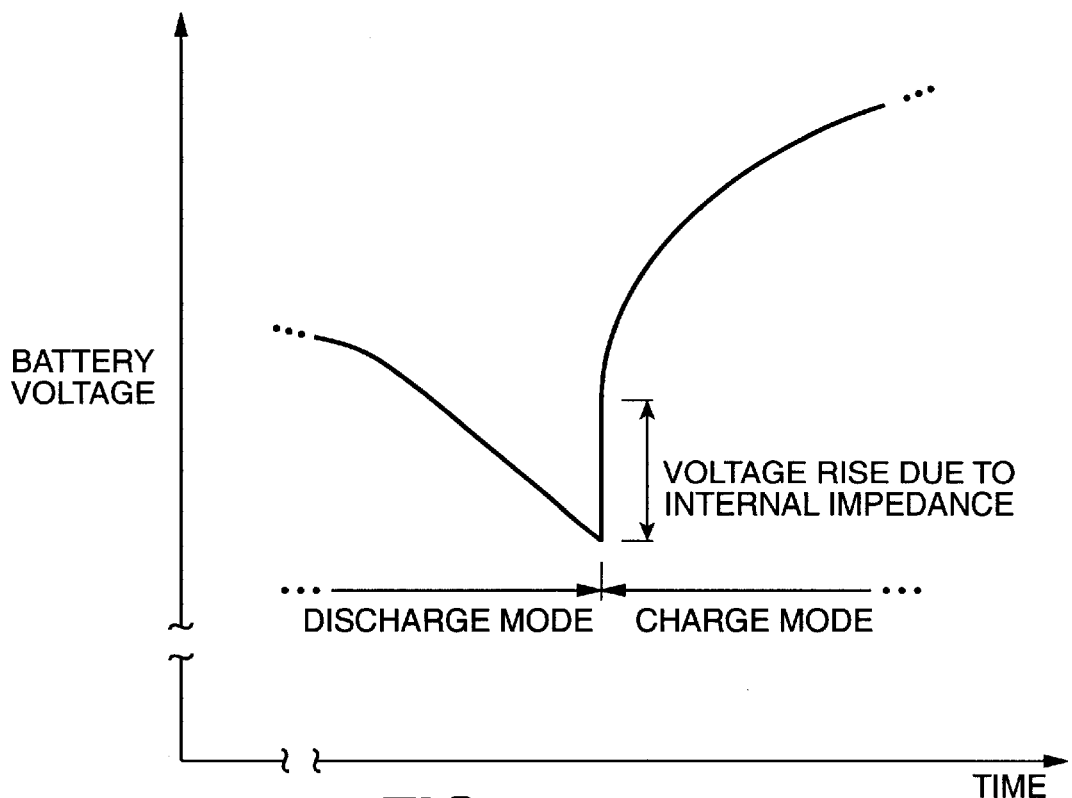
FIG._30
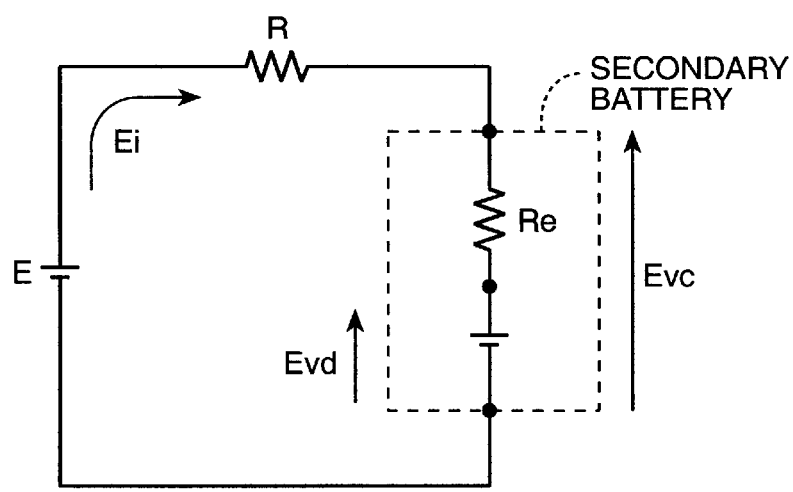
FIG._31

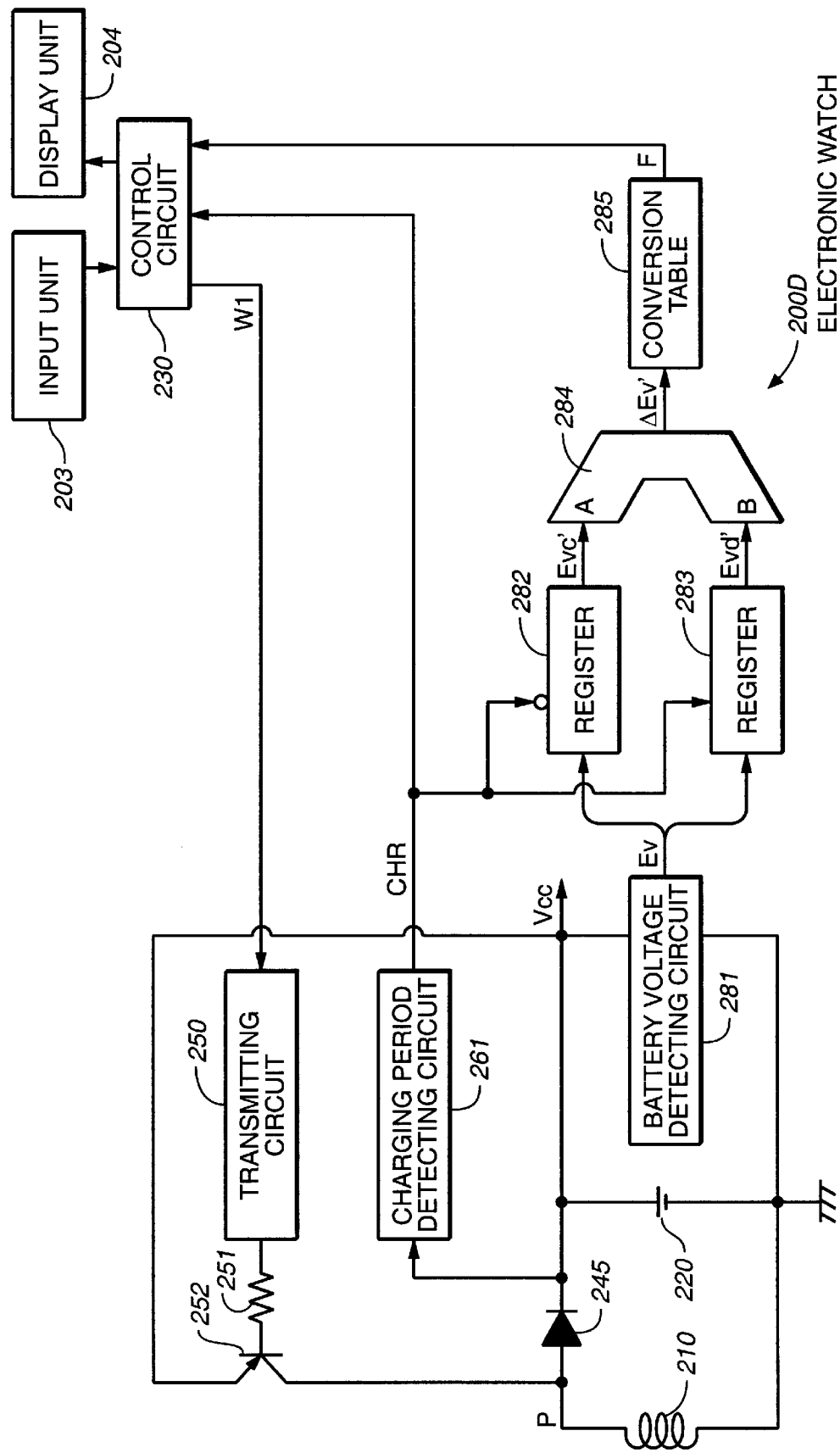
FIG._32

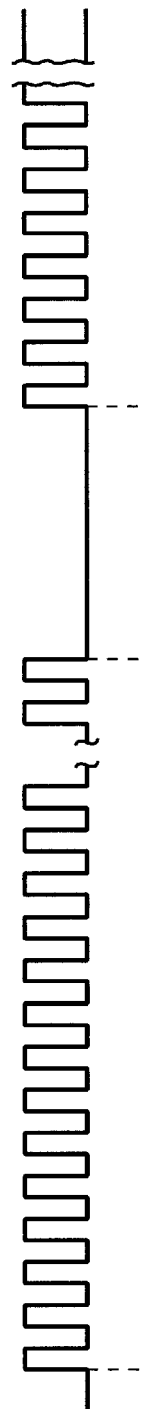
FIG._33(a) SIGNAL INDUCED AT P
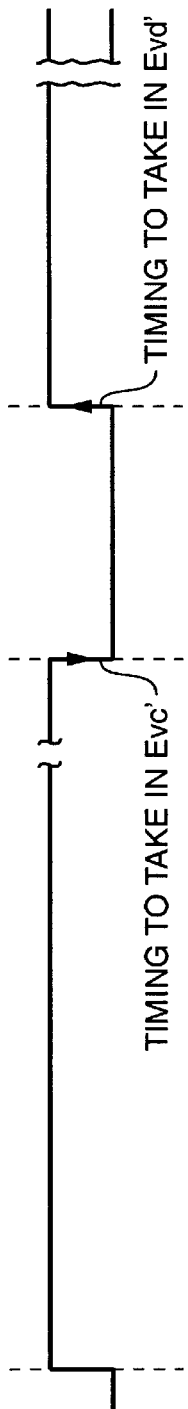
FIG._33(b) CHR
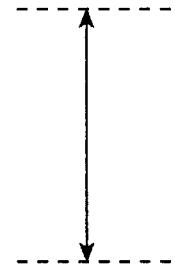
FIG._33(c) CHARGING PERIOD
FIG._33(d) DATA TRANSFER PERIOD $T_0$

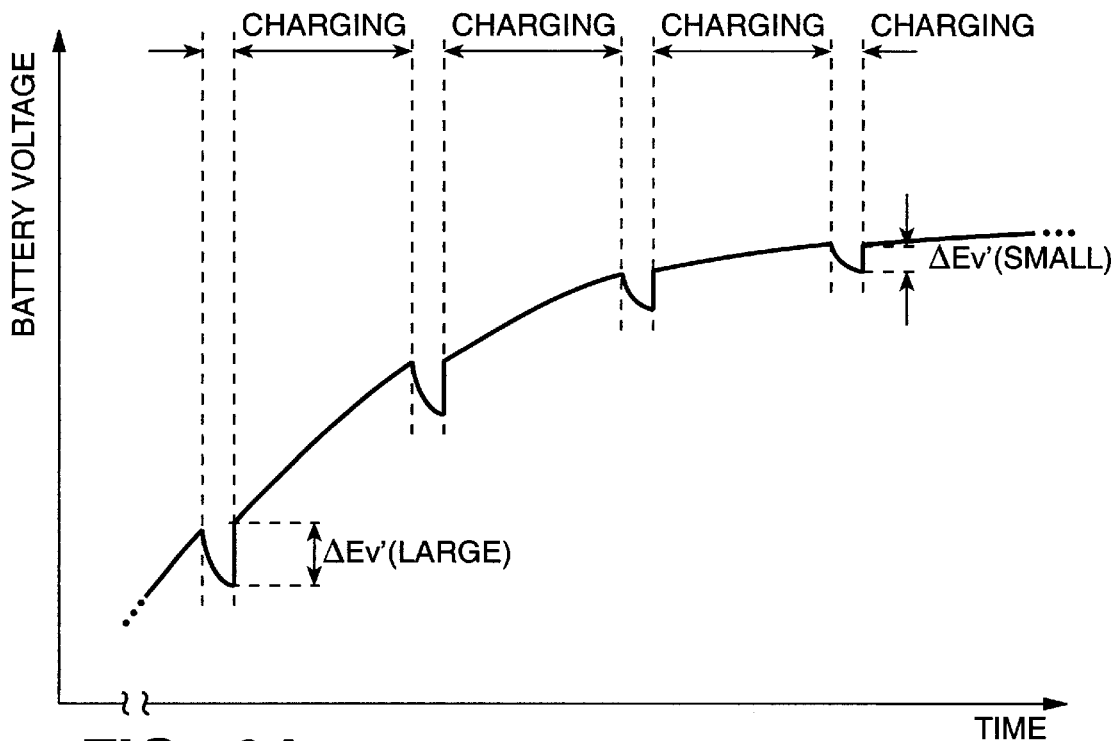
FIG._34
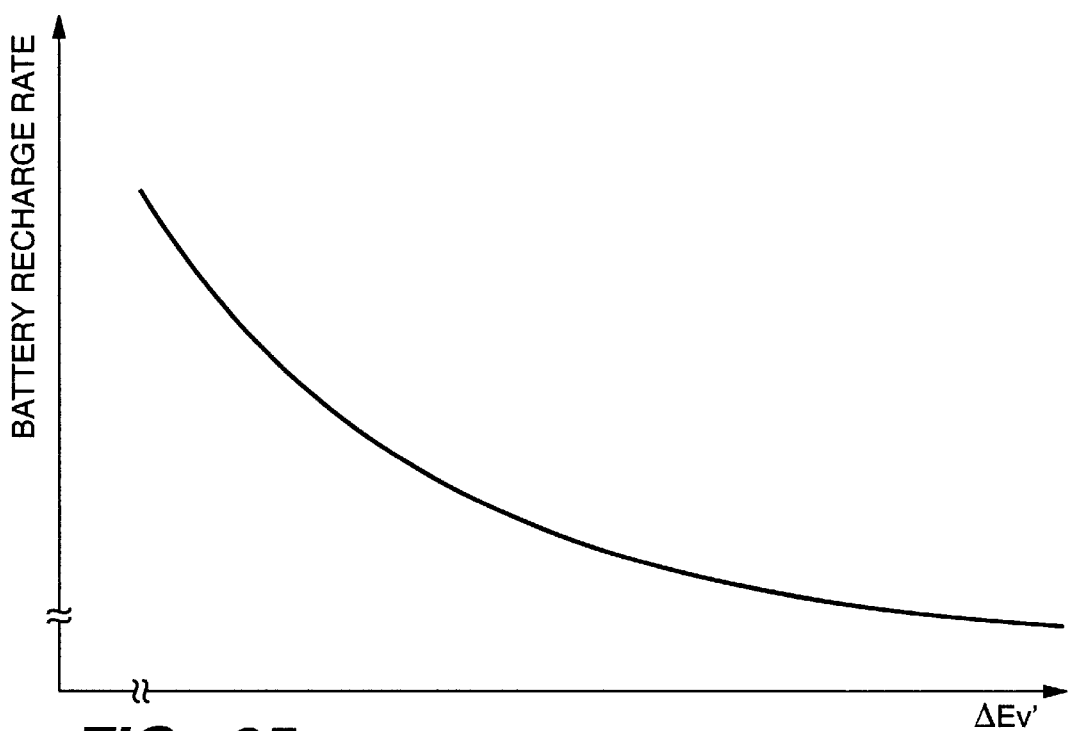
FIG._35

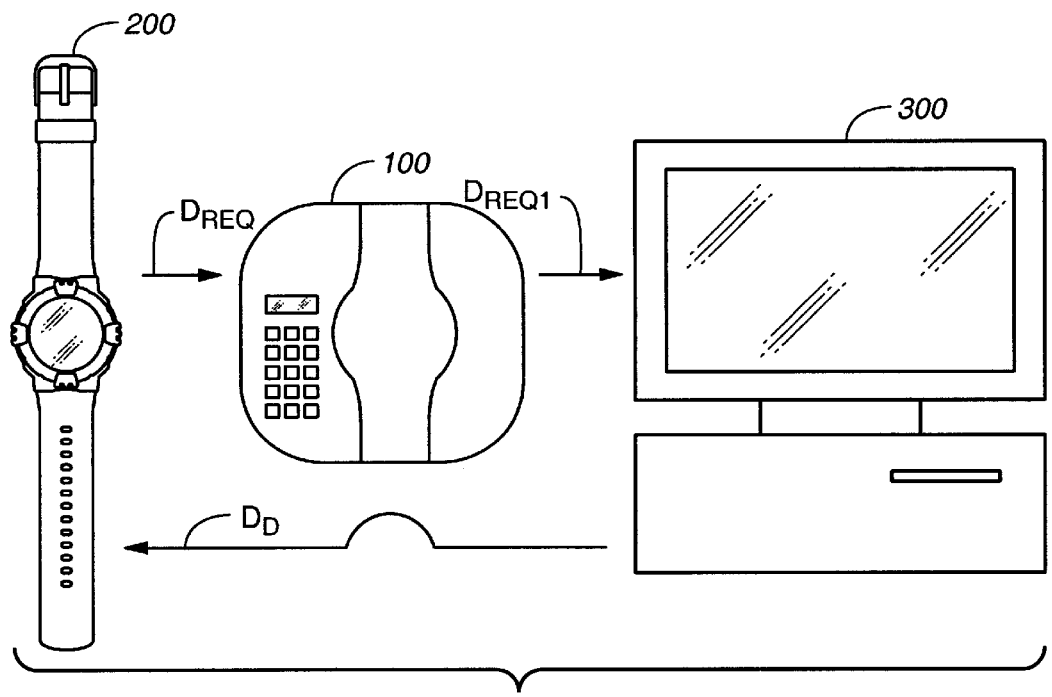
*FIG._36(a)*
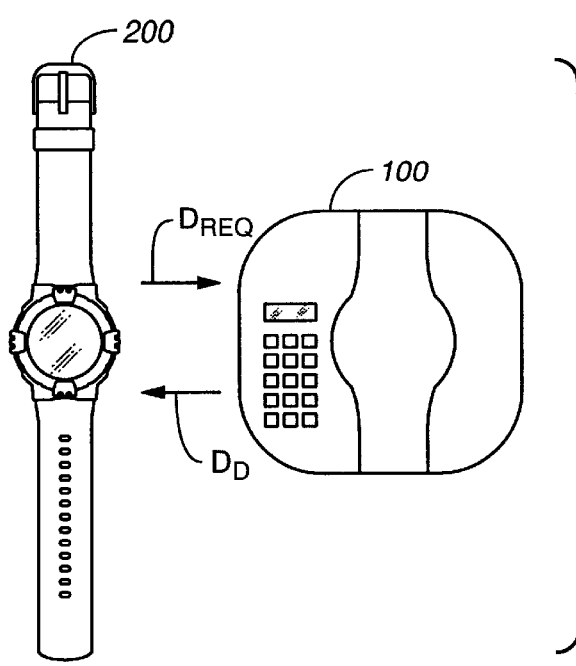
*FIG._36(b)*

ELECTRONIC DEVICE, CONTROL METHOD FOR ELECTRONIC DEVICE, RECHARGE-RATE ESTIMATING METHOD FOR SECONDARY BATTERY, AND CHARGING CONTROL METHOD FOR SECONDARY BATTERY

TECHNICAL FIELD

The present invention relates to an electronic device and a control method for the electronic device, with which when power or signals are transferred through electromagnetic coupling between coils disposed in opposing positions, a position offset between both the coils, for example, can be detected, and charging and data transfer can be controlled depending on, e.g., the position offset between both the coils. The present invention also relates to an electronic device and a recharge-rate estimating method for a secondary battery, with which a recharge rate of the secondary battery under charging can be estimated with a simple construction, as well as a charging control method for controlling charging of the secondary battery in accordance with an estimated result

BACKGROUND ART

Recently, it has been increasingly customary to place a small portable electronic device, such as a portable terminal and an electronic watch, in a charger, which is also called a station, for charging of the electronic device, data transfer therebetween, etc. On that occasion, if charging, data transfer, etc. are performed through electrical contacts, a problem would occur in point of watertightness because the electrical contacts are exposed to the outside. For that reason, charging, signal transfer, etc. are desirably performed in a non-contact manner through electromagnetic coupling between coils disposed respectively in the station and the portable electronic device.

In such an arrangement, when a high-frequency signal is applied to the coil on the station side, an external magnetic field is generated to produce an induced voltage in the coil on the side of the portable electronic device. By rectifying the induced voltage with a diode or the like, a secondary battery incorporated in the portable electronic device can be charged in a non-contact manner. Also, through electromagnetic coupling between both the coils, signals can be bidirectionally transferred in a non-contact manner from the station to the portable electronic device or from the portable electronic device to the station.

For the coil on the station side and the coil on the portable electronic device side, it is required not only to establish electromagnetic coupling between them, but also to increase the efficiency of charging and signal transfer. Meeting those requirements has been tried conventionally by ensuring such a positional relationship that when the portable electronic device is placed in the station, planes of windings of both the coils lie parallel to each other and the centers of the coils are aligned with each other.

To provide the above positional relationship just by placing the portable electronic device in the station is however difficult due to, e.g., the accuracy with which the coils are disposed in the station and the portable electronic device.

Further, if charging is carried out in spite of the portable electronic device being not placed in the station, a high-frequency signal would be uselessly applied to the coil on the station side, thus resulting in wasteful consumption of power.

It is therefore thought that a mechanism of detecting the positional relationship between both the coils is essential to perform charging and signal transfer. A mechanism of mechanically detecting the positional relationship between both the coils through contacts, for example, raises a problem in point of watertightness as mentioned above. Thus, in the case of transferring power or signals through electromagnetic coupling between coils disposed in opposing positions, there is a demand for detecting the positional relationship between both the coils in a non-contact manner.

Accordingly, a first object of the present invention is to provide an electronic device and a control method for the electronic device, with which when power or signals are transferred through electromagnetic coupling between coils disposed in opposing positions in two or more separate devices such as a portable electronic device and a station, a position offset between both the coils and the absence of a device to be charged can be detected in a non-contact manner, and charging and data transfer can be controlled depending on a detected result.

Meanwhile, when a secondary battery is charged up to a desired capacity in the above arrangement, charging the secondary battery beyond the desired capacity is wasteful consumption of power and is uneconomical. Furthermore, there is a risk that charging beyond the rated capacity may cause a liquid leakage or the like. In the case of putting a secondary battery on charge, therefore, charging is desirably controlled depending on the recharge rate of the secondary battery. To that end, it is conceivable to estimate the recharge rate of the secondary battery from a terminal voltage of the secondary battery in the charge mode.

However, even if the terminal voltage of the secondary battery has reached, for example, almost the battery voltage in its fully charged state, it is not always sure that the secondary battery is charged up to near the predetermined capacity. Also, the terminal voltage of the secondary battery in the charge mode cannot be regarded as indicating a true secondary voltage because it increases due to the internal resistance. For those reasons, a method of precisely estimating the battery recharge rate from the terminal voltage of the secondary battery in the charge mode is not expectable.

A second object of the present invention is therefore to provide an electronic device and a recharge-rate estimating method for a secondary battery, with which a recharge rate of the secondary battery under charging can be estimated with a simple construction.

Additionally, in the case of transferring power through electromagnetic coupling between coils, even if a portable electronic device can precisely estimate a recharge rate of its secondary battery, charging cannot be controlled unless the battery recharge rate is informed to a station, because the power is transferred with operation of the station. A mechanism of informing the battery recharge rate through electrical contacts raises a problem in point of watertightness as mentioned above.

A third object of the present invention is therefore to provide an electronic device and a charging control method, with which even when charging of a secondary battery is made from a charging device to a charged device in a noncontact manner through electromagnetic coupling between coils disposed in opposing positions in two or more separate devices, a recharge rate of the secondary battery, etc. is informed to the charging device in a non-contact manner so that the secondary battery can be charged up to a desired capacity.

DISCLOSURE OF INVENTION

The present invention is featured by an electronic device made up of a first device and a second device, the electronic device comprising a charging/signal transfer unit for carrying out charging from the side of the first device to the side of the second device, and for carrying out signal transfer between the first device and the second device, and a charging/signal transfer control unit for starting the signal transfer after carrying out the charging for a certain period set in advance.

The present invention is featured by an electronic device made up of a first device and a second device, the electronic device comprising a charging/signal transfer unit for carrying out charging from the side of the first device to the side of the second device by utilizing the first device, the second device and electromagnetic coupling or electromagnetic induction, and for carrying out signal transfer between the first device and the second device, and a charging/signal transfer control unit for starting the signal transfer after carrying out the charging for a certain period set in advance.

The present invention is featured in that the charging/signal transfer control unit transmits, prior to the signal transfer, a communication start command for informing the start of communication.

The present invention is featured in that when carrying out the signal transfer, the charging/signal transfer unit is operated in accordance with driving clocks higher than usual driving clocks.

The present invention is featured in that the charging/signal transfer control unit carries out the charging and the signal transfer alternately.

Also, the present invention is featured by an electronic device made up of a first device and a second device for carrying out at least transfer of power or signals through electromagnetic coupling or electromagnetic induction between first and second coils disposed in opposing positions, the electronic device comprising a signal supply unit for supplying a signal to the first coil to generate an external magnetic field, a state detecting unit for detecting an electrical state of the second coil in accordance with the external magnetic field, and a position determining unit for determining a positional relationship between the first and second coils in accordance with a result detected by the state detecting unit.

The present invention is featured in further comprising an informing unit for informing the positional relationship determined by the position determining unit.

The present invention is featured in that when the positional relationship between the first and second coils is determined to be in predetermined relation by the position determining unit, the informing unit informs the determination result.

Further, the present invention is featured by an electronic device made up of a first device and a second device for carrying out at least transfer of power or signals through coils, the electronic device comprising a first coil disposed in the first device, a second coil disposed in the second device and being capable of electromagnetically coupling with the first coil, a signal supply circuit for supplying a signal to the first coil to generate an external magnetic field, a current detecting circuit for detecting a current flowing through the second coil in accordance with the external magnetic field, and a position determining circuit for determining a positional relationship between the first and second coils in accordance with a result detected by the current detecting circuit.

Further, the present invention is featured by an electronic device for carrying out at least transfer of power or signals to a partner device through electromagnetic coupling or electromagnetic induction between coils disposed in opposing positions, the electronic device comprising a signal supply unit for supplying a signal to a coil in its own device, and a position determining unit for determining a positional relationship between its own device and the partner device upon receiving a command from the partner device after the signal supply unit has supplied the signal to the coil in its own device.

The present invention is featured in further comprising an informing unit for informing the positional relationship determined by the position determining unit.

The present invention is featured in that when the positional relationship between the first and second coils is determined to be in predetermined relation by the position determining unit, the informing unit informs the determination result.

The present invention is featured in that when the position determining unit does not receive the command from the partner device for a certain period, the informing unit informs the absence of the partner device.

The present invention is featured in that the coil disposed in its own device is of the air-core type.

Further, the present invention is featured by a position detecting method for an electronic device made up of a first device and a second device for carrying out at least transfer of power or signals through electromagnetic coupling or electromagnetic induction between coils disposed in opposing positions, the method comprising the steps of supplying a signal to a first coil in the first device to generate an external magnetic field, detecting a current flowing through a second coil in the second device in accordance with the external magnetic field, and determining a positional relationship between the first and second coils in accordance with the detected current.

Further, the present invention is featured by an electronic device made up of a first device and a second device for carrying out at least transfer of power or signals through electromagnetic coupling or electromagnetic induction between first and second coils disposed in opposing positions, the electronic device comprising a signal supply unit for supplying a signal to the first coil to generate an external magnetic field, a state detecting unit for detecting an electrical state of the second coil in accordance with the external magnetic field, and a control unit for controlling the signal supply by the signal supply unit in accordance with a result detected by the state detecting unit.

The present invention is featured in that the electrical state is a current state or a voltage state.

In the electronic device, the present invention is featured further comprising a signal transfer unit for carrying out signal transfer between the first and second devices, a rectifying unit for rectifying a signal flowing through the second coil, and an electricity accumulating unit for accumulating the signal rectified by the rectifying unit.

The present invention is featured in that the signal transfer unit carries out the signal transfer after the signal supply unit has supplied the signal for a certain period.

In the electronic device, the present invention is featured in that the signal transfer unit carries out the signal transfer after the signal supply unit has supplied the signal for a certain period and after a communication start command for informing the start of communication has been transmitted.

The present invention is featured in that when carrying out the signal transfer between the first and second devices, operation is performed in accordance with driving clocks higher than usual driving clocks.

The present invention is featured in that the control unit controls the signal supply by the signal supply unit and the signal transfer by the signal transfer unit to be executed alternately.

The present invention is featured in that when the positional relationship between the first and second coils is determined to be in predetermined relation, the control unit changes a duty ratio between the signal supply by the signal supply unit and the signal transfer by the signal transfer unit.

The present invention is featured in that a result detected by the state detecting means is transferred by the signal transfer unit.

The present invention is featured in that the second device is of the portable type.

In the electronic device, the present invention is featured in that the first or second coil is of the air-core type.

Further, the present invention is featured by an electronic device made up of a first device and a second device for carrying out at least transfer of power or signals through coils, the electronic device comprising a first coil disposed in the first device, a second coil disposed in the second device and being capable of electromagnetically coupling with the first coil, a signal supply circuit for supplying a signal to the first coil to generate an external magnetic field, a state detecting circuit for detecting an electrical state of the second coil in accordance with the external magnetic field, and a control circuit for controlling the signal supply by the signal supply circuit in accordance with a result detected by the state detecting circuit.

The present invention is featured in that the electrical state is a current state or a voltage state.

Further, the present invention is featured by an electronic device for carrying out at least transfer of power or signals to a partner device through electromagnetic coupling or electromagnetic induction between coils disposed in opposing positions, the electronic device comprising a signal supply unit for supplying a signal to a coil in its own device, and a control unit for controlling the signal supply by the signal supply unit upon receiving a command from the partner device after the signal supply unit has supplied the signal to the coil.

The present invention is featured in that upon receiving no commands from the partner device for a certain period, the control unit terminates the signal supply by the signal supply unit.

The present invention is featured in that upon receiving, from the partner device, a command informing that the charging is no more required, the control unit terminates the signal supply by the signal supply unit.

The present invention is featured in that when the communication start command is transmitted from the partner device, the signal supply means carries out the signal transfer.

The present invention is featured in that the coil is of the air-core type.

Further, the present invention is featured by a control method for an electronic device made up of a first device and a second device for carrying out at least transfer of power or signals through electromagnetic coupling or electromagnetic induction between first and second coils disposed in opposing positions, the method comprising the steps of supplying a signal to the first coil in the first device to generate an external magnetic field, detecting an electrical state of the second coil in the second device in accordance with the external magnetic field, and controlling the signal supply in the signal supplying step in accordance with a detected result of the electrical state of the second coil.

The present invention is featured in that the electrical state is a current state or a voltage state.

Further, the present invention is featured by an electronic device comprising a charging unit for charging a secondary battery in an intermittent manner, a first voltage detecting unit for detecting a voltage of the secondary battery after a certain time has lapsed from interrupt of the charging by the charging unit, and an estimating unit for estimating a recharge rate of the secondary battery in accordance with the voltage detected by the voltage detecting unit.

The present invention is featured in further comprising a second voltage detecting unit for detecting a voltage of the secondary battery during the charging by the charging unit, and a subtracting unit for subtracting the voltage detected by the first voltage detecting unit from the voltage detected by the second voltage detecting unit, the estimating unit estimating a recharge rate of the secondary battery from a voltage difference calculated by the subtracting unit.

The present invention is featured in further comprising a determining unit for determining whether the recharge rate estimated by the estimating unit reaches to a predetermined value.

The present invention is featured in that if the determination result by the determining unit is affirmative, the charging unit terminates the charging.

Further, the present invention is featured by an electronic device comprising a charging circuit for charging a secondary battery in an intermittent manner, a voltage detecting circuit for detecting a voltage of the secondary battery after a certain time has lapsed from interrupt of the charging by the charging unit, and an estimating circuit for estimating a recharge rate of the secondary battery in accordance with the voltage detected by the voltage detecting circuit.

Further, the present invention is featured by a recharge-rate estimating method for a secondary battery, comprising the steps of charging the secondary battery in an intermittent manner, interrupting the charging of the secondary battery, detecting a voltage of the secondary battery after a certain time has lapsed from the interrupt of the charging, and estimating a recharge rate of the secondary battery in accordance with the detected voltage.

Further, the present invention is featured by an electronic device in which a charging device transfers power to a charged device through electromagnetic coupling or electromagnetic induction between first and second coils disposed in opposing positions and the charged device charges the transferred power into a secondary battery in an intermittent manner, the electronic device comprising a first voltage detecting unit for detecting a voltage of the secondary battery after a certain time has lapsed from interrupt of the charging, a transfer unit for transferring the voltage detected by the first voltage detecting unit or an estimated result based on the detected voltage through the first and second coils, and a control unit for controlling the charging of the secondary battery in accordance with a result transferred by the transfer unit.

The present invention is featured in that the control unit controls the charging by the charging unit and the signal transfer by the signal transfer unit to be executed alternately, and also controls a duty ratio between the charging by the charging unit and the signal transfer by the signal transfer unit in accordance with the result transferred by the transfer unit.

The present invention is featured in that the charged device is of the portable type.

The present invention is featured in that the first or second coil is of the aircore type.

Further, the present invention is featured by an electronic device in which a charging device transfers power to a charged device through electromagnetic coupling or electromagnetic induction between first and second coils disposed in opposing positions and the charged device charges the transferred power into a secondary battery in an intermittent manner, the electronic device comprising a first voltage detecting circuit for detecting a voltage of the secondary battery after a certain time has lapsed from interrupt of the charging, a transfer circuit for transferring the voltage detected by the first voltage detecting circuit or an estimated result based on the detected voltage through the first and second coils, and a control circuit for controlling the charging in accordance with a result transferred by the transfer unit.

Further, the present invention is featured by a charging control method for an electronic device in which a charging device transfers power to a charged device through electromagnetic coupling or electromagnetic induction between first and second coils disposed in opposing positions and the charged device charges the transferred power into a secondary battery, the method comprising the steps of interrupting the charging of the secondary battery, detecting a voltage of the secondary battery after a certain time has lapsed from the interrupt of the charging, transferring the detected voltage or an estimated result based on the detected voltage through the first and second coils, and controlling the charging of the secondary battery in accordance with a transferred result.

Further, the present invention is featured by an electronic device comprising a charging unit for charging a secondary battery in an intermittent manner, a first voltage detecting unit for detecting a voltage of the secondary battery at the time immediately after interrupt of the charging by the charging unit, a second voltage detecting unit for detecting a voltage of the secondary battery at the time immediately before resumption of the charging by the charging unit after the interrupt of the charging, and an estimating unit for estimating a recharge rate of the secondary battery in accordance with a voltage difference between the voltage of the secondary battery detected by the first voltage detecting unit and the voltage of the secondary battery detected by the second voltage detecting unit.

Further, the present invention is featured by an electronic device comprising a charging circuit for charging a secondary battery in an intermittent manner, a first voltage detecting circuit for detecting a voltage of the secondary battery at the time immediately after interrupt of the charging by the charging circuit, a second voltage detecting circuit for detecting a voltage of the secondary battery at the time immediately before resumption of the charging by the charging circuit after the interrupt of the charging, and an estimating circuit for estimating a recharge rate of the secondary battery in accordance with a voltage difference between the voltage of the secondary battery detected by the first voltage detecting circuit and the voltage of the secondary battery detected by the second voltage detecting circuit.

Further, the present invention is featured by a recharge-rate estimating method for an electronic device, comprising the steps of charging a secondary battery, interrupting the charging of the secondary battery, resuming the charging of the secondary battery, detecting an interrupt voltage provided as a voltage of the secondary battery at the time immediately after interrupt of the charging, detecting a resumption voltage provided as a voltage of the secondary battery at the time immediately before resumption of the charging, and estimating a recharge rate of the secondary battery in accordance with a voltage difference between the interrupt voltage and the resumption voltage.

Further, the present invention is featured by an electronic device comprising a charging unit for charging a secondary battery in an intermittent manner, a first voltage detecting unit for detecting a voltage of the secondary battery at the time immediately before resumption of the charging by the charging unit after interrupt of the charging by the charging unit, a second voltage detecting unit for detecting a voltage of the secondary battery at the time immediately after resumption of the charging, and an estimating unit for estimating a recharge rate of the secondary battery in accordance with a voltage difference between the voltage of the secondary battery detected by the first voltage detecting unit and the voltage of the secondary battery detected by the second voltage detecting unit.

Further, the present invention is featured by an electronic device comprising a charging circuit for charging a secondary battery in an intermittent manner, a first voltage detecting circuit for detecting a voltage of the secondary battery at the time immediately before resumption of the charging by the charging circuit after interrupt of the charging by the charging circuit, a second voltage detecting circuit for detecting a voltage of the secondary battery at the time immediately after resumption of the charging, and an estimating circuit for estimating a recharge rate of the secondary battery in accordance with a voltage difference between the voltage of the secondary battery detected by the first voltage detecting circuit and the voltage of the secondary battery detected by the second voltage detecting circuit.

Further, the present invention is featured by a recharge-rate estimating method for an electronic device, comprising the steps of charging a secondary battery, interrupting the charging of the secondary battery, resuming the charging of the secondary battery, detecting a just-before-resumption voltage provided as a voltage of the secondary battery at the time immediately before resumption of the charging by the charging after interrupt of the charging, detecting a just-after-resumption voltage provided as a voltage of the secondary battery at the time immediately after resumption of the charging, and estimating a recharge rate of the secondary battery in accordance with a voltage difference between the just-before-resumption voltage and the just-after-resumption voltage.

BRIEF DESCRIPTION OF DRAWINGS

FIG. 1 is a plan view showing a construction of a station and an electronic watch according to one embodiment of the present invention.

FIG. 2 is a sectional view showing the construction of the station and the electronic watch taken along line A—A of FIG. 1.

FIG. 3 is a block diagram showing an electrical construction of the station.

FIGS. 4(a) and 4(b) show respectively waveforms of first and second charging signals produced as a signal e in the station.

FIG. 5 is a block diagram showing a construction of a command detector in the station.

FIGS. 6(a) and 6(b) are timing charts for explaining the operation of the command detector.

FIG. 7 is a circuit diagram showing one example of a receiving circuit in the station.

FIGS. 8(*a*) to 8(*e*) are timing charts for explaining the operation of the receiving circuit.

FIG. 9 is a block diagram showing an electrical construction of the electronic watch.

FIGS. 10(*a*) to 10(*f*) are timing charts for explaining the operation of the electronic watch.

FIG. 11 is a flowchart showing the operation of charging and data transfer carried out between the station and the electronic watch.

FIG. 12 is a flowchart showing the operation of charging and data transfer carried out in the station.

FIGS. 13(*a*) to 13(*d*) show one example of messages displayed on a display unit of the station.

FIGS. 14(*a*) to 14(*d*) are timing charts for explaining the concrete operation carried out between the station and the electronic watch.

FIG. 15 is a graph for explaining the relationship between a voltage and a charging current of a secondary battery.

FIG. 16 is a block diagram showing an electrical construction of an electronic watch according to a second embodiment.

FIG. 17 is an explanatory view of a threshold table in the second embodiment.

FIG. 18 is a flowchart showing the operation of charging and data transfer carried out between a station and the electronic watch according to the second embodiment.

FIG. 19 is a graph for explaining the relationship between an offset and an output current.

FIG. 20 is a block diagram showing an electrical construction of an electronic watch according to a third embodiment.

FIGS. 21(*a*) to 21(*d*) are timing charts for explaining the operation in the electronic watch according to the third embodiment.

FIG. 22 is a graph showing the relationship between a battery voltage and a voltage rise ΔEv upon shift from the discharge mode to the charge mode in intermittent charging.

FIG. 23 is a graph showing a conversion property of a conversion table.

FIG. 24 is a flowchart showing the operation of charging and data transfer carried out between a station and the electronic watch according to the third embodiment.

FIG. 25 is a flowchart showing the operation of charging and data transfer in the station according to the third embodiment.

FIGS. 26(*a*) to 26(*c*) show one example of messages displayed on a display unit of the station in the third embodiment.

FIG. 27 is a block diagram showing a construction of an electronic watch according to a fourth embodiment of the present invention.

FIG. 28 is a flowchart showing the operation of charging and data transfer carried out between a station and the electronic watch according to the fourth embodiment.

FIG. 29 is a graph showing a charge/discharge characteristic of a general secondary battery.

FIG. 30 is a graph for explaining a voltage rise due to the internal impedance of the secondary battery.

FIG. 31 is a circuit diagram for explaining a voltage rise upon shift from the charge mode to the discharge mode.

FIG. 32 is a block diagram showing an electrical construction of an electronic watch according to a sixth embodiment.

FIGS. 33(*a*) to 33(*d*) are timing charts for explaining the operation in the electronic watch according to the sixth embodiment.

FIG. 34 is a graph showing the relationship between a battery voltage and a voltage drop ΔEv' upon shift from the discharge mode to the charge mode in intermittent charging.

FIG. 35 is a graph showing a conversion property of a conversion table in the sixth embodiment.

FIGS. 36(*a*) and 36(*b*) are examples is a representation for explaining the operation of a seventh embodiment.

BEST MODE FOR CARRYING OUT THE INVENTION

Embodiments of the Invention

[1] First Embodiment

One embodiment of the present invention will be described below. While a first device and a second device are described as being, by way of example, a station and an electronic device to be charged by the station in this embodiment, the following description should not be construed in a sense limiting the present invention.

[1.1] Mechanical Construction

FIG. 1 is a plan view showing a construction of the station and the electronic watch according to this embodiment. As shown in FIG. 1, an electronic watch 200 is placed in a recess 101 formed in a station 100 when charging, data transfer, etc. are to be performed. Since the recess 101 is formed into a shape slightly greater than a body 201 and a band 202 of the electronic watch 200, the watch body 201 is positioned with respect to the station 100 when placed in the recess 101.

The station 100 includes various input units such as a charging start button 103$_1$ for instructing the start of charging and a transfer start button 103$_2$ for instructing the start of data transfer, and a display unit 104 for displaying various messages. In an ordinary state in use, the electronic watch 200 according to this embodiment is worn on the user's wrist and indicates the date, the time of day, etc. in the display unit 204. In addition, the electronic watch 200 is also designed to detect and store information of the living body, such as a pulse rate or a heart rate, with intervals of certain time using a sensor or the like (not shown).

FIG. 2 is a sectional view taken along line A—A in FIG. 1. As shown in FIG. 2, a back cover 212 covering a lower surface of the body 201 of the electronic watch includes a watch side coil 210 used for data transfer and charging and positioned inwardly of a cover glass 211. Also, the watch body 201 incorporates a circuit board 221 connected to a secondary battery 220, the watch side coil 210, etc.

On the other hand, the station 100 includes a station side coil 110 is provided inwardly of a cover glass 111 defining a part of the recess 101 at a position opposed to the watch side coil 210. Also, the station 100 incorporates a circuit board 121 connected to the coil 110, the charging start button 103$_1$, the transfer start button 103$_2$, the display unit 104, a primary power source (not shown), etc.

In a condition of the electronic watch 200 being placed in the station 100 as shown, the station side coil 110 and the watch side coil 210 are physically in a non-contact relation with the cover glasses 111, 211 interposed therebetween, but are electromagnetically coupled to each other because planes of winding of both the coils are substantially parallel to each other.

Further, the station side coil 110 and the watch side coil 210 are each of the air-core type having no magnetic core for the reasons of avoiding a watch mechanism section from being magnetized, avoiding an increase of weight of the watch side, and avoiding a magnetic metal from being exposed. When the present invention is applied to an electronic device which is free from those problems, coils having magnetic cores may be employed. Incidentally, if a signal frequency applied to the coils is sufficiently high, air-core coils can be used with a satisfactory result.

[1.2] Electrical Construction

Electrical constructions of the station 100 and the electronic watch 200 will now be described.

[1.2.1] Station

The construction on the side of the station 100 will be first described with reference to FIG. 3. As shown in FIG. 3, the station side coil 110 has one terminal pulled up to a source voltage Vcc, and the other terminal D connected to a drain of a transistor 153. A gate of the transistor 153 is connected to an output of an AND gate 152 having one input terminal supplied with a clock signal CLK, and a source of the transistor 153 is grounded.

The clock signal CLK is a signal for synchronizing the operations of various sections, and is produced by an oscillation circuit 140. When the charging start button $103_1$ and the transfer start button $103_2$ are depressed by the user, each button outputs a pulse signal of one shot. For convenience of description, the pulse signals outputted from both the buttons are referred to as STR together, but for discriminating which one of the buttons is depressed, it is assumed here that a pulse signal CS is outputted upon the depression of the charging start button $103_1$.

When the pulse signal STR is supplied to a timer A 141, the timer A 141 counts down a preset value m with the clock signal CLK, and outputs a signal α which takes an H-level during the counting-down. The preset value m is set to such a value as causing an H-level period of the signal α to continue for, e.g., 10 hours. In other words, the timer A 141 is designed so as to output the signal α of an H-level for 10 hours after the charging start button $103_1$ or the transfer start button $103_2$ is depressed by the user. The signal α is inverted in its level by an inverting circuit 143 and then supplied to a second input terminal of an OR gate 157 and a processing circuit 130.

Also, when the pulse signal STR is supplied to a timer B 142, the timer B 142 counts down a preset value n with the clock signal CLK, and outputs a signal b which takes an H-level during the counting-down. The preset value n is set to a value that is much smaller than m and causes an H-level period of the signal b to continue for, e.g., 30 minutes. In other words, the timer B 142 is designed so as to output the signal b of an H-level for 30 minutes after the charging start button $103_1$ or the transfer start button $103_2$ is depressed by the user.

The setting time of the timer A 141 is a period sufficient for charging the secondary battery to a recharge rate corresponding to a fully charged state. The setting time of the timer A 141 is selected aiming to complete the charging even when a later-described command com 3 is not outputted from the electronic watch 200 for some reason after the charging start button $103_1$ or the transfer start button $103_2$ has been depressed.

Also, the setting time of the timer B 142 is a period required for charging the secondary battery from a state in which the battery recharge rate is zero to a data transfer enable state (system start-up state). The setting time of the timer B 142 is selected aiming to determine whether (1) the electronic watch 200 is placed in the station 100 but the battery recharge rate is not sufficient, or (2) the electronic watch 200 is not placed in the station 100.

After receiving the pulse signal STR, a command detector 160 outputs a signal d which takes an H-level when later-described commands com 1–com 3 are not received from the side of the electronic watch 200 for a certain period of 30 minutes in which the signal b takes an H-level. The signal d is supplied to a first input terminal of the OR gate 157 and the processing circuit 130. A detailed construction of the command detector 160 will be described later.

A charging/transfer selector 170 outputs, as a pulse signal e, a first charging signal as shown in FIG. 4(a) during the period in which a signal OFF is at an L-level, after receiving the pulse signal STR. On the other hand, when the pulse signal CS is supplied upon the depression of the charging start button $103_1$ and the later-described command com 1 is received from the side of the electronic watch 200, the charging/transfer selector 170 outputs, as the signal e, a second charging signal having an increased duty ratio as shown in FIG. 4(b).

However, if the signal OFF shifts to an H-level, the charging/transfer selector 170 holds the signal e at the L-level.

The charging/transfer selector 170 enables the transistor 153 to switch over its drain-source path depending on the level of the clock signal CLK during the period in which the signal e is at the H-level after receiving the pulse signal STR. Accordingly, a pulse signal resulted from switching over the source voltage Vcc with the clock signal CLK is applied to the station side coil 110, whereby an external magnetic field is generated to charge the electronic watch 200.

On the other hand, during the period in which the signal e is at the L-level, the AND gate 152 is closed and therefore the station side coil 110 is pulled up to the source voltage Vcc. When an external magnetic field is generated by the watch side coil 210 in the above condition, a signal S2 in induced at the terminal D of the station side coil 110. The signal S2 is supplied to a receiving circuit 154. The receiving circuit 154 demodulates with the clock signal CLK, and its detailed construction will be described later. Then, a decoder 155 decodes a result demodulated by the receiving circuit 154 during the period in which the signal e is at the L-level.

In this way, charging of the electronic watch 200 is performed during the period in which the signal e is at the H-level, while data transfer is performed during the period in which the signal e is at the L-level. Thus, the charging/transfer selector 170 has a function to switch over the charging and the data transfer in accordance with the level of the signal e.

Signals transmitted from the electronic watch 200 include not only the later-described commands com 1–com 3, but also information (data) of the living body such as a pulse rate or a heart rate. The decoder 155 supplies the information of the living body to the processing circuit 130, whereas upon receiving the commands com 1–com 3, the decoder 155 informs the fact to the various sections by setting output signals com 1–com 3 to an H-level. An OR gate 156 outputs, as a signal c, the logical sum of the signals com 1–com 3. Thus, the signal c functions as a signal indicating a condition in which any of the commands com 1–com 3 from the electronic watch 200 is being received.

The signal com 1 indicating that the decoded result provides the command com 1 is supplied to the charging/transfer selector 170.

Also, the signal com 2 indicating that the decoded result provides the command com 2 is supplied to the processing circuit 130 through a latch circuit 158.

Further, the signal com 3 indicating that the decoded result provides the command coin 3 is supplied to a third input terminal of the OR gate 157. The logical sum of the OR gate 157 is then supplied as the signal OFF to the charging/transfer selector 170.

Since signals supplied to the first to third input terminals of the OR gate 157 are first the signal d from the command detector 160, secondly the signal resulted by inverting a level of the signal α from the timer A 141, and thirdly the signal com 3 indicating that the decoded result provides the command com 3, the charging/transfer selector 170 terminates outputting of the signal e if any of the following cases is satisfied.

Thus, the charging/transfer selector 170 holds the signal e at the L-level and finishes the charging in any of the case (1) in which the commands com 1–com 3 are not received from the side of the electronic watch 200 until a period of 30 minutes lapses from the outputting of the signal STR upon the depression of the charging start button $103_1$ or the transfer start button $103_2$, the case (2) in which 10 hours has lapsed from the start of the charging, and the case (3) in which the signal received from the electronic watch 200 is the command com 3.

Additionally, the processing circuit 130 renders the display unit 104 to display various data such as the inputted signals and the decoded information of the living body.

[1.2.1.1] Command Detector

The construction of the command detector 160 will now be described with reference to FIG. 5.

First, an AND gate 1601 outputs the logical product of the signal b and the signal c. Then, an RS flip-flop comprising NOR gates 1603 and 1604 receives, as an R signal, the logical product of the AND gate 1601, and also receives, as an S signal, the signal STR. An inverter circuit 1605 inverts an output of the NOR gate 1604, and supplies an inverted signal U1 to an input terminal D of a D flip-flop 1606. The D flip-flop 1606 is reset with the signal STR, and outputs, as the signal d, the immediately preceding level at the input terminal D upon falling of the signal b.

When the charging start button $103_1$ or the transfer start button $103_2$ is depressed by the user, the pulse signal STR of one shot is outputted, by way of example, as shown in FIG. 6(a). The output of the NOR gate 1604 turns to an L-level with the signal STR, whereupon the signal U1 takes an H-level. Also, the timer B 142 (see FIG. 3) executes the counting operation with the signal STR, whereupon the signal b takes an H-level for a certain period as shown in FIG. 6(a).

When the decoder 155 receives the commands com 1–com 3 from the electronic watch 200 in FIG. 3, these commands are outputted in the pulsed form during the period in which the signal e is at the L-level.

In that connection, when the signal b and the signal c take an H-level and the logical product of both the signals takes an H-level, the output of the NOR gate 1604 turns to an H-level and the signal U1 shifts to an L-level, following which this condition is maintained. Accordingly, the signal d outputted from an output terminal Q of the D flip-flop 1606 is held at the L-level at the time of (exactly immediately before) falling of the signal b after the predetermined time has lapsed from the outputting of the pulse signal STR of one shot.

On the other hand, when the decoder 155 receives no commands com 1–com 3, the signal c remains at the L-level as shown in FIG. 6(b). The signal U1 is therefore held at the H-level. Accordingly, the signal d outputted from the output terminal Q of the D flip-flop 1606 shifts to an H-level upon falling of the signal b after the predetermined time has lapsed from the outputting of the pulse signal STR.

Thus, the command detector 160 is designed such that when at least the commands com 1–com 3 are received from the side of the electronic watch 200 during the predetermined period of 30 minutes lapsed from the supply of the pulse signal STR, the signal d is held at the L-level after the lapse of the predetermined period, while the signal d shifts to the H-level when no commands are received.

[1.2.2] Receiving Circuit

The construction of the receiving circuit 154 will now be described with reference to FIG. 7. Note that the illustrated construction shows merely one example and the receiving circuit 154 is basically constructed depending on the modulation scheme of data transfer.

First, as shown in FIG. 7, the signal S2 induced at the other terminal D of the station side coil 110 is supplied to an inverter circuit 1541 for inversion of a level and shaping of a waveform, followed by being supplied, as a reset signal RST, to D flip-flops 1542 and 1543 in synchronism with the clock signal CLK from the oscillation circuit 140 (see FIG. 3). The D flip-flop 1542 has an input terminal D connected to the source voltage Vcc, and an output terminal Q connected to an input terminal D of the D flip-flop 1543 in the next stage. An output terminal Q of the D flip-flop 1543 outputs a signal S3 as a demodulated result.

Next, waveforms at various points in the receiving circuit 154 having the above constructed will be studied.

When data is being received from the electronic watch 200, the transistor 153 (see FIG. 3) is not switched over. Therefore, the other terminal D of the pulled-up station side coil 110 is held at a pulled-up level if the watch side coil 210 does not generate an external magnetic field, but if the watch side coil 210 generates an external magnetic field, the level at the terminal D varies depending on a level induced with the generated external magnetic field. Accordingly, the signal S2 induced at the terminal D is, by way of example, as shown in FIG. 8(a).

Depending on the signal S2, the signal RST given as an output of the inverter circuit 1541 takes an H-level when the voltage of the signal S2 exceeds a threshold Vth, as shown in FIG. 8(b), thereby resetting the D flip-flops 1542 and 1543. On that occasion, since the D flip-flops 1542 and 1543 each outputs the immediately preceding level at the input terminal D upon rising of the clock signal CLK, the output Q1 of the D flip-flop 1543 and the output S3 of the D flip-flop 1542 are respectively as shown in FIGS. 8(d) and 8(e). In other words, the output signal S3 of the receiving circuit 154 is given as a signal taking an L-level during the period in which the watch side coil 210 generates an external magnetic field.

Here, the period in which the watch side coil 210 generates an external magnetic field means a period in which data transferred from the electronic watch 200 to the station 100 takes an L-level as described later. It is hence understood that the signal S3 eventually represents what is resulted from demodulating data or commands from the electronic watch 200.

[1.3] Electronic Watch

An electrical construction of the electronic watch 200 will now be described. FIG. 9 is a block diagram showing the electrical construction.

As shown in FIG. 9, one terminal P of the watch side coil 210 is connected to a positive-side terminal of the secondary battery 220 through a diode 245, and the other terminal of the coil 210 is connected to a negative-side terminal of the secondary battery 220. With this arrangement, when a pulse signal is applied to the station side coil 110 (see FIG. 3) to generate an external magnetic field, a signal is induced at the one terminal P of the watch side coil 210 due to the external magnetic field. The induced signal is rectified by the diode 245 and then charged into the secondary battery 220 when a transistor 253 is turned off. A voltage Vcc of the secondary battery 220 is employed as a power source for various sections in the electronic watch 200.

Next, a charging period detecting circuit 261 detects whether a signal is induced at the terminal P due to the external magnetic field. When a signal is induced at the terminal P as shown in FIG. 10(a), the charging period detecting circuit 261 outputs a signal CHR having an H-level as shown in FIG. 10(b). Also, a timing generating circuit 271 creates a pulse having a certain width with certain intervals, and supplies the pulse to one input terminal of an AND gate 272. The signal CHR from the charging period detecting circuit 261 is supplied to the other input terminal of the AND gate 272, and therefore the AND gate 272 is opened when a signal is induced at the terminal P due to the external magnetic field. Thus, as shown in FIG. 10(c), a signal CKT from the AND gate 272 is outputted in the form of a pulse having a certain width with certain intervals when a signal is induced at the terminal P.

The signal CKT is supplied to a base of a transistor 253. The transistor 253 has a collector connected to the terminal P through a resistance 254, and has an emitter grounded. Therefore, a collector-emitter path of the transistor 253 is turned on when the signal CKT has an H-level.

When the transistor 253 is turned on, a potential at the terminal P varies depending on a current flowing through the watch side coil 210 due to a voltage drop across the resistance 254. In other words, the greater a current flowing through the watch side coil 210, the lower is a potential level at the terminal P. A charging current determining circuit 263 compares the potential level at the terminal P with the reference level, and outputs a signal having an H-level if the current flowing through the watch side coil 210 is not smaller than a threshold current corresponding to the reference level. A latch circuit 264 latches an output signal of the charging current determining circuit 263 upon falling of the signal CKT. Namely, the latch circuit 264 outputs a compared result of the charging current which has been determined during the period in which the transistor 253 is turned on.

Then, an AND gate 291 obtains the logical product of the signal CHR from the charging period detecting circuit 261 and the latch result by the latch circuit 264, and outputs it as the signal com 1.

Also, an AND gate 292 obtains the logical product of the signal CHR from the charging period detecting circuit 261 and an inverted result of the latch result by the latch circuit 264, and outputs it as the signal com 2.

Further, a battery voltage detecting circuit 265 detects a terminal voltage of the secondary battery 220 during the period in which the signal CKT has the L-level (during the period in which the transistor 253 is turned off, and then detects whether the secondary battery 220 is in a completely charged state (fully charged state). If so, the battery voltage detecting circuit 265 outputs the signal com 3 having an H-level.

Here, the signal com 1 takes the H-level when a signal is induced at the terminal P and the current flowing through the watch side coil 210 is not smaller than the threshold. Accordingly, the case in which the signal com 1 takes the Hlevel represents a condition that the station side coil 110 and the watch side coil 210 are opposed to each other in proper positions.

Also, the signal com 2 takes the H-level when a signal is induced at the terminal P and the current flowing through the watch side coil 210 is smaller than the threshold. Accordingly, the case in which the signal com 2 takes the H-level represents a condition that the station side coil 110 and the watch side coil 210 are not opposed to each other in proper positions, i.e., they are offset in position.

Further, the case in which the signal com 3 takes the H-level represents a condition that the secondary battery 220 is in a fully charged state and requires to be no more charged.

Next, a control circuit 230 is one kind of central processing/control unit having a timing function, and executes mainly the following processes. First, in a usual condition, the control circuit 230 executes a function of rendering the display unit 204 to display data (e.g., the current time of day) corresponding to a mode set through the input unit 203 (not shown in FIG. 1). Secondly, when a signal is induced at the terminal P and the signal CHR shifts to the H-level, the control circuit 230 executes a function of recognizing the states represented by the signals com 1–com 3, creating the signals com 1–com 3 corresponding to the respective states, and delivering them upon shift of the signal CHR to the L-level. Thirdly, the control circuit 230 executes a function of outputting digital data, which is to be transmitted to the station 100, after delivering the commands com 1–com 3. The control circuit 230 supplies, as W1, the commands com 1–com 3 and the digital data to a transmitting circuit 250. As the digital data to be transmitted to the station 100, for example, information of the living body such as a pulse rate or a heart rate measured by a sensor or the like (not shown) is conceivable.

The transmitting circuit 250 converts the data, commands, etc., which are to be transmitted to the station 100, into the serial form, and during the period in which the serial data is at the L-level, it outputs a switching signal as a burst signal of certain frequency. The switching signal from the transmitting circuit 250 is supplied to a base of a transistor 252 through a resistance 251. The transistor 252 has an emitter connected to the positive-side terminal of the secondary battery 220, and has a collector connected to the one terminal P of the coil 210.

Furthermore, a driving clock generating circuit 235 is provided which creates driving clocks of plural frequencies and outputs the driving clocks to the various sections of the electronic watch 200.

Accordingly, in the electronic watch 200 thus constructed, when a signal is induced at the terminal P as shown in FIG. 10(a), the signal CHR takes the H-level during the period in which the signal is induced at the terminal P, as shown in FIG. 10(b), and the signal CKT is outputted as shown in FIG. 10(c). Then, as shown in FIG. 10(d), when the signal is induced at the terminal P and the signal CKT takes the L-level, the secondary battery 220 is charged. On the other hand, as shown in FIG. 10(e), when the signal is induced at the terminal P and the signal CKT takes the H-level, the transistor 253 is turned on and a charging current to the secondary battery 220 is checked. Further, as shown in FIG. 10(f), when no signal is induced at the terminal P and the signal CHR takes the L-level, the commands com 1–com 3, the digital data, etc. are transmitted.

[1.4] Transfer Operation of Commands and Digital Data

The transfer operation of commands and digital data between the station 100 and the electronic watch 200 will now be described. As mentioned above, the charging operation of the electronic watch 200 is performed during the period in which the signal e is at the H-level, while the transfer operation is performed during the period in which the signal e is at the L-level.

First, during the period in which the signal e is at the L-level, a pulse signal is not applied to the station side coil 110. Therefore, since the station side coil 110 does not generate an external magnetic field, no signal is induced at the terminal of the watch side coil 210 and the signal CHR takes the L-level. Upon the signal CHR shifting to the L-level, the control signal 230 starts signal transmission from the electronic watch 200 to the station 100 by supplying data, which is to be transmitted to the station 100, to the transmitting circuit 250 following delivery of the commands com 1–com 3.

Then, the transmitting circuit 250 sets an output to an H-level if the data to be transmitted to the station 100 has the H-level, and outputs a pulse signal of certain frequency in the burst form if the data has the L-level. The transistor 252 is hence switched over during the period in which the data to be transmitted has the L-level.

Accordingly, during the period in which the data to be transmitted to the station 100 has the L-level, a pulse signal is applied to the watch side coil 210, thereby generating an external magnetic field.

The generated external magnetic field induces, at the terminal D of the station side coil 110, a signal having the same cycle as the applied pulse signal. The signal S3 from the receiving circuit 154 of the above-described construction takes the L-level during the period in which the signal is induced, and takes the H-level except for that period. Eventually, the signal S3 resulted from demodulating the digital data W1 from the electronic watch 200 is obtained on the side of the station 100. Then, the decoder 155 decodes the signal S3, and supplies a decoded result to the processing circuit 130 if it is digital data such as information of the living body, but outputs the corresponding signal com 1–com 3 if it is any of the commands com 1–com 3.

In this way, the station 100 can receive the commands and the digital data from the electronic watch 200.

[1.5] Operation of Charging/Data Transfer

The operation of charging/data transfer in the station 100 and the electronic watch 200 will now be described with reference to flowcharts of FIGS. 11 and 12 in addition to the block diagrams of FIGS. 3 and 9.

First, the user places the electronic watch 200 in the recess 101 of the station 100. The station side coil 110 and the watch side coil 210 are thereby positioned to face each other as shown in FIG. 2, resulting in an electromagnetically coupled state.

Then, when the charging start button $103_1$ or the transfer start button $103_2$ is depressed by the user, the timer A 141 and the timer B 142 start the counting operation with the pulse signal STR (step S101). Also, with the pulse signal STR, the charging/transfer selector 170 outputs, as the signal e, the first charging signal as shown in FIG. 4($a$) (step S102).

Next, whether the timer A 141 has ended the counting operation is determined in accordance with an inverted signal of the signal α (step S103). If the counting operation is ended, this means that 10 hours or more has lapsed from the depression of the charging start button $103_1$ or the transfer start button $103_2$.

Because, as described above, the setting time of the timer A 141 is selected to a period sufficient for charging the secondary battery 220 to a recharge rate corresponding to the fully charged state, the charging should be usually ended before the lapse of the setting time of the timer A 141, upon receiving the command com 3 indicating the fully charged state. The lapse of the setting time of the timer A 141 in spite of the above fact therefore means that there occurs any abnormality such as a failure of the secondary battery 220.

Accordingly, the processing circuit 130 renders the display unit 104 to display a message as shown in FIG. 13($c$), for example, thus informing the user of such a condition (step S104). Also, since the signal OFF shifts to the H-level with the inverted signal of the signal a, the charging/transfer selector 170 holds the signal e at the L-level. In the event of any abnormality, therefore, the charging of the electronic watch 200 is ended.

On the other hand, if the timer A 141 has not ended the counting operation, the charging/transfer selector 170 continues to output the signal e. As a result, the station side coil 110 generates an external magnetic field with switching-over of the transistor 153 during the period in which the signal e is at the H-level, and comes into a standby state for receiving commands from the electronic watch 200 during the period in which the signal e is at the L-level.

Upon the generation of the external magnetic field, a signal is induced at the terminal P on the side of the electronic watch 200. If the remaining charge of the secondary battery 220 is not enough at present (No in step S201), the various sections are not operated and subsequent steps S201–S208 are infeasible. Therefore, no commands are delivered to the side of the station 100.

Conversely, if the remaining charge of the secondary battery 220 is enough at present (Yes in step S201), the charging current based on the induced signal is detected in accordance with a voltage drop of the collector potential during the period in which the signal CKT is at the H-level, i.e., during the period in which the transistor 253 is turned on (step S202). The charging current determining circuit 263 then determines whether the charging current is not less than the threshold (step S203).

If the charging current is less than the threshold, this corresponds to the case of the signal com 2 having the H-level; namely, this represents, as described above, a condition that the station side coil 110 and the watch side coil 210 are offset in position. Therefore, the control circuit 230 displays the position offset on the display unit 204 (step S204), and delivers the command com 2 for informing such a condition to the station 100 (step S205).

On the other hand, if the charging current is not less than the threshold, the battery voltage detecting circuit 265 determines whether the secondary battery 220 is in the fully charged state (step S206).

If the fully charged state is determined, this corresponds to the case of the signal com 3 having the H-level; namely, this represents, as described above, a condition that the charging is no more required. Therefore, the control circuit 230 delivers the command com 3 for informing such a condition to the station 100 (step S207).

If the fully charged state is not determined, this corresponds to the case of the signal com 1 having the H-level; namely, this represents, as described above, a condition that the station side coil 110 and the watch side coil 210 are opposed to each other in proper positions, and that the charging proceeds satisfactorily. Therefore, the control circuit 230 delivers the command com 1 for informing such a condition to the station 100 (step S208).

Note that the commands com 1–com 3 are delivered during the period in which no signal is induced at the terminal P; i.e., during the period of 10 seconds in which the signal e is at the L-level on the side of the station 100, and during the period in which the signal CHR is at the L-level on the side of the electronic watch 200.

In this way, when a signal is induced at the terminal P on the side of the electronic watch 200, the magnitude of the charging current and the state of charging of the secondary battery 220 are determined, and any of the commands com 1–com 3 corresponding to the determined state is delivered to the station 100.

Meanwhile, the station 100 executes the charging in accordance with the first charging signal at least during the operating period of the timer B 142, i.e., during a period of 30 minutes. Therefore, even if the secondary battery 220 is not initially in the data transfer enable state and the commands com 1–com 3 are not delivered from the electronic watch 200, the secondary battery 220 is charged to a recharge rate enough for data transfer as a result of the charging for 30 minutes.

Stated otherwise, upon the lapse of 30 minutes after the electronic watch 200 has been placed in the station 100 and the charging start button $103_1$ or the transfer start button $103_2$ has been depressed, the secondary battery 220 is brought into the data transfer enable state and any of the commands com 1–com 3 is delivered.

Accordingly, the case in which no commands are delivered to the station 100 represents a condition that the electronic watch 200 is not placed in the station 100.

In the station 100 coming into the standby state, it is determined whether any of the commands com 1–com 3 is received from the electronic watch 200 (step S111). If any of the commands com 1–com 3 is not received, it is determined whether the timer B 142 has ended the counting operation (step S112). Concretely, the command detector 160 checks whether the signal c has turned to the H-level during the period in which the signal b is at the H-level.

The case in which any of the commands com 1–com 3 is not received even after the timer B 142 has ended the counting operation represents, as described above, a condition that the electronic watch 200 is not placed in the station 100 and the signal d from the command detector 160 takes the H-level.

Upon the shift of the signal d to the H-level, therefore, the processing circuit 130 renders the display unit 104 to display a warning message as shown in FIG. 13(*b*) (step S113), for example, thereby informing the user of such a condition.

Also, since the signal OFF shifts to the H-level with the signal d, the charging/transfer selector 170 holds the signal e at the L-level. As a result, the useless charging operation in the condition of the electronic watch 200 being not placed in the station 100 is ended.

Conversely, if the timer B 142 has not ended the counting operation, the processing sequence returns to step S102 to continue the outputting of the signal e for executing the charging in succession. Then, the determinations in steps S111 and S112 are repeated until any command is delivered from the electronic watch 200, or until the counting operation of the timer B 142 is ended. With the presence of steps S111 and S112, it is possible to essentially discriminate the following cases (1) and (2); namely, (1) the electronic watch 200 is placed in the station 100, but the secondary battery 220 is not in the data transfer enable state due to an insufficient battery recharge rate, and (2) the electronic watch 200 is not placed in the station 100.

If any command is received from the electronic watch 200 by the station 100 being in the standby state, the received command is decoded by the decoder 155 (step S114).

If the received command is com 1, it is determined whether the initially depressed button is the charging start button $103_1$ (step S115). More specifically, it is determined whether the charging/transfer selector 170 supplied with the signal com 1 has previously received the signal CS. If the determination result is yes, the charging/transfer selector 170 switches over the delivered signal e from the first charging signal shown in FIG. 4(*a*) to the second charging signal shown in FIG. 4(*b*). Then, the processing sequence returns to step S103 to continue the charging in succession.

As described above, the charging is performed during the period in which the signal e is at the H-level, while the data transfer is performed during the period in which the signal e is at the L-level. Also, the period during which the signal e serving as the second charging signal is at the H-level is longer than the period during which the signal e serving as the first charging signal is at the H-level. Accordingly, when the start of charging is instructed in the condition that the station side coil 110 and the watch side coil 210 are opposed to each other in proper positions, the frequency of receiving the command to check the state of charging is lowered, whereas the charging period is prolonged to increase the charging efficiency of the electronic watch 200.

On the other hand, if the received command is com 1 and the initially depressed button is the transfer start button $103_2$, the data transfer is executed through steps S121 to S123 described later.

Also, if the received command is com 3, it is determined whether the initially depressed button is the charging start button $103_1$ (step S117). More specifically, it is determined whether the charging/-transfer selector 170 supplied with the signal OFF based on the signal com 3 has previously received the signal CS. If the determination result is Yes, the secondary battery 220 requires to be no more charged, and therefore the charging/transfer selector 170 holds the signal e at the L-level. The useless charging operation is thereby ended.

On the other hand, if the received command is com 3 and the initially depressed button is the transfer start button $103_2$, the data transfer is executed through steps S121 to S123 described later.

Further, if the received command is com 2, this represents the condition that the station side coil 110 and the watch side coil 210 are offset in position. Therefore, the processing circuit 130 supplied with the signal com 2 renders the display unit 104 to display a warning message as shown in FIG. 13(*a*) (step S118), for example, thereby informing the user of such a condition.

It is then determined whether the initially depressed button is the charging start button $103_1$ (step S119). More specifically, it is determined whether the charging/transfer selector 170 has previously received the signal CS. Even with the transfer start button $103_2$ depressed, however, it is possible to perform the charging during the period in which the signal e is at the H-level, and to perform the data transfer during the period in which the signal e is at the L-level. Therefore, the charging/transfer selector 170 is not required to switch over the signal e or holds it at the L-level. Thus, even when the command com 2 is received, the charging/transfer selector 170 does not essentially determine whether it has previously received the signal CS.

If the initially depressed button is the charging start button $103_1$, the charging itself is feasible although the charging is performed with an insufficient current in this condition. Accordingly, the processing sequence returns to step S102 to continue the charging with the first charging signal in succession.

Even when the received command is com 2, the data transfer is feasible. Accordingly, if the initially depressed button is the transfer start button $103_2$, the data transfer is executed through the following steps S121 to S123.

More specifically, the digital data delivered subsequent to any of the commands com 1–com 3 is received by the receiving circuit 154, decoded by the decoder 155, and transferred to the processing circuit 130 (step S121), followed by repeating the data transfer until coming to the end (step S122). Upon completion of the data transfer, the processing circuit 130 renders the display unit 104 to display a message as shown in FIG. 13(d) (step S122), and also renders the display unit 104 to display information based on the received digital data.

After that, the processing circuit 130 stops the supply of the signal e to the charging/transfer selector 170 through a line now shown in FIG. 3, thereby ending the charging and the data transfer. As an alternative, the processing sequence may be returned to step S102 to continue the charging.

With the station 100 thus constructed, when the charging start button 103$_1$ or the transfer start button 103$_2$ is depressed, the pulse signal STR is outputted as shown in FIG. 14(a).

Thereafter, when the command com 2 is received as shown in FIG. 14(b) due to a position offset between the station side coil 110 and the watch side coil 210, the warning message shown in FIG. 13(a) is displayed on the display unit 104 during a latch period of the signal com 2. Then, when the command com 3 is received upon the secondary battery 220 coming into the fully charged state, the signal e is held at the L-level and the charging operation is ended after that.

Also, when no commands are received as shown in FIG. 14(c) until falling of the signal b, i.e., until the end of the counting operation of the timer B 142, after the pulse signal STR has been outputted, the command detector 160 sets the signal d to the H-level. Therefore, the warning message shown in FIG. 13(b) is displayed on the display unit 104, and the signal e is shifted to the L-level for bringing the charging operation to the end.

Further, when only the command com 1 or com 2 other than com 3 is received as shown in FIG. 14(d) until falling of the signal a, i.e., until the end of the counting operation of the timer A 141, after the pulse signal STR has been outputted, the message shown in FIG. 13(c) is displayed on the display unit 104 and the signal OFF is shifted to the H-level, whereupon the signal e turns to the L-level for bringing the charging operation to the end.

[1.6] Advantages of First Embodiment

With the first embodiment, as described above, when the station side coil 110 and the watch side coil 210 are not correctly opposed to each other and are offset in position, the position offset is detected and a warning indicating such a condition is displayed as shown in FIG. 13(a).

Also, in the condition that the station side coil 110 and the watch side coil 210 are opposed to each other in proper positions, the frequency of receiving the command to check the state of charging is lowered, whereas the charging period is prolonged to increase the charging efficiency of the electronic watch 200.

When the start of charging or data transfer is instructed in spite of the electronic watch 200 being not placed in the station 100, the absence of the electronic watch 200 is detected, whereupon a warning indicating such a condition is displayed as shown in FIG. 13(b) and the charging is ended. Consequently, useless consumption of power is prevented.

According to this first embodiment, therefore, the position offset between the station side coil 110 and the watch side coil 210, and the condition of the electronic watch 200 being not placed in the station 100 can be detected in a non-contact manner. Further, the charging and the data transfer can be controlled depending on a detected result.

In addition, according to this first embodiment, since the data transfer is executed after the secondary battery 220 of the electronic watch 200 has been charged for a certain period by generating an external magnetic field prior to the data transfer, it is possible to prevent such an event that the electronic watch 200 cannot perform the data transfer because of a voltage lowering of the secondary battery 220.

[1.7] Modifications of First Embodiment

The above-described first embodiment can be modified as follows.

[1.7.1] First Modification

While in the first embodiment the data transfer is performed only in one direction from the electronic watch 200 to the station 100, it is a matter of course that data may be transferred in an opposite direction from the station 100 to the electronic watch 200. When data is transferred to the electronic watch 200, the station 100 executes modulation in accordance with the data to be transferred, whereas the electronic watch 200 executes demodulation in match with the modulation scheme. In such a case, well-known techniques can be used to execute the modulation and the demodulation.

[1.7.2] Second Modification

While in the first embodiment the position offset and the absence of the electronic watch are indicated by the display unit 104 provided on the side of the station 100, it is a matter of course that those conditions may be indicated by the display unit 204 provided on the side of the electronic watch 200. Instead of displaying characters on the display unit, the warning may be given by illuminating or blinking LEDs or the likes. Further, rather than being limited to visual means, the warning may be given in a way appealing to the ear with voices, audible alarm, etc. Thus, the term "informing" used in this application can be effected by any suitable means appealing to the five senses of the human being.

[1.7.3] Third Modification

In the first embodiment, the charging period is prolonged to change a duty ratio between the charging and the data transfer if the position offset is not detected. However, the data transfer period may be shortened, or the duty periods of both the charging and the data transfer may be changed.

As an alternative, a value of the charging current detected by the electronic watch 200 may be itself transferred to the station 100 so as to control the duty ratio between the charging and the data transfer in a stepless manner depending on the value of the charging current.

Further, in the first embodiment, a warning is issued if the position offset is detected, and the duty ratio between the charging and the data transfer is changed when the station and the electronic watch are correctly opposed to each other. Conversely, the arrangement may be modified such that when the station and the electronic watch are correctly opposed to each other, such a condition is informed to the user, and if the position offset is detected, the duty ratio between the charging and the data transfer is changed. Thus, the term "predetermined relation" used in this application means both of the case in which the two coils are in position offset relation, and the case in which the two coils are in correctly opposed relation.

[1.7.4] Fourth Modification

In the first embodiment, the electronic watch 200 performs signal transfer when the signal e turns to the L-level. The side of the electronic watch 200 may perform the signal transfer upon recognizing that the system is in a transmission enable state, when a communication start command is transmitted from the side of the station 100 to the side of the electronic watch 200.

With this modification, the charging operation and the signal transfer operation can be made clearly separate from each other. Also, it is possible to perform the signal transfer during the charging operation, and to prevent the station 100 from malfunctioning due to false recognition of extraneous noise as a received signal.

Conversely, the signal transfer may be performed by transferring a communication start command to the side of the station 100 when the side of the electronic watch 200 is brought into a communication enable state after the signal e has turned to the L-level.

With such a modification, the signal transfer can be surely started, for example, after the state of charging enough to perform communication has been established.

[1.7.5] Fifth Modification

In the first embodiment, the state of generating the driving clocks by the driving clock generating circuit 235 of the electronic watch 200 has not been described. The frequency of the driving clocks for use in the signal transfer may be increased so that a higher speed of data transfer processing is secured and power consumption during the usual operation is reduced.

[1.7.6] Sixth Modification

While the first embodiment has been described on an assumption, by way of example, that the first device is the station 100 and the second device or the partner device is the electronic watch 200, such distinction is essentially meaningless in this application, and the present invention can be applied to all types of electronic devices which require transfer of power or signals. The present invention is applicable to any of charged devices incorporating secondary batteries, e.g., electric tooth brushes, electric shavers, cordless phones, cellular phones, personal handy phones, mobile personal computers, and PDA (Personal Digital Assistants), and a charging device for charging them.

[2] Second Embodiment

In the first embodiment, the position offset between the station side coil 110 and the watch side coil 210 is detected by comparing the current (charging current) flowing through the watch side coil 210 with the predetermined threshold. As shown in FIG. 15, however, the current flowing through the watch side coil 210 is reduced with an increase in battery voltage of the secondary battery 220. Depending on actual conditions, therefore, it cannot be often determined whether a current reduction is caused by the position offset or a voltage increase of the secondary battery.

In view of the above, this second embodiment intends to more precisely determine the presence of the position offset based on the charging current and the voltage of the secondary battery.

[2.1] Electrical Construction of Electronic Watch

An electronic watch of the second embodiment will now be described with reference to FIG. 16.

Similar components in FIG. 16 to those of the electronic watch of the first embodiment shown in FIG. 9 are denoted by the same numerals, and their detailed description is omitted here.

An electronic watch 200A of the second embodiment differs from the electronic watch 200 of the first embodiment in that the electronic watch 200A includes, in place of the charging current determining circuit 263, a charging current determining circuit 263' which has a threshold table storing threshold currents corresponding to detected voltages beforehand and determines whether the current flowing through the watch side coil 210 exceeds the threshold current corresponding to detected battery voltage, a battery voltage determining circuit 265' for outputting a detected voltage signal VDET to the charging current determining circuit 263', and a full-charge detecting circuit 290 for determining whether the secondary battery 220 is in the fully charged state in accordance with the detected voltage signal VDET, and setting the signal com 3 to the "H"-level when the secondary battery 220 is in the fully charged state.

[2.2] Threshold Table

The threshold table will now be described with reference to FIGS. 15 and 17. As shown in FIG. 15, for example, the charging current is 10 [mA] in the case of the battery voltage of the secondary battery 220=4 [V], and the charging current is 25 [mA] in the case of the battery voltage of the secondary battery 220=2 [V].

A table of FIG. 17 is obtained by measuring the charging currents corresponding to the respective battery voltages of the secondary battery 220.

The threshold table is then written and stored in, e.g., a non-volatile memory such as a ROM or a rewritable non-volatile memory such as an EEPROM.

[2.3] Operation of Charging/Data Transfer

The operation of charging/data transfer in the station 100 and the electronic watch 200A will now be described with reference to flowcharts of FIGS. 18 and 12 in addition to the block diagrams of FIGS. 3 and 16.

First, the user places the electronic watch 200A in the recess 101 of the station 100. The station side coil 110 and the watch side coil 210 are thereby positioned to face each other as shown in FIG. 2, resulting in an electromagnetically coupled state.

Then, when the charging start button $103_1$ or the transfer start button $103_2$ is depressed by the user, the timer A 141 and the timer B 142 start the counting operation with the pulse signal STR (step S101). Also, with the pulse signal STR, the charging/transfer selector 170 outputs, as the signal e, the first charging signal as shown in FIG. 4(a) (step S102).

Next, whether the timer A 141 has ended the counting operation is determined in accordance with an inverted signal of the signal α (step S103). If the counting operation is ended, this means that 10 hours or more has lapsed from the depression of the charging start button $103_1$ or the transfer start button $103_2$.

Because, as described above, the setting time of the timer A 141 is selected to a period sufficient for charging the secondary battery 220 to a recharge rate corresponding to the fully charged state, the charging should be usually ended before the lapse of the setting time of the timer A 141, upon receiving the command com 3 indicating the fully charged state. The lapse of the setting time of the timer A 141 in spite of the above fact therefore means that there occurs any abnormality such as a failure of the secondary battery 220.

Accordingly, the processing circuit 130 renders the display unit 104 to display a message as shown in FIG. 13(c), for example, thus informing the user of such a condition (step S104). Also, since the signal OFF shifts to the H-level with the inverted signal of the signal a, the charging/transfer selector 170 holds the signal e at the L-level. In the event of any abnormality, therefore, the charging of the electronic watch 200A is ended.

On the other hand, if the timer A 141 has not ended the counting operation, the charging/transfer selector 170 continues to output the signal e. As a result, the station side coil 110 generates an external magnetic field with switching-over of the transistor 153 during the period in which the signal e is at the H-level, and comes into a standby state for receiving commands from the electronic watch 200A during the period in which the signal e is at the L-level.

Upon the generation of the external magnetic field, a signal is induced at the terminal P on the side of the electronic watch 200A. If the remaining charge of the secondary battery 220 is not enough at present (No in step S201), the various sections are not operated and subsequent steps S201–S208 are infeasible. Therefore, no commands are delivered to the side of the station 100.

Conversely, if the remaining charge of the secondary battery 220 is enough at present (Yes in step S201), the charging current based on the induced signal is detected in accordance with a voltage drop of the potential at the terminal P during the period in which the signal CKT is at the H-level, i.e., during the period in which the transistor 253 is turned on (step S202). The battery voltage detecting circuit 265' detects the battery voltage of the secondary battery 220 and outputs a detected voltage signal VDET corresponding to the detected battery voltage to both the charging current determining circuit 263' and the full-charge detecting circuit 290 (step S209).

Then, the charging current determining circuit 263' refers to the threshold table to obtain the threshold current corresponding to the detected voltage signal VDET, and determines whether the detected charging current is not less than the threshold current (step S203).

More concretely, when the voltage of the secondary battery 220 corresponding to the detected voltage signal VDET is 3.6 [V], the threshold current=12 [mA] is resulted. Therefore, the charging current determining circuit 263' determines whether the detected charging current is not less than 12 [mA].

If the charging current is less than the threshold, this corresponds to the case of the signal com 2 having the H-level; namely, this represents, as described above, a condition that the station side coil 110 and the watch side coil 210 are offset in position. Therefore, the control circuit 230 displays the position offset on the display unit 204 (step S204), and delivers the command com 2 for informing such a condition to the station 100 (step S205).

More concretely, as shown in FIG. 19, when the detected charging current is 8 [mA], this means that an offset of approximately 1.5 [mm] is detected.

On the other hand, if the charging current is not less than the threshold, the full-charge detecting circuit 290 determines in accordance with the detected voltage signal VDET whether the secondary battery 220 is in the fully charged state (step S206).

If the fully charged state is determined, this corresponds to the case of the signal com 3 having the H-level; namely, this represents, as described above, a condition that the charging is no more required. Therefore, the control circuit 230 delivers the command com 3 for informing such a condition to the station 100 (step S207).

If the fully charged state is not determined, this corresponds to the case of the signal com 1 having the H-level; namely, this represents, as described above, a condition that the station side coil 110 and the watch side coil 210 are opposed to each other in proper positions, and that the charging proceeds satisfactorily. Therefore, the control circuit 230 delivers the command com 1 for informing such a condition to the station 100 (step S208).

Note that the commands com 1–com 3 are delivered during the period in which no signal is induced at the terminal P; i.e., during the period of 10 seconds in which the signal e is at the L-level on the side of the station 100, and during the period in which the signal CHR is at the L-level on the side of the electronic watch 200A.

In this way, when a signal is induced at the terminal P on the side of the electronic watch 200A, the magnitude of the charging current and the state of charging of the secondary battery 220 are determined, and any of the commands com 1–com 3 corresponding to the determined state is delivered to the station 100.

Thus, in the second embodiment, when the station side coil 110 and the watch side coil 210 are not correctly opposed to each other and are offset in position, the position offset is detected and a warning indicating such a condition is displayed.

[2.4] Advantages of Second Embodiment

With the second embodiment, as described above, when the station side coil 110 and the watch side coil 210 are not correctly opposed to each other and are offset in position, the position offset is detected and a warning indicating such a condition is displayed without being affected by the voltage of the secondary battery 220 as with the first embodiment.

Also, in the condition that the station side coil 110 and the watch side coil 210 are opposed to each other in proper positions, the frequency of receiving the command to check the state of charging is lowered, whereas the charging period is prolonged to increase the charging efficiency of the electronic watch 200A.

When the start of charging or data transfer is instructed in spite of the electronic watch 200A being not placed in the station 100, the absence of the electronic watch 200A is detected, whereupon a warning indicating such a condition is displayed and the charging is ended. Consequently, useless consumption of power is prevented.

According to this second embodiment, therefore, the position offset between the station side coil 110 and the watch side coil 210, and the condition of the electronic watch 200A being not placed in the station 100 can be detected in a non-contact manner without being affected by the battery voltage of the secondary battery. Further, the charging and the data transfer can be controlled depending on a detected result.

[3] Third Embodiment

A third embodiment of the present invention will now be described.

[3.1] Premise

A manner of deciding the charging time in this third embodiment will be briefly described prior to a detailed description.

First, FIG. 29 is a graph showing a charge/discharge characteristic of a general secondary battery. As shown in FIG. 29, the terminal voltage of the secondary battery is substantially constant in the charge mode. Further, as mentioned above, the terminal voltage of the secondary battery in the charge mode does not represent a true value.

That point is described with reference to FIG. 31. Generally, because a secondary battery has an internal resistance Re, a voltage Evc resulted from adding the product of the internal resistance Re of the secondary battery and a charging current Ei to a true voltage Evd of the secondary battery is detected in the charge mode.

Consider here that the secondary battery is charged with a constant voltage E. In this case, the charging current Ei is expressed by the following formula:

$$Ei=(E-Evc)/R$$

In the above formula, R represents a resistance in charging at the constant voltage.

As the charging of the secondary battery proceeds, the terminal voltage Evc of the secondary battery approaches E and the charging current Ei decreases gradually. Correspondingly, a voltage rise of the secondary battery expressed by the product of the internal resistance Re and the charging current Ei upon shift from the discharge mode to the charge mode (or a voltage drop thereof, taking note of shift from the charge mode to the discharge mode) also reduces.

Accordingly, the recharge rate of the secondary battery being charged can be estimated by detecting such a voltage rise of the secondary battery. The voltage rise of the secondary battery used for the estimation is detected by executing the charging in an intermittent manner, and subtracting the voltage of the secondary battery after the lapse of a certain time from interrupt of the charging from the voltage of the secondary battery in the charge mode.

On the contrary, consider the case in which the secondary battery is discharged at a constant rate by connecting 1 kΩ across opposite terminals of the secondary battery, i.e., the discharge characteristic in FIG. 29. When the battery charge is reduced in such a manner, the terminal voltage of the secondary battery is lowers almost linearly as shown. It is hence understood that the recharge rate of the secondary battery corresponds to the terminal voltage thereof in the discharge mode.

Accordingly, a recharge rate F of the secondary battery can be expressed by a function F(v) including the terminal voltage v as a variable.

Thus, the recharge rate of the secondary battery at that time can be estimated by expressing the function F(v) in the form of a table or a numerical formula beforehand, executing the charging in an intermittent manner, and then putting a terminal voltage value Ev during interrupt of the charging in the function F(v).

[3.2] Electronic Watch

An electrical construction of an electronic watch 200B of the third embodiment will now be described. FIG. 20 is a block diagram showing the electrical construction. Similar components in FIG. 20 to those of the first embodiment shown in FIG. 9 are denoted by the same numerals.

As shown in FIG. 20, one terminal P of a watch side coil 210 is connected to a positive side terminal of a secondary battery 220 through a diode 245, and the other terminal of the watch side coil 210 is connected to a negative-side terminal of the secondary battery 220. With this arrangement, when a pulse signal is applied to a station side coil 110 (see FIG. 3) to generate an external magnetic field, a signal is induced at the one terminal P of the watch side coil 210 due to the external magnetic field. The induced signal is rectified by the diode 245 and then charged into the secondary battery 220. A voltage Vcc of the secondary battery 220 is employed as a power source for various sections in the electronic watch 200B.

A charging period detecting circuit 261 detects whether a signal is induced at the terminal P due to the external magnetic field. When a signal is induced at the terminal P with certain intervals after the time To as shown in FIG. 21(a), the charging period detecting circuit 261 outputs a signal CHR having an H-level as shown in FIG. 21(b). Also, a battery voltage detecting circuit 281 detects a voltage value Ev across opposite terminals of the secondary battery 220, and then outputs the voltage value Ev as a digital value.

A register 282 temporarily stores the voltage value Ev detected by the battery voltage detecting circuit 281 upon falling of the signal CHR. Thus, the register 282 stores the voltage value Evc of the secondary battery 220 during the period in which the signal is induced at the terminal P, i.e., during the charging period.

A register 283 temporarily stores the voltage value Ev detected by the battery voltage detecting circuit 281 upon rising of the signal CHR. Thus, the register 283 stores the voltage value Evd of the secondary battery 220 immediately before the signal is induced at the terminal P, i.e., at the time after the lapse of 10 seconds from interrupt of the charging.

Then, a subtracter 284 subtracts an input value to an input terminal B from an input value to an input terminal A. Here, the value temporarily stored in the register 282 is supplied to the input terminal A of the subtracter 284, and the value temporarily stored in the register 283 is supplied to the input terminal B thereof. Therefore, the subtracter 284 outputs a voltage rise ΔEv attributable to the internal resistance of the secondary battery.

A conversion table 285 converts ΔEv into the battery recharge rate F and outputs a converted result. The correlation between ΔEv and the battery recharge rate F is as shown in FIG. 23. As described above and as also shown in FIG. 22, as the charging of the secondary battery proceeds, the voltage rise ΔEv of the secondary battery upon shift from the discharge mode to the charge mode (or the voltage drop thereof upon shift from the charge mode to the discharge mode) reduces gradually. Accordingly, a smaller value of ΔEv indicates a larger recharge rate of the secondary battery.

Note that the correlation shown in FIG. 23 represents a property inherently determined corresponding to a characteristic of the secondary battery 220.

Next, a control circuit 230 is one kind of central processing/control unit including a temporarily storing memory, an arithmetic unit, etc., and in a usual condition, it executes control of rendering a display unit 204 to display data (e.g., the current time of day) corresponding to a mode set through an input unit 203.

When a signal is induced at the terminal P and the signal CHR shifts to the H-level with the electronic watch 200B placed in the station 100, the control circuit 230 operates as follows. First, the control circuit 230 determines whether the recharge rate F converted by and outputted from the conversion table 285 corresponds to the fully charged state. Secondly, the control circuit 230 creates any of the commands com 1–com 3 corresponding to a determined result, and delivers it during the period in which the signal CHR is at the L-level. Thirdly, if the transfer start button 103$_2$ is depressed, the control circuit 230 executes processing to output digital data, which is to be transmitted to the station 100, after delivering the commands.

As the digital data to be transmitted to the station 100, for example, information of the living body such as a pulse rate or a heart rate measured by a sensor or the like (not shown) is conceivable.

A transmitting circuit 250 converts the data, commands, etc., which are to be transmitted to the station 100, into the serial form, and during the period in which the serial data is at the L-level, it outputs a switching signal as a burst signal of certain frequency. The switching signal from the transmitting circuit 250 is supplied to a base of a transistor 252 through a resistance 251. The transistor 252 has an emitter connected to the positive-side terminal of the secondary battery 220, and has a collector connected to the one terminal P of the coil 210.

Accordingly, in the electronic watch 200B thus constructed, when a signal is induced at the terminal P as shown in FIG. 21(a), the signal CHR takes the H-level during the period in which the signal is induced at the terminal P, as shown in FIG. 21(b), and the secondary battery 220 is charged during that period as shown in FIG. 21(c). On the other hand, when no signal is induced at the terminal P and the signal CHR takes the L-level, the commands com 1, com 3, the digital data, etc. are transmitted as shown in FIG. 10(d).

<Operation of Charging/Data Transfer>

The operation of charging/data transfer in the station 100 and the electronic watch 200B will now be described with reference to flowcharts of FIGS. 24 and 25 in addition to the block diagrams of FIGS. 3 and 20.

First, the user places the electronic watch 200B in the recess 101 of the station 100. The station side coil 110 and the watch side coil 210 are thereby positioned to face each other as shown in FIG. 2, resulting in an electromagnetically coupled state.

Then, when the charging start button $103_1$ or the transfer start button $103_2$ is depressed by the user, the timer A 141 and the timer B 142 start the counting operation with the pulse signal STR (step S101). Also, with the pulse signal STR, the charging/transfer selector 170 outputs, as the signal e, the first charging signal as shown in FIG. 4(a) (step S102).

Next, whether the timer A 141 has ended the counting operation is determined in accordance with an inverted signal of the signal α (step S103). If the counting operation is ended, this means that 10 hours or more has lapsed from the depression of the charging start button $103_1$ or the transfer start button $103_2$. Accordingly, the processing circuit 130 renders the display unit 104 to display a message as shown in FIG. 26(b), for example, (step S104). Also, since the signal OFF shifts to the H-level with the inverted signal of the signal α, the charging/transfer selector 170 holds the signal e at the L-level. The charging of the electronic watch 200B is thereby ended.

On the other hand, if the timer A 141 has not ended the counting operation, the charging/transfer selector 170 continuously outputs the signal e. As a result, the station side coil 110 generates an external magnetic field with switching-over of the transistor 153 during the period in which the signal e is at the H-level, and comes into a standby state for receiving commands from the electronic watch 200B during the period in which the signal e is at the L-level.

Upon the generation of the external magnetic field, a signal is induced at the terminal P on the side of the electronic watch 200B. If the remaining charge of the secondary battery 220 is not enough at present (No in step S201), the various sections are not operated and subsequent steps S201–S208 are infeasible. Therefore, no commands are delivered to the side of the station 100.

Conversely, if the remaining charge of the secondary battery 220 is enough at present (Yes in step S201), the voltage value Evc in the charge mode is temporarily stored in the register 282 (step S202), and the voltage value Evd during interrupt of the charging is temporarily stored in the register 283 (step S203). Then, the subtracter 284 reads the voltage value Evc and the voltage value Evd stored in the respective registers, and subtracts the latter from the former, followed by outputting the voltage rise ΔEv attributable to the internal resistance of the secondary battery 220 (step S204).

Next, the conversion table 285 converts the voltage rise ΔEv into the battery recharge rate F and outputs a converted result. The recharge rate F of the secondary battery 220 at present is thus estimated from the voltage rise ΔEv (step S205).

The control circuit 230 determines whether the estimated recharge rate F corresponds to a predetermined value, e.g., the fully charged state (step S206). If the determination result in step S206 is Yes, the charging is no more required. Therefore, the control circuit 230 delivers the command com 3 for informing such a condition to the station 100 (step S207). If the determination result in step S206 is No, the charging is required to be continued in succession. Therefore, the control circuit 230 delivers the command com 1 for informing such a condition to the station 100 (step S208).

Note that the command com 1 or com 3 is delivered during the period in which no signal is induced at the terminal P; i.e., during the period of 10 seconds in which the signal e is at the L-level on the side of the station 100, and during the period in which the signal CHR is at the L-level on the side of the electronic watch 200B.

Thus, when the signal is induced at the terminal P, the electronic watch 200B first detects the voltage value Evc of the secondary battery 220 in the charge mode and the voltage value Evd of the secondary battery 220 during interrupt of the charging, secondly subtracts the latter from the former to determine the voltage rise ΔEv attributable to the internal resistance of the secondary battery 220, thirdly estimates the battery recharge rate from the voltage rise ΔEv, and fourthly determines whether the estimated recharge rate F corresponds to the predetermined value, followed by delivering the command depededing on the determination result.

Meanwhile, the station 100 executes the charging in accordance with the first charging signal at least during the operating period of the timer B 142, i.e., during a period of 30 minutes. Therefore, even if the secondary battery 220 is not initially in the data transfer enable state and the command com 1 or com 3 is not delivered from the electronic watch 200B, the secondary battery 220 is charged to a recharge rate enough for data transfer as a result of the charging for 30 minutes.

Stated otherwise, upon the lapse of 30 minutes after the electronic watch 200B has been placed in the station 100 and the charging start button $103_1$ or the transfer start button $103_2$ has been depressed, the secondary battery 220 is brought into the data transfer enable state and any command com 1 or com 3 is delivered.

Accordingly, the case in which no commands are delivered to the station 100 represents a condition that the electronic watch 200B is not placed in the station 100.

In the station 100 coming into the standby state, it is determined whether any command com 1 or com 3 is received from the electronic watch 200B (step S111). If any of the commands com 1 and com 3 is not received, it is determined whether the timer B 142 has ended the counting operation (step S112). Concretely, the command detector 160 checks whether the signal c has turned to the H-level during the period of 30 minutes in which the signal b is at the H-level.

The case in which any of the commands com 1 and com 3 is not received even after the timer B 142 has ended the counting operation represents, as described above, a condition that the electronic watch 200B is not placed in the station 100 and the signal d from the command detector 160 takes the H-level.

Upon the shift of the signal d to the H-level, therefore, the processing circuit 130 renders the display unit 104 to display a warning message as shown in FIG. 26(a) (step S113), for example, thereby informing the user of such a condition.

Also, since the signal OFF shifts to the H-level with the signal d, the charging/transfer selector 170 holds the signal e at the L-level. As a result, the useless charging operation in the condition of the electronic watch 200 being not placed in the station 100 is ended.

Conversely, if the timer B 142 has not ended the counting operation, the processing sequence returns to step S102 to continue the outputting of the first charging signal for executing the charging in succession.

If any command is received from the electronic watch 200B by the station 100 being in the standby state, the received command is decoded by the decoder 155 (step S114).

If the received command is com 1, it is determined whether the initially depressed button is the charging start button $103_1$ (step S115). More specifically, it is determined whether the charging/transfer selector 170 supplied with the signal com 1 has previously received the signal CS. If the determination result is Yes, the charging/transfer selector 170 switches over the delivered signal e from the first charging signal shown in FIG. 4(*a*) to the second charging signal shown in FIG. 4(*b*). Then, the processing sequence returns to step S103 to continue the charging in succession.

As described above, the charging is performed during the period in which the signal e is at the H-level, while the data transfer is performed during the period in which the signal e is at the L-level. Also, the period during which the signal e serving as the second charging signal is at the H-level is longer than the period during which the signal e serving as the first charging signal is at the H-level. With the delivery of the second charging signal, therefore, the frequency of receiving the command that is a result from checking whether the charging time t has lapsed, whereas the charging period is prolonged to increase the charging efficiency of the electronic watch 200B.

On the other hand, if the received command is com 1 and the initially depressed button is the transfer start button 103$_2$, the data transfer is executed through steps S121 to S123 described later.

Also, if the received command is com 3, it is determined whether the initially depressed button is the charging start button 103$_1$ (step S117). More specifically, it is determined whether the charging/-transfer selector 170 supplied with the signal OFF based on the signal com 3 has previously received the signal CS. If the determination result is Yes, the secondary battery 220 requires to be no more charged, and therefore the charging/transfer selector 170 holds the signal e at the L30 level. The useless charging operation to charge the secondary battery beyond the predetermined capacity is thereby ended.

On the other hand, if the received command is com 3 and the initially depressed button is the transfer start button 103$_2$, the data transfer is executed through the following steps S121 to S123.

More specifically, the digital data delivered subsequent to the command com 1 or com 3 is received by the receiving circuit 154, decoded by the decoder 155, and transferred to the processing circuit 130 (step S121), followed by repeating the data transfer until coming to the end (step S122). Upon completion of the data transfer, the processing circuit 130 renders the display unit 104 to display a message as shown in FIG. 26(*c*) (step S122), and also renders the display unit 104 to display information based on the received digital data.

After that, the processing circuit 130 stops the supply of the signal e to the charging/transfer selector 130 through a line not shown in FIG. 3, thereby ending the charging and the data transfer.

With this embodiment thus constructed, when the charging start button 103$_1$ or the transfer start button 103$_2$ is depressed, the signal e is outputted as the first charging signal from the station 100, and the secondary battery 220 of the electronic watch 200B is charged in an intermittent manner. During the intermittent charging, the electronic watch 200B operates to subtract the voltage value Evc of the secondary battery 220 in the charge mode from the voltage value Evd thereof during interrupt of the charging, determine the voltage rise ΔEv attributable to the internal resistance of the secondary battery 220, estimate the battery recharge rate from the voltage rise ΔEv, and determine whether the estimated battery recharge rate corresponds to the predetermined capacity.

If the estimated battery recharge rate does not reach the predetermined capacity, the command com 1 is delivered to the station 100, whereupon the second charging signal (see FIG. 4(*b*)) is employed as the signal e to switch over the charging and the data transfer, and the charging efficiency of the electronic watch 200B is increased.

If the estimated battery recharge rate reaches the predetermined value, the command com 3 is delivered to the station 100, whereupon the signal e is held at the L-level and the charging is ended.

According to this embodiment, therefore, the battery recharge rate is estimated from the voltage rise ΔEv measured by performing the charging in an intermittent manner, and the charging is ended if the estimated recharge rate reaches the desired value, e.g. a value corresponding to the fully charged state. As a result, a disadvantage of continuing useless charging can be avoided.

[4] Fourth Embodiment

A fourth embodiment of the present invention will now be described.

In the above third embodiment, the charging is executed in an intermittent manner, the voltage rise ΔEv of the secondary battery 220 upon shift from the discharge mode to the charge mode is determined, and the battery recharge rate is estimated from the voltage rise ΔEv. On the other hand, in this fourth embodiment, the battery recharge rate is estimated from the voltage value Evd, taking note of that the voltage value Evd during interrupt of the charging corresponds itself to the battery recharge rate.

To that end, the fourth embodiment is constructed such that, as shown in FIG. 27, the voltage value Evd temporarily stored in the register 283 is supplied to the control circuit 230.

The control circuit 230 in this fourth embodiment has, in addition to the functions provided in the third embodiment, a function of previously storing a function F(v), which represents the recharge rate of the secondary battery 220, in the form of a table or a numerical formula.

FIG. 28 is a flowchart showing the operation of an electronic watch 200C according to the fourth embodiment.

When the station side coil 110 generates an external magnetic field, a signal is induced at the terminal P of the watch side coil 210 on the side of the electronic watch 200C. If charge remains in the secondary battery 220 at that point, the voltage value Evd during interrupt of the charging is temporarily stored in the register 283 (step S203). Then, the control circuit 230 puts the voltage value Evd in the function F(v), which represents the recharge rate of the secondary battery 220, to obtain the recharge rate F (step S251), and determines whether the recharge rate F reaches the predetermined value, e.g. a value corresponding to the fully charged state (step S206). If the determination result is Yes, the command com 3 is delivered (step S207), whereas if the determination result is No, the command com 1 is delivered (step S208).

When the station side coil 110 generates an external magnetic field, a signal is induced at the terminal P of the watch side coil 210 on the side of the electronic watch 200C. If charge remains in the secondary battery 220 at that point, the voltage value Evd during interrupt of the charging is temporarily stored in the register 283 (step S203). Then, the control circuit 230 puts the voltage value Evd in the function F(v), which represents the recharge rate of the secondary battery 220, to obtain the recharge rate F (step S251), and determines whether the recharge rate F reaches the predetermined capacity, e.g., a capacity corresponding to the fully charged state (step S206). If the determination result is Yes, the command com 3 is delivered (step S207), whereas if the determination result is No, the command com 1 is delivered (step S208).

According to the fourth embodiment, therefore, if the battery recharge rate estimated from the voltage value Evd reaches the predetermined value, e.g., a value corresponding to the fully charged state, the charging is ended at that point. As a result, a disadvantage of continuing useless charging can be avoided as with the first embodiment.

Also, if the estimated battery recharge rate does not reach the predetermined capacity, the second charging signal (see FIG. 4(b)) is employed as the signal e and the charging efficiency of the electronic watch 200C is increased as with the first embodiment.

[5] Fifth Embodiment

A fifth embodiment of the present invention will now be described.

In the above third embodiment, the charging is executed in an intermittent manner, the voltage rise $\Delta Ev$ of the secondary battery 220 upon shift from the discharge mode (i.e., the condition of the electronic device being operated) to the charge mode is determined by subtracting the voltage at the time after the lapse of a certain time from interrupt of the charging from the voltage at the time immediately before the interrupt of the charging, and the battery recharge rate is estimated from the voltage rise $\Delta Ev$.

On the other hand, in this fifth embodiment, the charging is executed in an intermittent manner, the voltage rise $\Delta Ev$ of the secondary battery 220 upon shift from the discharge mode (i.e., the condition of the electronic device being operated) to the charge mode is determined by subtracting the voltage at the time immediately after resumption of the charging from the voltage at the time immediately before resumption of the charging, and the battery recharge rate is estimated from the voltage rise $\Delta Ev$.

As a result, this fifth embodiment can provide similar advantages to those obtainable with the above third embodiment.

[6] Sixth Embodiment

A sixth embodiment of the present invention will now be described.

In the above third embodiment, the charging is executed in an intermittent manner, the voltage rise $\Delta Ev$ of the secondary battery 220 upon shift from the discharge mode (i.e., the condition of the electronic device being operated) to the charge mode is determined by subtracting the voltage at the time after the lapse of a certain time from interrupt of the charging from the voltage at the time immediately before the interrupt of the charging, and the battery recharge rate is estimated from the voltage rise $\Delta Ev$.

On the other hand, in this sixth embodiment, taking note of that a voltage drop $\Delta Ev'$ also corresponds to the battery recharge rate, where $\Delta Ev'$ is a difference between the voltage of the secondary battery 220 at the time after the lapse of a certain time from interrupt of the charging and the voltage of the secondary battery 220 at the time immediately before resumption of the charging, the battery recharge rate is estimated from the voltage drop $\Delta Ev'$.

FIG. 32 is a block diagram showing a schematic construction of an electronic watch 200D according to the sixth embodiment. Similar components in FIG. 32 to those of the third embodiment shown in FIG. 20 are denoted by the same numerals, and the above detailed description is equally applied here. Different features between the sixth and third embodiments will be primarily described below.

In FIG. 32, a register 282 temporarily stores a voltage value Ev detected by a battery voltage detecting circuit 281 upon falling of the signal CHR (see FIG. 33). Thus, the register 282 stores a voltage value Evc' of the secondary battery 220 at the time after the lapse of a certain time (including the case in which the lapse time is zero) from the end of induction of the signal at the terminal P, i.e., at the time after the lapse of a certain time from interrupt of the charging.

A register 283 temporarily stores a voltage value Ev detected by the battery voltage detecting circuit 281 upon rising of the signal CHR. Thus, the register 283 stores a voltage value Evd' of the secondary battery 220 at the time when the signal is induced at the terminal P, i.e., at the time immediately before the start of the charging.

Then, a subtracter 284 subtracts an input value to an input terminal B from an input value to an input terminal A. Here, the value temporarily stored in the register 282 is supplied to the input terminal A of the subtracter 284, and the value temporarily stored in the register 283 is supplied to the input terminal B thereof. Therefore, the subtracter 284 outputs a voltage drop $\Delta Ev'$.

A conversion table 285 converts $\Delta Ev'$ into the battery recharge rate F and outputs a converted result. The correlation between $\Delta Ev'$ and the battery recharge rate F is as shown in FIG. 35. Also, as shown in FIG. 34, as the charging of the secondary battery proceeds, the voltage drop $\Delta Ev'$ occurred from the interrupt of the charging to the start of the charging (i.e., the voltage drop upon shift from the charge mode to the discharge mode) reduces gradually. Accordingly, a smaller value of $\Delta Ev'$ indicates a larger recharge rate of the secondary battery.

Note that the correlation shown in FIG. 35 represents a property inherently determined corresponding to a characteristic of the secondary battery 220.

According to this sixth embodiment, therefore, the battery recharge rate is estimated from the voltage drop $\Delta Ev'$ measured by performing the charging in an intermittent manner, and the charging is ended if the estimated recharge rate reaches the desired value, e.g., a value corresponding to the fully charged state. As a result, a disadvantage of continuing useless charging can be avoided.

Additionally, the timing of storing the voltage value Evd' is not limited to the time immediately before the start of the charging, and may be a certain time prior to the time immediately before the start of the charging (but after the time of sampling the voltage value Evc').

In practice, since the charging is interrupted for a certain period, the voltage value Evd' is stored after a certain time has lapsed from the start time of interrupt of the charging.

[7] Modifications of Third to Sixth Embodiments

[7.1] First Modification

The above third to sixth embodiments may be modified as follows. While in those embodiments the data transfer is performed only in one direction from the electronic watch 200 to the station 100, it is a matter of course that data may be transferred in an opposite direction from the station 100 to the electronic watch 200. When data is transferred to the electronic watch 200, the station 100 executes modulation in accordance with the data to be transferred, whereas the electronic watch 200 executes demodulation in match with the modulation scheme. In such a case, well-known techniques can be used to execute the modulation and the demodulation.

[7.2] Second Modification

In the third to sixth embodiments, the recharge rate of the secondary battery 220 is estimated on the side of the electronic watch 200 from both the detected voltage values Evd and Evc or only the detected voltage value Evd. However, the voltage values Ev and Evc themselves may be transferred to the station 100, and the recharge rate of the secondary battery 220 may be estimated on the side of the station 100 in accordance with the transferred values for thereby controlling the charging and the data transfer. Thus, the recharge rate of the secondary battery 220 can be estimated by any of the electronic watch 200 and the station 100.

[7.3] Third Modification

In the third to sixth embodiments, the voltage value detected by the single battery voltage detecting circuit 281 is employed as the voltage value Evc in the charge mode and the voltage value Evd during interrupt of the charging, respectively, depending on a difference in timing to temporarily store the voltage value. However, the voltage value Evc in the charge mode and the voltage value Evd during interrupt of the charging may be detected respectively by separate battery voltage detecting circuits. Thus, the term "first and second voltage detecting means" used in this application implies the same means in one case and separate dependent means in the other case. The arrangement of detecting the voltage value by the single battery voltage detecting circuit 281 as with the above embodiments is more advantageous is that a detection error caused by using different detecting circuits is avoided.

[7.4] Fourth Modification

In the third to sixth embodiments, the charging period is prolonged in the charge mode to change a duty ratio between the charging and the data transfer. However, the data transfer period may be shortened, or the duty periods of both the charging and the data transfer may be changed. As an alternative, the duty ratio between the charging and the data transfer may be controlled in a stepless manner.

[7.5] Fifth Modification

While the third to sixth embodiments have been described on an assumption, by way of example, that the charging device is the station 100 and the charged device is the electronic watch 200, the present invention can be applied to all types of electronic devices which require transfer of power. The present invention is applicable to any of charged devices incorporating secondary batteries, e.g., electric tooth brushes, electric shavers, cordless phones, cellular phones, personal handy phones, mobile personal computers, and PDA (Personal Digital Assistants), and a charging device for charging them.

[7.6] Sixth Modification

While the foregoing description has been made as outputting a transfer request from the electronic watch, a transfer request may be issued from the side of an information processing unit connected to the station directly or via a network.

[8] Seventh Embodiment

The above embodiments have been described in connection with the case of transferring data from the side of the electronic watch 200 to the side of the station 100. However, the electronic watch 200 may issue a transfer request for predetermined data, and the station 100 or an information processing unit connected to the station directly or via a network may transfer corresponding data (e.g., a new operating system for the electronic watch or various control data) to the electronic watch 200.

More concretely, a receiving circuit 238 is provided on the side of the electronic watch 200 as indicated by a dotted line in FIG. 9, and the electronic watch 200 transmits, to the station, transfer request data DREQ for requesting transfer of the predetermined data.

In response to the transfer request data DREQ, the station 100 transmits, to an information processing unit 300 such as a personal computer or a server connected to the station 100 directly or via a network, DREQ1 for requesting the unit 300 to transmit data DD corresponding to the transfer request data DREQ.

As a result, the information processing unit 300 transfers the requested data DD to the side of the electronic watch 200 via the station 100.

Further, as shown in FIG. 36(b), the arrangement may modified such that the transfer request data DREQ for requesting transfer of the predetermined data is transmitted to the station, and in response to DREQ, the station 100 transmits the data DD corresponding to the transfer request data DREQ.

With such a construction, predetermined data can be automatically transferred in addition to the charging operation.

INDUSTRIAL APPLICABILITY

According to the present invention, as described above, when power is transferred through electromagnetic coupling between coils disposed in opposing positions in two or more separate devices such as a portable electronic device and a charging device for the same, a position offset between both the coils and the absence of a device to be charged can be detected in a non-contact manner.

Further, by detecting a position offset between both the coils and the absence of a device to be charged in a non-contact manner, charging and data transfer can be controlled in accordance with a detection result.

Also, a recharge rate of a secondary battery under charging can be estimated with a simple construction.

In addition, even when charging of a secondary battery is made from a charging device to a charged device in a non-contact manner through electromagnetic coupling between coils disposed in opposing positions in two or more separate devices, a recharge rate of the secondary battery, etc. is informed to the charging device in a non-contact manner so that the secondary battery can be charged up to a desired value.

What is claimed is:

1. An electronic device having a first device and a second device, said electronic device comprising:

charging/signal transfer means for charging the second device by the first device from a side of the first device to a side of the second device, and for transferring a signal between said first device and said second device; and charging/signal transfer control means for starting transferring of the signal by said charging/signal transfer means after charging the second device by said charging/signal transfer means for a predetermined period.

2. An electronic device having a first device and a second device, said electronic device comprising:

charging/signal transfer means for charging the second device by the first device from a side of the first device to a side of the second device by one of electromagnetic coupling and electromagnetic induction, for transferring a signal between the first device and said second device; and charging/signal transfer control means for starting transferring of the signal by said charging/signal transfer means after charging the second device by said charging/signal transfer means for a predetermined period.

3. An electronic device according to claim 1 or 2, wherein said charging/signal transfer control means transmits, prior to the signal transfer, a communication start command for informing a start of communication.

4. An electronic device according to claim 1 or 2, wherein when said charging/signal transfer means transfers the signal, said charging/signal transfer means is operated in accordance with a driving frequency higher than a driving frequency when said charging/signal transfer means is not transferring the signal.

5. An electronic device according to claim 1 or 2, wherein said charging/signal transfer control means alternately controls charging and transferring of the signal by said charging/signal transfer means.

6. An electronic device having a first device and a second device for transferring at least one of power and signals through electromagnetic coupling or electromagnetic induction between a first coil disposed in said first device and a second coil disposed in said second device, said first and second coils being disposed in opposing positions, said electronic device comprising:
   an initiation input receiver for receiving a start signal causing said first coil to generate an external magnetic field;
   a signal generator controlling a power transfer cycle in which a power signal is transmitted through said first coil to said second device during a first phase and status data from said second device is expected during a second phase, said status data being characteristic of the amount of power stored in said second device, said signal generator responding to a lack of status data from said second device by reinitiating said power transfer cycle up to a predetermined number of power transfer cycles;
   a control circuit issuing a warning signal in response to the elapse of said predetermined number of power transfer cycles without receiving said status data from said second device.

7. The electronic device of claim 6, wherein said first and second phase have regular intervals such that said predetermined number of power transfer cycles constitute a predetermined wait period during which no status data is received from said second device without causing said control circuit to issue said warning signal.

8. An electronic device according to claim 6, further comprising a status transmission circuit effective for transmitting said status data only when the amount of power stored in said second device is above a predetermined threshold value.

9. An electronic device having a first device and a second device for transferring at least power or signals through coils, said electronic device comprising:
   a first coil disposed in said first device;
   a second coil disposed in said second device and adapted to be electromagnetically coupled with said first coil;
   a signal supply circuit to supply a signal to said first coil to generate an external magnetic field;
   a current detecting circuit to detect a current flowing through said second coil in accordance with said external magnetic field;
   an interrogator circuit disposed in said first device and transmitting an query signal requesting status information of said current flow in said second coil, said current detecting circuit responding to said query signal only when the value of said current flow is above a predetermined threshold value; and
   a position determining circuit to determine a positional relationship between said first and second coils based on the number of query signals transmitted without a corresponding response from said current detecting circuit.

10. An electronic device for transferring at least power or signals to a partner device through electromagnetic coupling or electromagnetic induction between a first coil disposed in said electronic device and a second coil disposed in the partner device, the first and second coils being disposed in opposing positions, said electronic device comprising:
    signal supply means for supplying a signal to the first coil;
    position determining means for determining a positional relationship between the first and second coils upon receiving a command from said partner device after said signal supply means has supplied the signal to the first coil; and
    informing means for informing the positional relationship determined by said position determining means, wherein when said position determining means does not receive the command from the partner device for a certain period, said informing means informs an absence of said partner device.

11. An electronic device according to claim 10, wherein when the positional relationship between the first and second coils is determined to be in predetermined relation by said position determining means, said informing means informs the determination result.

12. An electronic device according to claim 10, wherein the first coil disposed comprises an air-core type coil.

13. A position detecting method for an electronic device having a first device and a second device for transferring at least power or signals through electromagnetic coupling or electromagnetic induction between a first coil disposed in the first device and a second coil disposed in the second device, said first and second coils being disposed in opposing positions, said method comprising the steps of:
    supplying a signal to said first coil in said first device to generate an external magnetic field;
    submitting status requests for information of a current flow through said second coil;
    detecting said current flowing through said second coil in said second device in accordance with said external magnetic field and responding to said status requests only when said current flow is above a predetermined threshold;
    determining a positional relationship between the first and second coils in accordance with the response and lack of response to said status requests.

14. An electronic device having a first device and a second device for transferring at least power or signals through electromagnetic coupling or electromagnetic induction between a first coil disposed in the first device and a second coil disposed in the second device, the first and second coils being disposed in opposing positions, said electronic device comprising:
    signal supply means for supplying a first signal to the first coil to generate an external magnetic field;
    state detecting means for detecting an electrical state of said second coil in accordance with the external magnetic field;
    control means for controlling said first signal supplied by said signal supply means in accordance with a result detected by said state detecting means;
    signal transfer means for transferring a second signal between the first and second devices, wherein said signal transfer means transfers the second signal after said signal supply means has supplied the first signal for a predetermined period;
    rectifying means for rectifying a power signal flowing through the second coil; and
    electricity accumulating means for accumulating the power signal rectified by said rectifying means.

15. An electronic device according to claim 6 or 14, wherein the electrical state is a current state or a voltage state.

16. An electronic device according to claim 6, further comprising:
signal transfer means for transferring a signal between the first and second devices;
rectifying means for rectifying a signal flowing through the second coil; and
electricity accumulating means for accumulating the signal rectified by said rectifying means.

17. An electronic device according to claim 14, wherein said signal transfer means transfers the second signal after a communication start command for informing the start of communication has been transmitted.

18. An electronic device according to claim 14, wherein when transferring the second signal between the first and second devices, operation is performed in accordance with a higher frequency than a frequency when not transferring the second signal.

19. An electronic device having a first device and a second device for transferring at least power or signals through electromagnetic coupling or electromagnetic induction between a first coil disposed in the first device and a second coil disposed in the second device, the first and second coils being disposed in opposing positions, said electronic device comprising:
signal supply means for supplying a first signal to the first coil to generate an external magnetic field;
state detecting means for detecting an electrical state of said second coil in accordance with the external magnetic field;
control means for controlling said first signal supplied by said signal supply means in accordance with a result detected by said state detecting means;
signal transfer means for transferring a second signal between the first and second devices;
rectifying means for rectifying a power signal flowing through the second coil; and
electricity accumulating means for accumulating the power signal rectified by said rectifying means;
wherein said control means alternately controls execution of the first signal supplied by said signal supply means and the second signal transferred by said signal transfer means.

20. An electronic device having a first device and a second device for transferring at least power or signals through electromagnetic coupling or electromagnetic induction between a first coil disposed in the first device and a second coil disposed in the second device, the first and second coils being disposed in opposing positions, said electronic device comprising:
signal supply means for supplying a first signal to the first coil to generate an external magnetic field;
state detecting means for detecting an electrical state of said second coil in accordance with the external magnetic field;
control means for controlling said first signal supplied by said signal supply means in accordance with a result detected by said state detecting means;
signal transfer means for transferring a second signal between the first and second devices;
rectifying means for rectifying a power signal flowing through the second coil; and
electricity accumulating means for accumulating the power signal rectified by said rectifying means;
wherein when the positional relationship between the first and second coils is determined to be in a predetermined relation, said control means changes a duty ratio between the signal supplied by said signal supply means and the signal transferred by said signal transfer means.

21. An electronic device according to claim 14, wherein a result detected by said current detecting means is transferred by said signal transfer means.

22. An electronic device according to claim 6 or 14, wherein the second device comprises a portable type device.

23. An electronic device according to claim 6 or 14, wherein the first or second coil comprises an air-core type coil.

24. An electronic device for transferring at least power or signals to a partner device through electromagnetic coupling or electromagnetic induction between a first coil disposed in said electronic device and a second coil disposed in the partner device, the first and second coils being disposed in opposing positions, said electronic device comprising:
signal supply means for supplying a signal to the first coil; and
control means for controlling the signal supplied by said signal supply means upon receiving a command from the partner device after said signal supply means has supplied the signal to the first coil;
wherein upon receiving no commands from the partner device for a predetermined period, said control means terminates the signal supplied by said signal supply means.

25. An electronic device according to claim 24, wherein upon receiving, from the partner device, a command informing that the charging is not required, said control means terminates the signal supplied by said signal supply means.

26. An electronic device according to claim 24, wherein when the communication start command is transmitted from the partner device, said signal transfer means transfers the signal.

27. An electronic device comprising:
charging means for charging a secondary battery in an intermittent manner;
first voltage detecting means for detecting a voltage of the secondary battery after a predetermined time has lapsed from interruption of the charging by said charging means; and
estimating means for estimating a recharge rate of the secondary battery in accordance with the voltage detected by said voltage detecting means.

28. An electronic device according to claim 27, further comprising second voltage detecting means for detecting a voltage of said secondary battery during the charging by said charging means; and
subtracting means for subtracting the voltage detected by said first voltage detecting means from the voltage detected by said second voltage detecting means;
said estimating means estimating a recharge rate of the secondary battery from a voltage difference calculated by said subtracting means.

29. An electronic device according to claim 28, further comprising determining means for determining whether the recharge rate estimated by said estimating means reaches to a predetermined value.

30. An electronic device according to claim 29, wherein if the recharge rate reaches the predetermined value as determined by said determining means, said charging means terminates charging by said charging means.

31. An electronic device comprising:
  a charging circuit to charge a secondary battery in an intermittent manner;
  a voltage detecting circuit to detect a voltage of the secondary battery after a predetermined time has lapsed from interrupting of the charging by said charging circuit; and
  an estimating circuit to estimate a recharge rate of the secondary battery in accordance with the voltage detected by said voltage detecting circuit.

32. A recharge-rate estimating method for a secondary battery, comprising the steps of:
  (a) charging the secondary battery in an intermittent manner;
  (b) interrupting the charging of the secondary battery in step (a);
  (c) detecting a voltage of the secondary battery after a certain time has lapsed from the interruption of the charging in step (b); and
  (d) estimating a recharge rate of the secondary battery in accordance with the detected voltage in step (c).

33. An electronic device in which a charging device transfers power to a charged device through electromagnetic coupling or electromagnetic induction between a first coil disposed in said electronic device and a second coil disposed in the charged device, the first and second coils being disposed in opposing positions and the charged device charges the transferred power into a secondary battery in an intermittent manner, said electronic device comprising:
  first voltage detecting means for detecting a voltage of the secondary battery after a predetermined time has lapsed from interruption of the charging;
  transfer means for transferring the voltage detected by said first voltage detecting means or an estimated result based on the voltage detected by said first voltage detecting means through the first and second coils; and
  control means for controlling the charging of the secondary battery in accordance with a result transferred by said transfer means.

34. An electronic device according to claim 33, wherein said control means alternately controls the charging by said charging means and transferring of the signal by said signal transfer means, and also controls a duty ratio between the charging by said charging means and the signal transferred by said signal transfer means in accordance with the result transferred by said transfer means.

35. An electronic device according to claim 33, wherein the charged device comprises a portable type device.

36. An electronic device according to claim 33, wherein the first or second coil comprises an air-core type coil.

37. An electronic system in which a charging device transfers power to a charged device through electromagnetic coupling or electromagnetic induction between a first coil disposed in said charging device and a second coil disposed in said charged device, said first and second coils being disposed in opposing positions and said charged device applying the transferred power to a secondary battery in an intermittent manner, said electronic system comprising:
  a first voltage detecting circuit for detecting a voltage of the secondary battery after a predetermined time has lapsed from interruption of the charging, said predetermined time being selected such that the detected voltage includes a voltage sub-component due to the internal resistance of said secondary battery;
  a transfer circuit for transferring the voltage detected by said first voltage detecting circuit or an estimated result based on the voltage detected by said first voltage detecting means through said first and second coils; and
  a control circuit for controlling the charging in accordance with said voltage sub-component due to the internal resistance of said secondary battery.

38. A charging control method for an electronic system in which a charging device transfers power to a charged device through electromagnetic coupling or electromagnetic induction between a first coil disposed in said electronic device and a second coil disposed in said charged device, said first and second coils being disposed in opposing positions and said charged device stores the transferred power into a secondary battery, said method comprising the steps of:
  (a) interrupting the charging of said secondary battery;
  (b) detecting a voltage of said secondary battery after a predetermined time has lapsed from the interruption of the charging in step (a), said predetermined time being selected such that the detected voltage includes a voltage sub-component due to the internal resistance of said secondary battery;
  (c) transferring the detected voltage in step (b) or an estimated result based on the detected voltage in step (b) through the first and second coils; and
  (d) controlling the charging of the secondary battery in accordance with said voltage sub-component due to the internal resistance of said secondary battery.

39. An electronic device comprising:
  charging means for charging a secondary battery in an intermittent manner;
  first voltage detecting means for detecting a first voltage of the secondary battery at a time immediately after interrupting of charging by said charging means;
  second voltage detecting means for detecting a second voltage of the secondary battery at a time immediately before resumption of charging by said charging means after interrupting of charging by said charging means; and
  estimating means for estimating a recharge rate of the secondary battery in accordance with a voltage difference between the first voltage of the secondary battery detected by said first voltage detecting means and the voltage of said secondary battery detected by said second voltage detecting means.

40. An electronic device comprising:
  a charging circuit to charge a secondary battery in an intermittent manner;
  a first voltage detecting circuit to detect a first voltage of the secondary battery at a time immediately after interrupting of charging by said charging circuit;
  a second voltage detecting circuit to detect a second voltage of the secondary battery at a time immediately before resumption of charging by said charging circuit after interrupting of charging by said charging circuit; and
  an estimating circuit to estimate a recharge rate of the secondary battery in accordance with a voltage difference between the first voltage of said secondary battery detected by said first voltage detecting circuit and the second voltage of said secondary battery detected by said second voltage detecting circuit.

41. A recharge-rate estimating method for an electronic device, comprising the steps of:
  (a) charging a secondary battery;

(b) interrupting the charging of the secondary battery in step (a);

(c) resuming the charging of the secondary battery after step (b);

(d) detecting an interruption voltage provided as a voltage of the secondary battery at the time immediately after interruption of the charging in step (b);

(e) detecting a resumption voltage of the secondary battery at the time immediately before resumption of the charging in step (c); and (f) estimating a recharge rate of the secondary battery in accordance with a voltage difference between the interruption voltage and resumption voltage.

42. An electronic device comprising:

charging means for charging a secondary battery in an intermittent manner;

first voltage detecting means for detecting a first voltage of the secondary battery at a time immediately before resumption of charging by said charging means after interruption of charging by said charging means;

second voltage detecting means for detecting a second voltage of the secondary battery at a time immediately after resumption of the charging by said charging means; and estimating means for estimating a recharge rate of the secondary battery in accordance with a voltage difference between the first voltage of the secondary battery detected by said first voltage detecting means and the second voltage of the secondary battery detected by said second voltage detecting means.

43. An electronic device comprising:

a charging circuit to charge a secondary battery in an intermittent manner;

a first voltage detecting circuit to detect a first voltage of the secondary battery at a time immediately before resumption of charging by said charging circuit after interruption of charging by said charging circuit;

a second voltage detecting circuit to detect a second voltage of the secondary battery at a time immediately after resumption of the charging by said charging circuit; and an estimating circuit to estimate a recharge rate of the secondary battery in accordance with a voltage difference between the first voltage of said secondary battery detected by said first voltage detecting circuit and the second voltage of said secondary battery detected by said second voltage detecting circuit.

44. A recharge-rate estimating method for an electronic device, comprising the steps of:

(a) charging a secondary battery;

(b) interrupting the charging of the secondary battery of step (a);

(c) resuming the charging of the secondary battery after step (b);

(d) detecting a just-before-resumption voltage of the secondary battery at a time immediately before resumption of the charging of step (c);

(e) detecting a just-after-resumption voltage of the secondary battery at the time immediately after resumption of the charging of step (c); and (f) estimating a recharge rate of the secondary battery in accordance with a voltage difference between the just-before-resumption voltage detected in step (d) and the just-after-resumption voltage detected in step (e).

45. An electronic device having a first device and a second device, said electronic device comprising:

a charge/signal transfer circuit for charging of the second device by the first device from a side of the first device to a side of the second device, and for transferring a signal between said first device and said second device; and a charge/signal transfer controller for starting the transfer of said signal by said charge/signal transfer circuit after charging of the second device by said charge/signal transfer circuit for a predetermined period.

46. An electronic device having a first device and a second device, said electronic device comprising:

a charge/signal transfer circuit for charging of the second device by the first device from a side of the first device to a side of the second device by one of electromagnetic coupling and electromagnetic induction, and for transferring a signal between the first device and said second device; and a charge/signal transfer controller for starting transfer of said signal by said charge/signal transfer circuit after charging of the second device by said charge/signal transfer circuit for a predetermined period.

47. An electronic device for transferring at least power or signals to a partner device through electromagnetic coupling or electromagnetic induction between a first coil disposed in said electronic device and a second coil disposed in the partner device, the first and second coils being disposed in opposing positions, said electronic device comprising:

a signal source for supplying a signal to the first coil;

a position detector for determining a positional relationship between the first and second coils upon receiving a command from said partner device after said signal source has supplied the signal to the first coil; and a status transmitter for conveying the positional relationship determined by said position detector, wherein when said position detector does not receive the command from the partner device for a certain period, said status transmitter conveys an absence of said partner device.

48. An electronic device having a first device and a second device for transferring at least power or signals through electromagnetic coupling or electromagnetic induction between a first coil disposed in the first device and a second coil disposed in the second device, the first and second coils being disposed in opposing positions, said electronic device comprising:

a signal source for supplying a first signal to the first coil to generate an external magnetic field;

a state detector for detecting an electrical state of said second coil in accordance with the external magnetic field;

a controller for controlling said first signal supplied by said signal source in accordance with a result detected by said state detector;

a signal transmitter for transferring a second signal between the first and second devices, wherein said signal transmitter transfers the second signal after said signal source has supplied the first signal for a predetermined period;

a rectifier for rectifying a power signal flowing through the second coil; and an electricity accumulating sub-circuit for accumulating the power signal rectified by said rectifier.

49. An electronic device having a first device and a second device for transferring at least power or signals through electromagnetic coupling or electromagnetic induction between a first coil disposed in the first device and a second coil disposed in the second device, the first and second coils being disposed in opposing positions, said electronic device comprising:
- a signal source for supplying a first signal to the first coil to generate an external magnetic field;
- a state detector for detecting an electrical state of said second coil in accordance with the external magnetic field;
- a controller for controlling said first signal supplied by said signal source in accordance with a result detected by said state detector;
- a signal transmitter for transferring a second signal between the first and second devices;
- a rectifier for rectifying a power signal flowing through the second coil; and
- an electricity accumulating sub-circuit for accumulating the power signal rectified by said rectifier;
- wherein said controller alternately controls execution of the first signal supplied by said signal source and the second signal transferred by said signal transmitter.

50. An electronic device having a first device and a second device for transferring at least power or signals through electromagnetic coupling or electromagnetic induction between a first coil disposed in the first device and a second coil disposed in the second device, the first and second coils being disposed in opposing positions, said electronic device comprising:
- a signal source for supplying a first signal to the first coil to generate an external magnetic field;
- a state detector for detecting an electrical state of said second coil in accordance with the external magnetic field;
- a signal controller for controlling said first signal supplied by said signal supply means in accordance with a result detected by said state detector;
- a signal transmitter for transferring a second signal between the first and second devices;
- a rectifier for rectifying a power signal flowing through the second coil; and
- an electricity accumulating sub-circuit for accumulating the power signal rectified by said rectifier;
- wherein when the positional relationship between the first and second coils is determined to be in a predetermined relation, said controller changes a duty ratio between the signal supplied by said signal source and the signal transferred by said signal transmitter.

51. An electronic device for transferring at least power or signals to a partner device through electromagnetic coupling or electromagnetic induction between a first coil disposed in said electronic device and a second coil disposed in the partner device, the first and second coils being disposed in opposing positions, said electronic device comprising:
- a signal source for supplying a signal to the first coil; and
- a controller for controlling the signal supplied by said signal source upon receiving a command from the partner device after said signal source has supplied the signal to the first coil;
- wherein upon receiving no commands from the partner device for a predetermined period, said controller terminates the signal supplied by said signal source.

52. An electronic device comprising:
- a charger for charging a secondary battery in an intermittent manner;
- a first voltage detector for detecting a voltage of the secondary battery after a predetermined time has lapsed from interruption of the charging by said charging means; and
- a rate determining circuit for determining an expected recharge rate of the secondary battery in accordance with the voltage detected by said voltage detecting means.

53. An electronic device in which a charging device transfers power to a charged device through electromagnetic coupling or electromagnetic induction between a first coil disposed in said electronic device and a second coil disposed in the charged device, the first and second coils being disposed in opposing positions and the charged device charges the transferred power into a secondary battery in an intermittent manner, said electronic device comprising:
- a first voltage detector for detecting a voltage of the secondary battery after a predetermined time has lapsed from interruption of the charging;
- a signal transfer circuit for transferring the voltage detected by said first voltage detecting means or an estimated result based on the voltage detected by said first voltage detecting means through the first and second coils; and
- a controller for controlling the charging of the secondary battery in accordance with a result transferred by said signal transfer circuit.

54. An electronic device comprising:
- a charger for charging a secondary battery in an intermittent manner;
- a first voltage detector for detecting a first voltage of the secondary battery at a time immediately after interruption of charging by said charger;
- a second voltage detector for detecting a second voltage of the secondary battery at a time immediately before resumption of charging by said charger after interruption of charging by said charger; and
- a rate determining circuit for determining an expected recharge rate of the secondary battery in accordance with a voltage difference between the first voltage of the secondary battery detected by said first voltage detector and the voltage of said secondary battery detected by said second voltage detector.

55. An electronic device comprising:
- a charger for charging a secondary battery in an intermittent manner;
- a first voltage detector for detecting a first voltage of the secondary battery at a time immediately before resumption of charging by said charger after interruption of charging by said charger;
- a second voltage detector for detecting a second voltage of the secondary battery at a time immediately after resumption of charging by said charger; and
- a rate determining circuit for determining an expected recharge rate of the secondary battery in accordance with a voltage difference between the first voltage of the secondary battery detected by said first voltage detector and the second voltage of the secondary battery detected by said second voltage detector.

* * * * *